(12) United States Patent
Otsuka et al.

(10) Patent No.: US 9,220,182 B2
(45) Date of Patent: Dec. 22, 2015

(54) SEMICONDUCTOR MODULE COOLER AND SEMICONDUCTOR MODULE

(71) Applicants: HONDA MOTOR CO., LTD., Minato-ku, Tokyo (JP); FUJI ELECTRIC CO., LTD., Kawasaki-shi, Kanagawa (JP)

(72) Inventors: Hiroshi Otsuka, Wako (JP); Tomohiro Fukazu, Wako (JP); Kosuke Nishiyama, Wako (JP); Takeshi Ichimura, Matsumoto (JP); Hiromichi Gohara, Matsumoto (JP)

(73) Assignees: HONDA MOTOR CO., LTD., Tokyo (JP); FUJI ELECTRIC CO., LTD., Kawasaki (JP)

( * ) Notice: Subject to any disclaimer, the term of this patent is extended or adjusted under 35 U.S.C. 154(b) by 52 days.

(21) Appl. No.: 14/105,613

(22) Filed: Dec. 13, 2013

(65) Prior Publication Data

US 2014/0196871 A1    Jul. 17, 2014

(30) Foreign Application Priority Data

Jan. 11, 2013  (JP) ................................ 2013-004081

(51) Int. Cl.
*H05K 7/20* (2006.01)
*H01L 23/473* (2006.01)

(52) U.S. Cl.
CPC .......... *H05K 7/20236* (2013.01); *H01L 23/473* (2013.01); *H01L 2224/32225* (2013.01); *H01L 2924/1305* (2013.01); *H01L 2924/13055* (2013.01)

(58) Field of Classification Search
CPC ........... H05K 7/20236; H05K 7/20254; H01L 23/473
USPC ........................ 257/715; 165/104.33; 361/699
See application file for complete search history.

(56) References Cited

U.S. PATENT DOCUMENTS 5,001,548 A * 3/1991 Iversen .......................... 257/714
5,959,351 A * 9/1999 Sasaki et al. ................... 257/714
5,978,220 A * 11/1999 Frey et al. ...................... 361/699

(Continued)

FOREIGN PATENT DOCUMENTS

JP    2001-35981    2/2001
JP    2006-80211    3/2006

(Continued)

OTHER PUBLICATIONS

Patent Abstracts of Japan, Publication No. 2001-035981, Published Feb. 9, 2001.

(Continued)

*Primary Examiner* — Karen Kusumakar
*Assistant Examiner* — Adam S Bowen
(74) *Attorney, Agent, or Firm* — Staas & Halsey LLP

(57) ABSTRACT

A semiconductor module cooler includes a fin which is a heat sink, which is thermally connected to a semiconductor element, and which has one or more notches in an edge at one or more arbitrary positions in a longitudinal direction and one or more convex ribs which are formed on a bottom of a water jacket having a cooling flow path and which fit into the one or more notches at one or more arbitrary positions. By doing so, the efficiency of transferring heat generated by the semiconductor element by a coolant is improved and cooling performance is improved.

29 Claims, 36 Drawing Sheets

(56) References Cited

U.S. PATENT DOCUMENTS

| | | | |
|---|---|---|---|
| 2005/0195574 A1* | 9/2005 | Chiba et al. | 361/709 |
| 2006/0225867 A1* | 10/2006 | Park et al. | 165/80.4 |
| 2010/0090336 A1* | 4/2010 | Yoshida et al. | 257/717 |
| 2012/0247743 A1* | 10/2012 | Niimi et al. | 165/181 |

FOREIGN PATENT DOCUMENTS

| | | |
|---|---|---|
| JP | 2006-295178 | 10/2006 |
| JP | 2007-12722 | 1/2007 |
| JP | 2008-205371 | 9/2008 |
| JP | 2008-251932 | 10/2008 |
| JP | 2009-231677 | 10/2009 |
| JP | 2010-203694 | 9/2010 |

OTHER PUBLICATIONS

Patent Abstracts of Japan, Publication No. 2006-080211, Published Mar. 23, 2006.
Patent Abstracts of Japan, Publication No. 2006-295178, Published Oct. 26, 2006.
Patent Abstracts of Japan, Publication No. 2007-012722, Published Jan. 18, 2007.
Patent Abstracts of Japan, Publication No. 2008-205371, Published Sep. 4, 2008.
Patent Abstracts of Japan, Publication No. 2008-251932, Published Oct. 16, 2008.
Patent Abstracts of Japan, Publication No. 2009-231677, Published Oct. 8, 2009.
Patent Abstracts of Japan, Publication No. 2010-203694, Published Sep. 16, 2010.

* cited by examiner

BLADE FIN
DIRECTION IN WHICH COOLANT FLOWS

CORRUGATED FIN
DIRECTION IN WHICH COOLANT FLOWS

EXAMPLE OF ARRANGEMENT OF CIRCUIT ELEMENTS

SHAPE OF WATER JACKET (TYPE A)

SHAPE OF WATER JACKET (TYPE B)

SHAPE OF WATER JACKET (TYPE C)

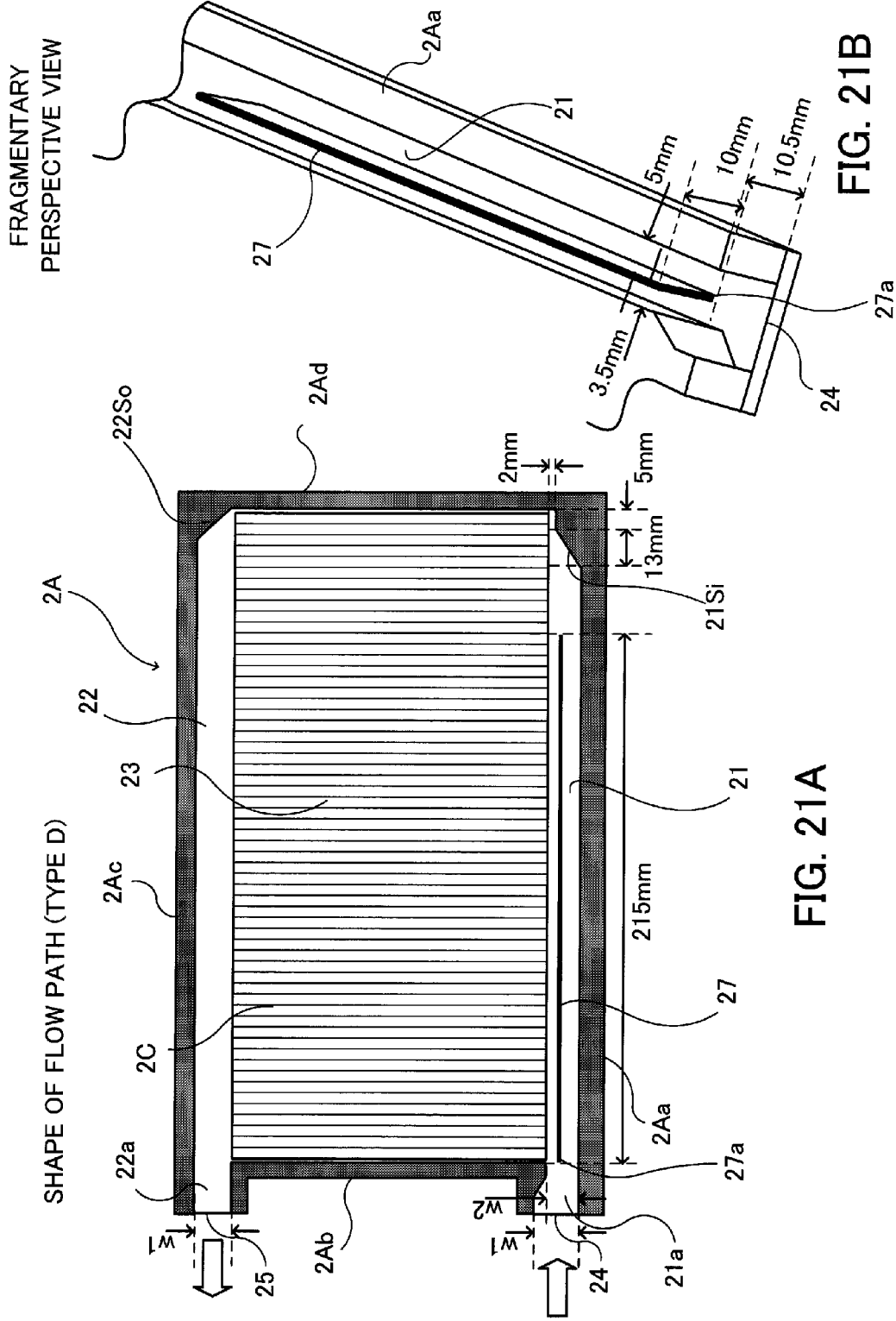
FIG. 21A SHAPE OF FLOW PATH (TYPE D)
FIG. 21B FRAGMENTARY PERSPECTIVE VIEW FLOW PATH SHAPE ACCORDING TO TYPES
(FLOW PATH WIDTH W1=W2=15mm)

| SHAPE OF COOLANT FLOW PATH | MEASUREMENTS OF FLOW SPEED ADJUSTING PLATE | | | |
|---|---|---|---|---|
| | L[mm] | x2[mm] | y2[mm] | h[mm] |
| TYPE E | 175 | 0 | 2 | 9.5 |
| TYPE Ea | 175 | 0 | 2 | 7.5 |
| TYPE Eb | 175 | 0 | 2 | 5.5 |
| TYPE F | 215 | 0 | 2 | 9.5 |
| TYPE Fa | 215 | 0 | 2 | 7.5 |
| TYPE Fb | 215 | 0 | 2 | 5.5 |
| TYPE Fc | 215 | 5 | 2 | 9.5 |

FIG. 25

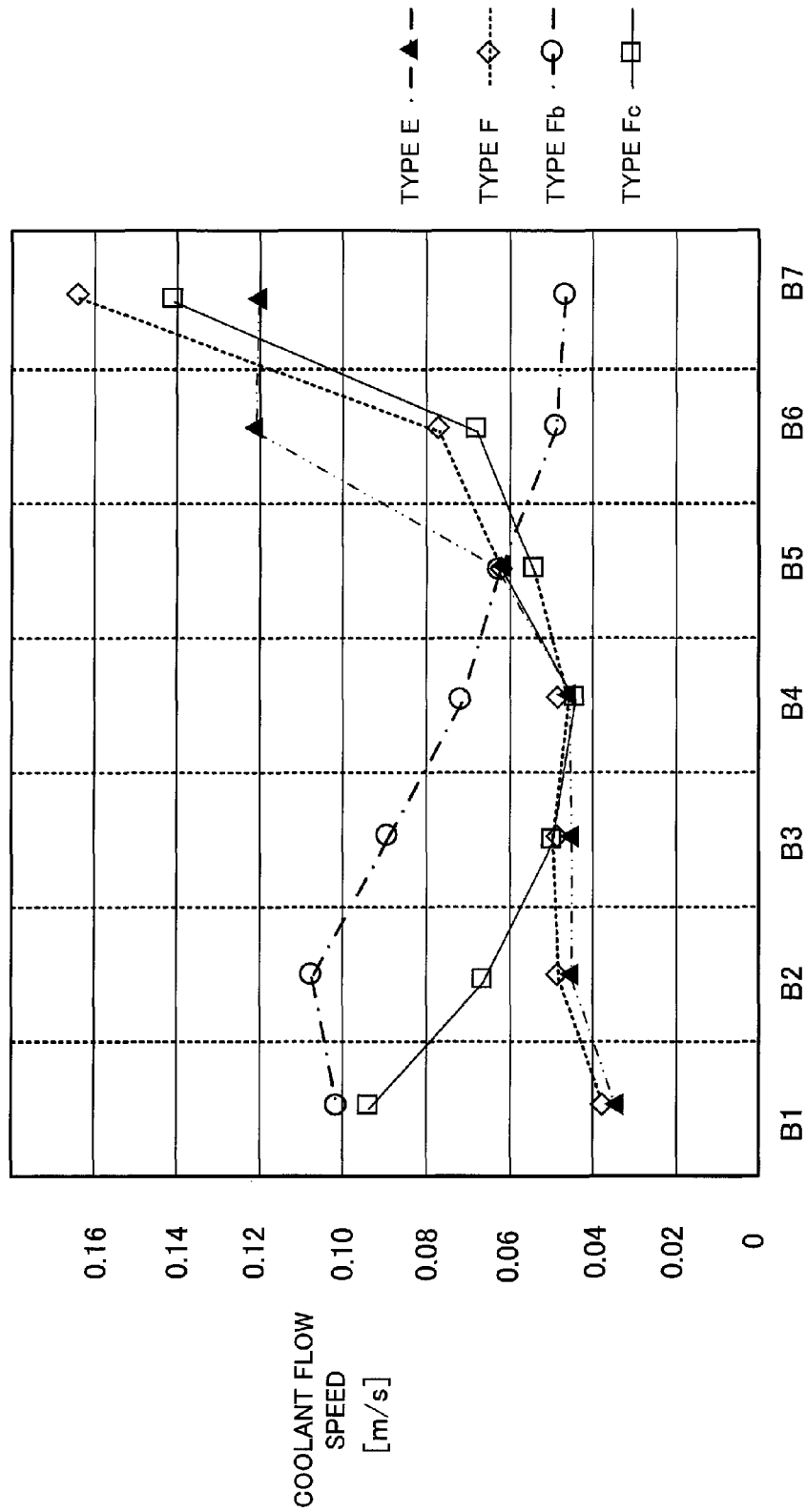

FIG. 30

MEASUREMENTS OF FLOW PATH ACCORDING TO TYPES

| SHAPE OF COOLANT FLOW PATH | MEASUREMENTS OF FLOW SPEED ADJUSTING PLATE ($x2=0$[mm]) | | | FLOW PATH WIDTH | |
|---|---|---|---|---|---|
| | L[mm] | h[mm] | y2[mm] | w1[mm] | w2[mm] |
| TYPE G | 255 | 2 | 2 | 10 | 15 |
| TYPE Ga | 255 | 4 | 2 | 10 | 15 |
| TYPE Gb | 255 | 6 | 2 | 10 | 15 |
| TYPE Gc | 255 | 8 | 2 | 10 | 15 |
| TYPE H | 255 | 8 | 2 | 15 | 15 |
| TYPE I | 255 | 8 | 2 | 12.5 | 15 |

SEMICONDUCTOR MODULE COOLER AND SEMICONDUCTOR MODULE

CROSS-REFERENCE TO RELATED APPLICATION

This application is based upon and claims the benefit of priority of the prior Japanese Patent Application No. 2013-004081, filed on Jan. 11, 2013, the entire contents of which are incorporated herein by reference.

FIELD

The embodiments discussed herein are related to a semiconductor module cooler for cooling a semiconductor element and a semiconductor module for supplying a coolant from an outside to a water jacket included in a cooler and cooling a semiconductor element arranged over an outer surface of the cooler.

BACKGROUND

Semiconductor modules are widely used in power conversion apparatus represented by hybrid vehicles, electric vehicles, and the like. Semiconductor modules included in such energy-saving controllers include power semiconductor elements for controlling a large current. Normal power semiconductor elements generate heat at the time of controlling a large current. As power conversion apparatus are downsized or their output becomes higher, the amount of heat generated increases. Accordingly, it matters very much how to cool semiconductor modules including a plurality of power semiconductor elements.

In order to improve the efficiency of cooling semiconductor modules, liquid cooling coolers have traditionally been used. Various devices are adopted in order to improve the cooling efficiency of liquid cooling coolers. For example, a coolant flow rate is increased, the shape of a heat radiation fin (cooling body) is determined so that a high heat transfer coefficient will be obtained, and the thermal conductivity of a material for a heat radiation fin is raised.

However, if the flow rate of a coolant flowing to a cooler is increased or if a heat radiation fin is shaped complexly to give it a high heat transfer coefficient, then a load on a cooling pump for circulating the coolant increases. For example, a loss in the pressure of the coolant increases in the cooler. With a cooler in particular which cools many power semiconductor elements by the use of a plurality of heat sinks and in which a plurality of flow paths are connected in series, a significant increase in pressure loss takes place. Ideally, cooling efficiency is improved by a low coolant flow rate in order to reduce pressure loss. For example, the thermal conductivity of a material for a heat radiation fin may be improved. However, the adoption of a material for a heat radiation fin having high thermal conductivity may lead to an increase in the costs of an entire cooler.

In order to reduce pressure loss while maintaining cooling performance, formerly coolers in which a coolant introduction flow path for introducing a coolant and a coolant discharge flow path for discharging the coolant are arranged in parallel with each other and in which a plurality of heat sinks are arranged between the coolant introduction flow path and the coolant discharge flow path in a direction approximately perpendicular to the coolant introduction flow path and the coolant discharge flow path were proposed (see Japanese Laid-open Patent Publication No. 2001-35981 (paragraph no. [0020] and FIG. 1), Japanese Laid-open Patent Publication No. 2007-12722 (paragraph no. [0006] and FIG. 7), Japanese Laid-open Patent Publication No. 2008-205371 (paragraph no. [0021] and FIG. 1), Japanese Laid-open Patent Publication No. 2008-251932 (paragraph nos. [0037] and [0038] and FIG. 7), Japanese Laid-open Patent Publication No. 2006-80211 (paragraph no. [0006] and FIG. 1), Japanese Laid-open Patent Publication No. 2009-231677 (paragraph nos. [0024] and [0031] and FIG. 2), Japanese Laid-open Patent Publication No. 2006-295178 (paragraph nos. [0017] to [0024] and FIG. 2), and Japanese Laid-open Patent Publication No. 2010-203694 (paragraph no. [0026] and FIG. 3). In that case, a coolant flows in parallel between fins included in a heat sink, so cooling performance can be improved. In addition, a loss in the pressure of the coolant in a flow path can be reduced (see Japanese Laid-open Patent Publication No. 2006-80211).

Furthermore, a liquid cooling cooler in which flow paths (header water routes $11a$ and $11b$) for introducing and discharging cooling liquid are arranged on the same side of a module and in which each flow path is arranged in a direction perpendicular to fins with no change in cross-sectional area is proposed (see, for example, FIG. 1 in Japanese Laid-open Patent Publication No. 2008-205371). As a result, a loss in the pressure of the cooling liquid can be reduced to the utmost.

In addition, a liquid cooling cooler in which the whole of a rear-side wall of a casing that is a cooling liquid inflow section smoothly inclines to a front side from a right-side wall side toward a left-side wall side and in which the cross-sectional area of a flow path in an inlet header portion becomes smaller from a cooling liquid inlet side toward the left-side wall side is proposed (see, for example, Japanese Laid-open Patent Publication No. 2009-231677). In this case, the distribution of flow speed in all flow paths in a parallel flow path section of the casing, that is to say, the distribution of flow speed in the direction of the width of the parallel flow path section becomes uniform.

In a semiconductor module cooler there is clearance as space between a fin, which is a heat sink, and a bottom of the cooler. In particular, however, if the clearance is more than an interval between adjacent fins, then a coolant flows to the clearance and does not flow sufficiently between fins. Accordingly, the clearance is narrowed. However, if a dimensional tolerance at the time of the assembly of parts is taken into consideration, too little clearance is not desirable. Even if there is much clearance, it is important to enhance a cooling effect by a coolant.

With conventional cooling techniques, on the other hand, the shape of a heat sink or a coolant flow path, a method for arranging elements which generate heat, the shape of a coolant introduction inlet or a coolant discharge outlet, or the like causes non-uniform distribution of coolant flow speed in a cooler. Such non-uniform distribution of coolant flow speed leads to non-uniform cooling performance. Accordingly, with conventional coolers it is difficult to obtain uniform and stable cooling performance. In addition, troubles, such as a significant rise only in the temperature of a semiconductor element arranged diagonally opposite to a coolant discharge outlet, arise. As a result, the lifetime of the semiconductor element becomes short or a failure or the like tends to occur.

Furthermore, with the above cooler (see, for example, Japanese Laid-open Patent Publication No. 2009-231677 or No. 2006-295178), the cross-sectional area of a flow path in an inlet header portion becomes smaller in a direction in which the flow path extends. Accordingly, there is a tendency for flow rate distribution to improve. However, a rise in temperature near a coolant introduction inlet is not solved. Even if only flow speed adjustment is made by changing the shape of an introduction flow path, pressure loss tends to increase.

By the way, with the above liquid cooling cooler (see, for example, Japanese Laid-open Patent Publication No. 2010-203694), a plurality of flow path groups each of which includes a plurality of flow paths and which differ in path resistance are placed side by side in the direction of the width of a parallel flow path section. This makes it possible to make flow speed distribution in the direction of the width of the parallel flow path section uniform. This prevents the appearance of a portion in which cooling performance falls off due to a decrease in flow speed. Because of the influence of, for example, a warp of a fin base which occurs in a process for manufacturing a cooler, however, it is not easy to obtain stable cooling performance.

SUMMARY

According to an aspect, there is provided a semiconductor module cooler for supplying a coolant from an outside to a water jacket and cooling semiconductor elements arranged over an outer surface of the cooler. This semiconductor module cooler includes a heat sink which is thermally connected to the semiconductor elements and which has one or more notches in an edge at one or more arbitrary positions in a longitudinal direction, a first flow path which is placed in the water jacket, which extends from a coolant introduction inlet, and in which a guide portion having an incline for leading the coolant toward one side of the heat sink is placed, a second flow path which is placed in the water jacket parallel with and apart from the first flow path, which extends toward a coolant discharge outlet, and which has a sidewall parallel to another side of the heat sink, a flow speed adjusting plate which is placed in the second flow path and which is formed apart from and parallel with the other side of the heat sink, a third flow path formed in a position in the water jacket in which the first flow path connects with the second flow path, and one or more convex ribs which are formed on a bottom of the water jacket having the third flow path and which fit into the one or more notches at one or more arbitrary positions, and the heat sink is placed in the third flow path.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 21A and 21B are views for describing a conventional semiconductor module as a fourth example for comparison, FIG. 21A being a plan view which illustrates the shape of a water jacket, FIG. 21B being a fragmentary perspective view of the water jacket of FIG. 21A;

FIG. 25 is a view for describing the measurements of a flow speed adjusting plate in the semiconductor module cooler of FIG. 24 according to types;

FIG. 26 illustrates the cooling characteristics of the water jacket illustrated in FIG. 24 and illustrates the distribution of coolant flow speed according to circuit board positions and types;

FIG. 30 is a view for describing the measurements of a flow speed adjusting plate and flow path width at an introduction inlet and a discharge outlet in the semiconductor module cooler of FIG. 29 according to types;

DESCRIPTION OF EMBODIMENTS

Figure 1:
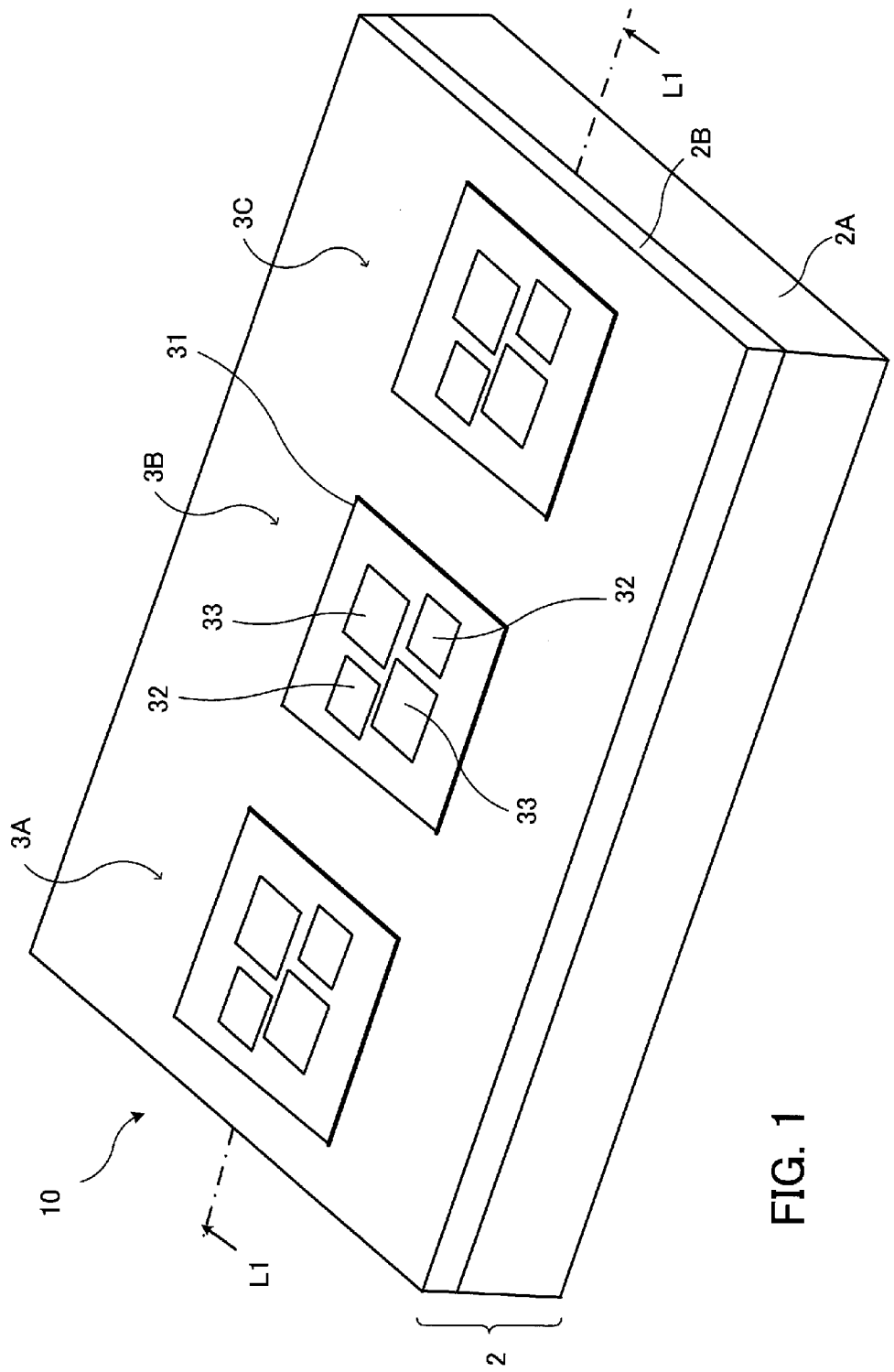
FIG. 1 is a perspective view which illustrates the appearance of an example of a semiconductor module according to an embodiment.
Figure 2:
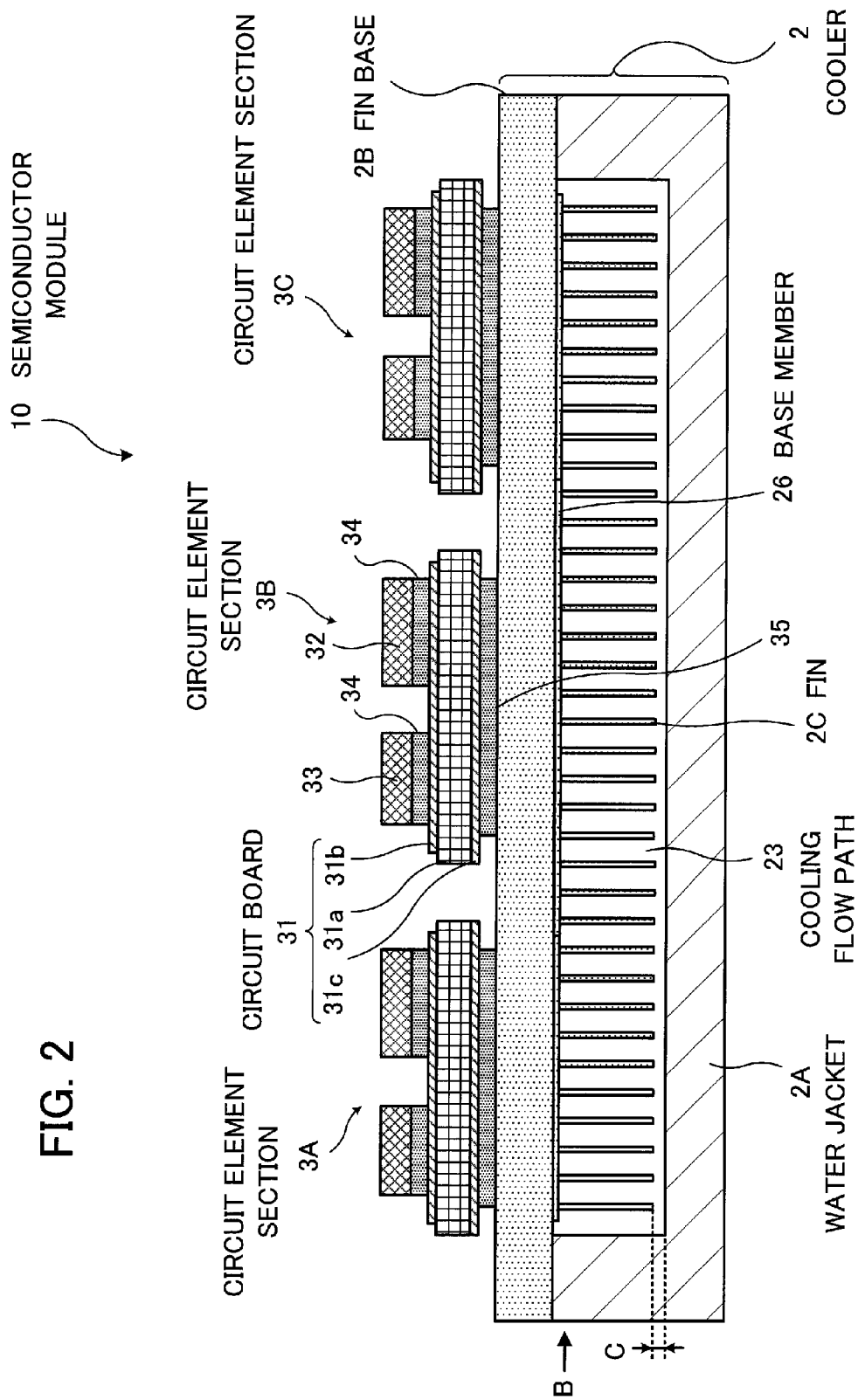
FIG. 2 is a sectional view of the semiconductor module taken along lines L1-L1 of FIG. 1.
Figure 3:
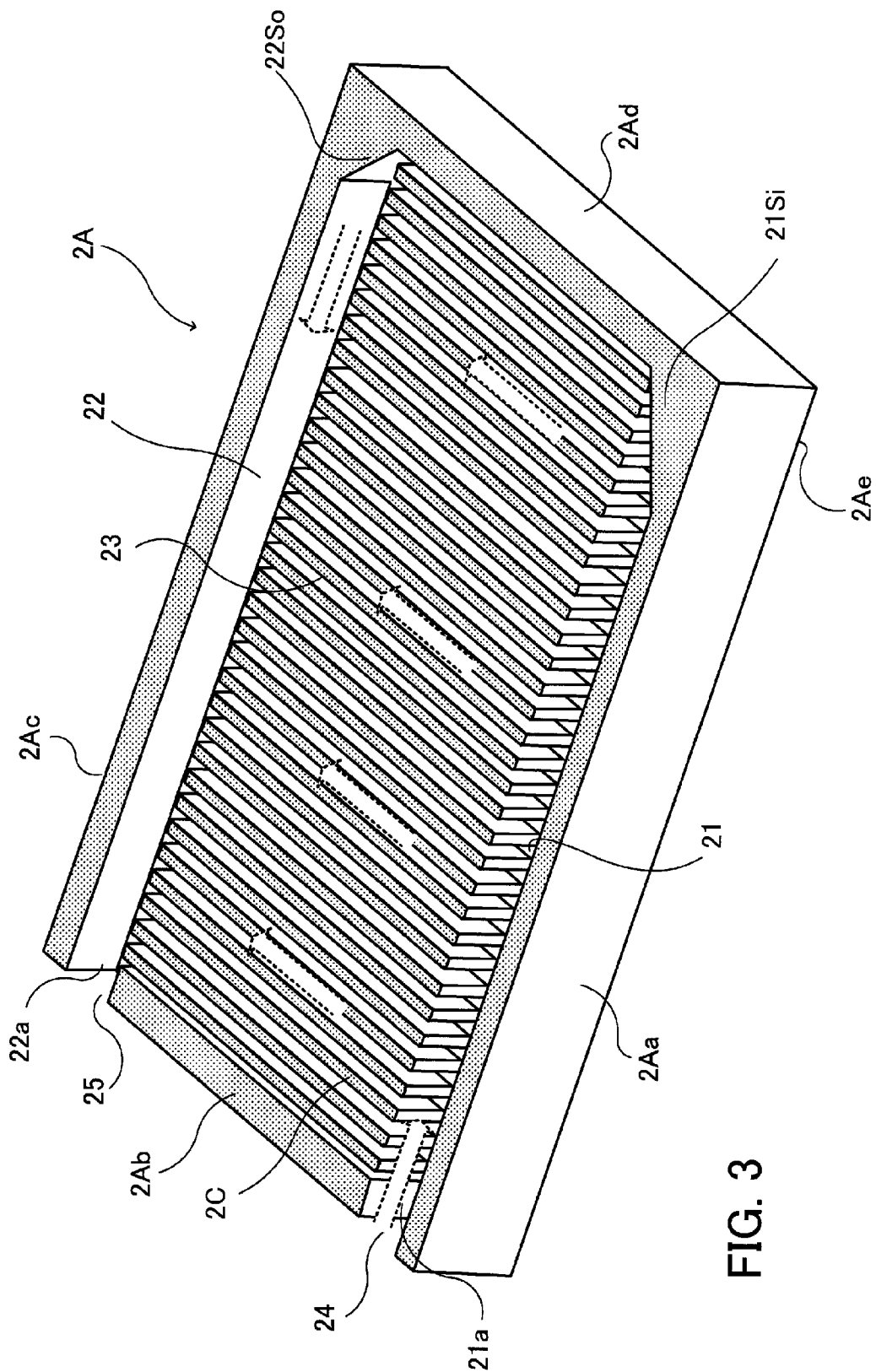
FIG. 3 is a fragmentary perspective view which illustrates the structure of a water jacket included in a cooler.

FIG. 1 is a perspective view which illustrates the appearance of an example of a semiconductor module according to an embodiment. FIG. 2 is a sectional view of the semiconductor module taken along lines L1-L1 of FIG. 1. FIG. 3 is a fragmentary perspective view which illustrates the structure of a water jacket included in a cooler. Each arrow in FIG. 3 indicates a direction in which a coolant flows.

As illustrated in FIGS. 1 and 2, a semiconductor module 10 includes a cooler 2 and circuit element sections 3A through 3C arranged over the cooler 2. The cooler 2 includes a water jacket 2A as a fin cover and a fin base 2B in which a plurality of fins 2C are implanted as a heat sink. The plurality of fins 2C are held in the water jacket 2A.

In the following description a side of the water jacket 2A on which the fin base 2B is joined in FIG. 2 is an "upper side" of the water jacket 2A. In FIG. 3, this side of the water jacket 2A is a "front side" of the water jacket 2A, a side of the water jacket 2A in which a coolant introduction inlet portion 21a and a coolant discharge outlet portion 22a are formed is a "left side" of the water jacket 2A, and so on. In addition, a side of a flow of a coolant near an introduction inlet 24 in the cooler 2 is an "upstream side".

As illustrated in FIG. 3, the water jacket 2A of the cooler 2 is approximately rectangular parallelepipedic in external shape. A coolant introduction flow path 21, the introduction inlet portion 21a, a coolant discharge flow path 22, the discharge outlet portion 22a, and a cooling flow path 23 in which the plurality of fins 2C are arranged are formed in its upper principal plane. In addition, an introduction inlet 24 for introducing the coolant into the inside and a discharge outlet 25 for discharging the coolant to the outside are formed in a left-side wall 2Ab of the water jacket 2A. The coolant introduction flow path 21 and the like are demarcated by a front-side wall 2Aa, the left-side wall 2Ab, a rear-side wall 2Ac, a right-side wall 2Ad, and a bottom wall 2Ae. For convenience of explanation the plurality of fins 2C are illustrated in FIG. 3.

The coolant introduction flow path 21 extends from the introduction inlet 24 through the introduction inlet portion 21a to the right-side wall 2Ad in parallel with the front-side wall 2Aa of the water jacket 2A as a first flow path which runs in a direction from which the coolant flows in. Furthermore, the coolant discharge flow path 22 extends from the right-side wall 2Ad to the discharge outlet portion 22a in parallel with the rear-side wall 2Ac of the water jacket 2A as a second flow path which runs to the coolant discharge outlet 25. The coolant introduction flow path 21 and the coolant discharge flow path 22 are formed like straight lines in the water jacket 2A approximately parallel with each other.

A semiconductor module cooler according to an embodiment in which fins in which notches are put and ribs formed on a bottom of a water jacket having cooling flow paths are used for improving semiconductor element cooling performance will now be described with reference to FIGS. 4 through 15.

With a semiconductor module cooler according to an embodiment a coolant flows from a coolant introduction inlet toward a coolant discharge outlet in a water jacket 2A along cooling flow path 23 in which a plurality of fins 2C are arranged as a heat sink. As a result, heat generated by semiconductor elements mounted over a fin base 2B is radiated by heat transfer by the coolant via the plurality of fins 2C.

With the semiconductor module cooler having the above structure, there are flatness and working tolerance of each fin 2C on a fin base 2B side on which the plurality of fins 2C are joined. There are also flatness and working tolerance on a water jacket 2A side.

Accordingly, in order to ensure sealing of the fin base 2B to the water jacket 2A at the time of fabricating the semiconductor module cooler, it is desirable to leave a certain clearance C like that illustrated in FIG. 2 for preventing each fin 2C from touching a bottom of the water jacket 2A.

The length of the clearance C (length between the end of each fin 2C and the bottom of the water jacket 2A) is in the range of, for example, 0.1 to 1.8 mm because of working tolerance.

However, when the coolant is passed along the cooling flow path 23, the coolant may escape into the clearance C. Accordingly, flow speed between fins 2C is decreased and it is impossible to fully demonstrate cooling performance.

In this embodiment this problem is mainly solved to improve cooling performance. The structure of the semiconductor module cooler according to this embodiment will now be described in detail with reference to the drawings. First the shape of a fin in which notches are put will be described.

Figure 4:
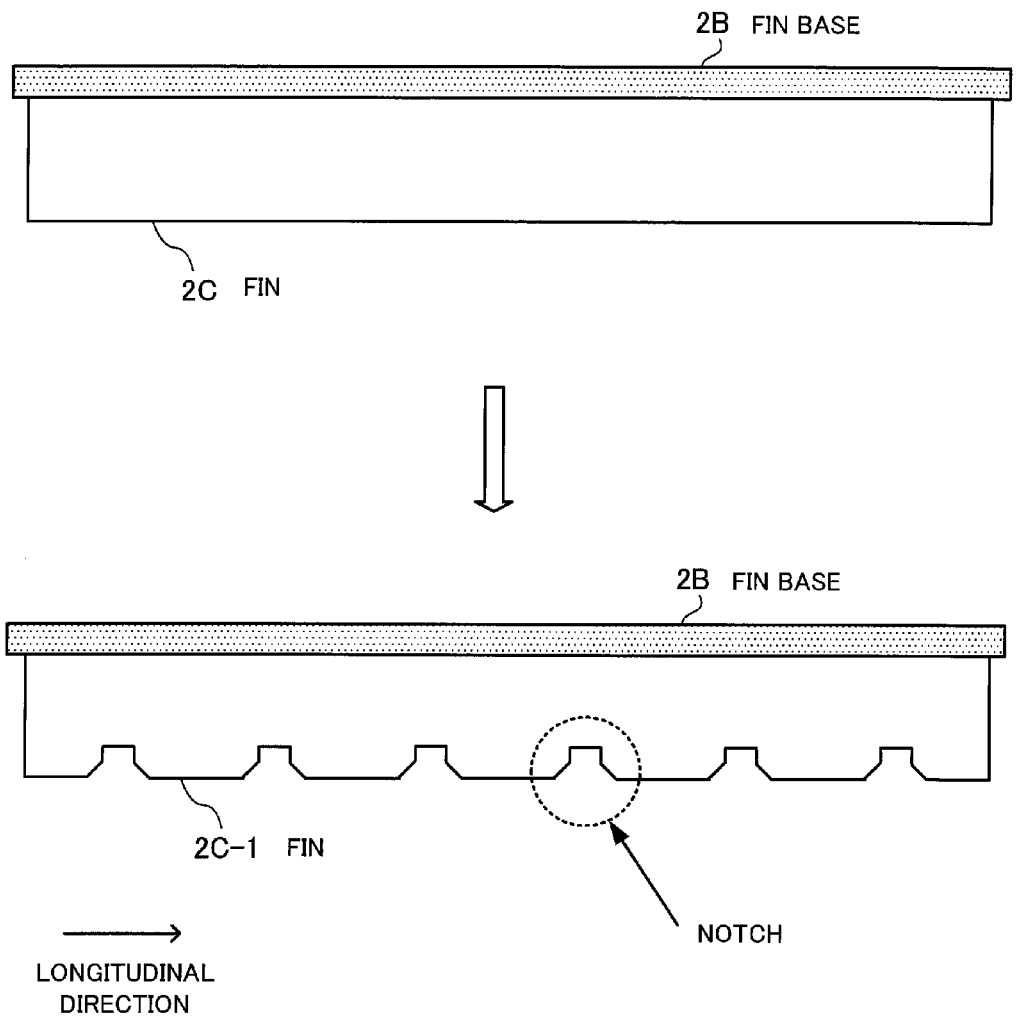
FIG. 4 illustrates the shape of fins which make up a heat sink.

FIG. 4 illustrates the shape of fins which make up a heat sink. FIG. 4 illustrates an example of the shape of a fin of FIG. 2 which is joined to the fin base 2B and which is looked at from a B direction. A notch is not put in a fin 2C. Notches are put in a fin 2C-1 in this embodiment. These notches are put in an edge of the fin 2C-1 at one or more arbitrary positions in the longitudinal direction. The heat sink is provided with a single fin or a plurality of fins arranged in parallel.

Usually a plurality of fins 2C-1 are joined to the fin base 2B. Therefore, notches are put at the same positions in adjacent fins 2C-1.

That is to say, the plurality of fins 2C-1 in which notches are put at the same positions are joined to the fin base 2B. Each fin 2C-1 is formed by the use of a metal material such as aluminum, an aluminum alloy, copper, or a copper alloy. This is the same with the fin 2C.

Figure 5:
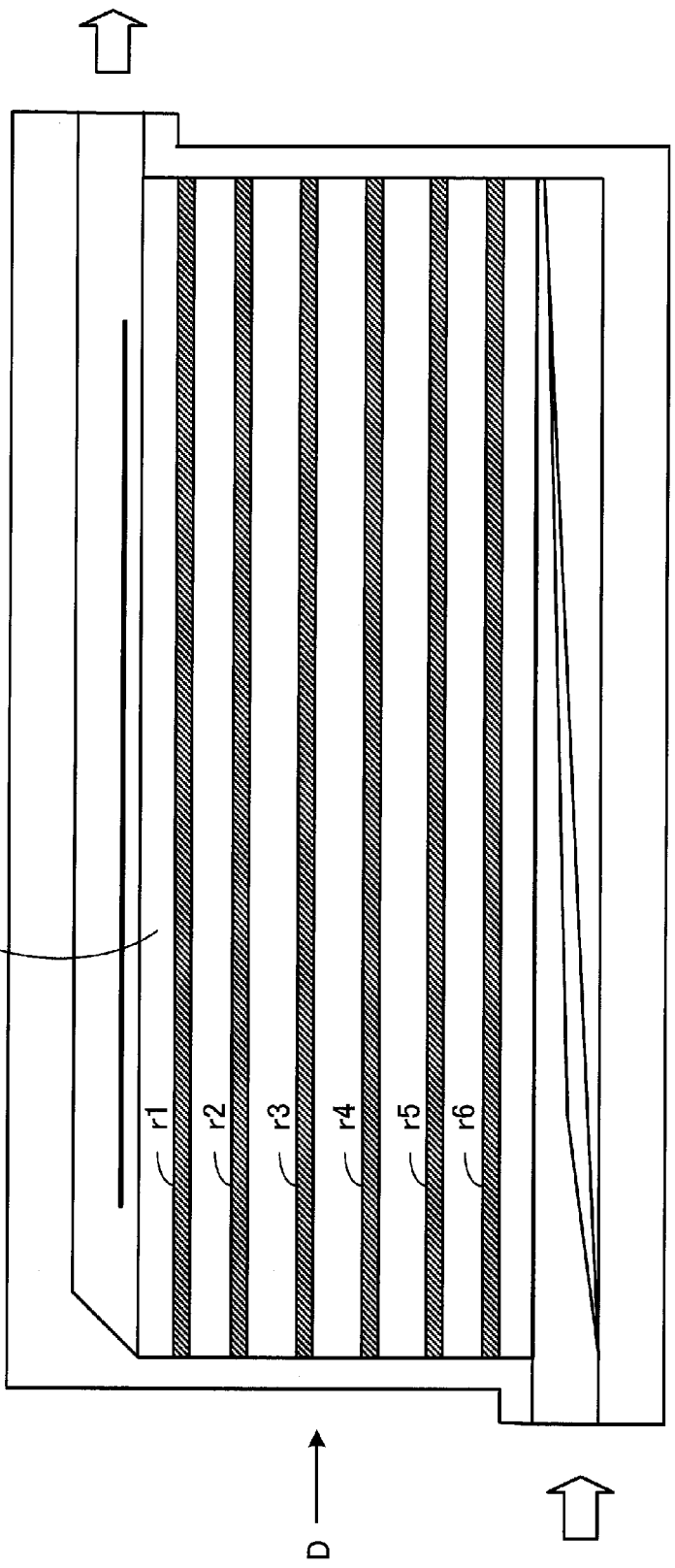
FIG. 5 illustrates a state in which ribs are arranged.

Ribs in this embodiment formed on a bottom of a water jacket under a cooling flow path will now be described. FIG. 5 illustrates a state in which ribs are arranged. Ribs each having a convex shape are formed upward from a bottom of a water jacket 2A-3 under a cooling flow path 23. In the example of FIG. 5, six ribs r1 through r6 are formed (all of these ribs are indicated by "ribs r").

The ribs r are formed at one or more arbitrary positions on the bottom of the water jacket 2A-3 under the cooling flow path 23 in parallel with one another. In this case, it is desirable to arrange the ribs r so as to be approximately perpendicular to cooling flow path 23 formed between the plurality of fins 2C-1 arranged in parallel with one another.

Figure 6:
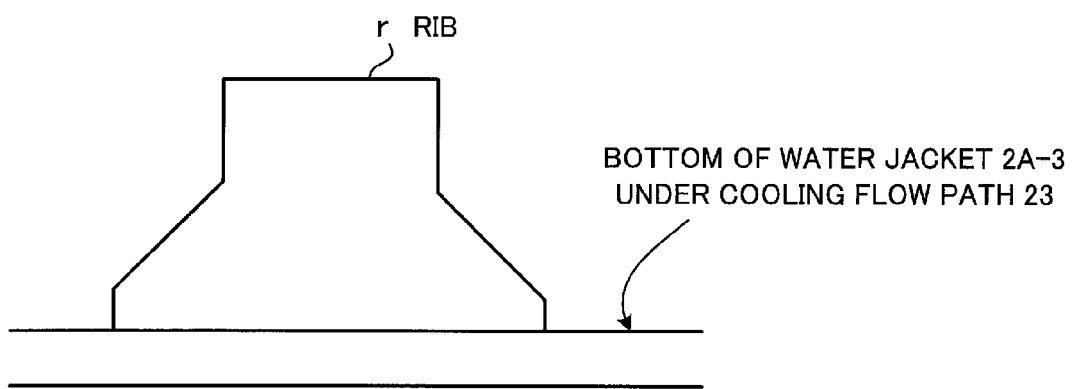
FIG. 6 illustrates the shape of a rib.

FIG. 6 illustrates the shape of a rib. FIG. 6 illustrates a rib r of FIG. 5 which has a convex shape and which is looked at from a D direction. A rib r has a convex shape so as to fit into a notch put in a fin 2C-1. The shape of a rib is not limited to that illustrated in FIG. 6. The rib illustrated in FIG. 6 has a small rising portion on the bottom of the water jacket. As illustrated in FIGS. 7 through 13 described later, for example, a rib may have an incline on a bottom of a water jacket without having a small rising portion.

Each rib r is formed by the use of a metal material such as aluminum, an aluminum alloy, copper, or a copper alloy. This is the same with the water jacket 2A. In addition, each rib r may be formed by the use of a mold at the time of forming a water jacket.

Figure 7:
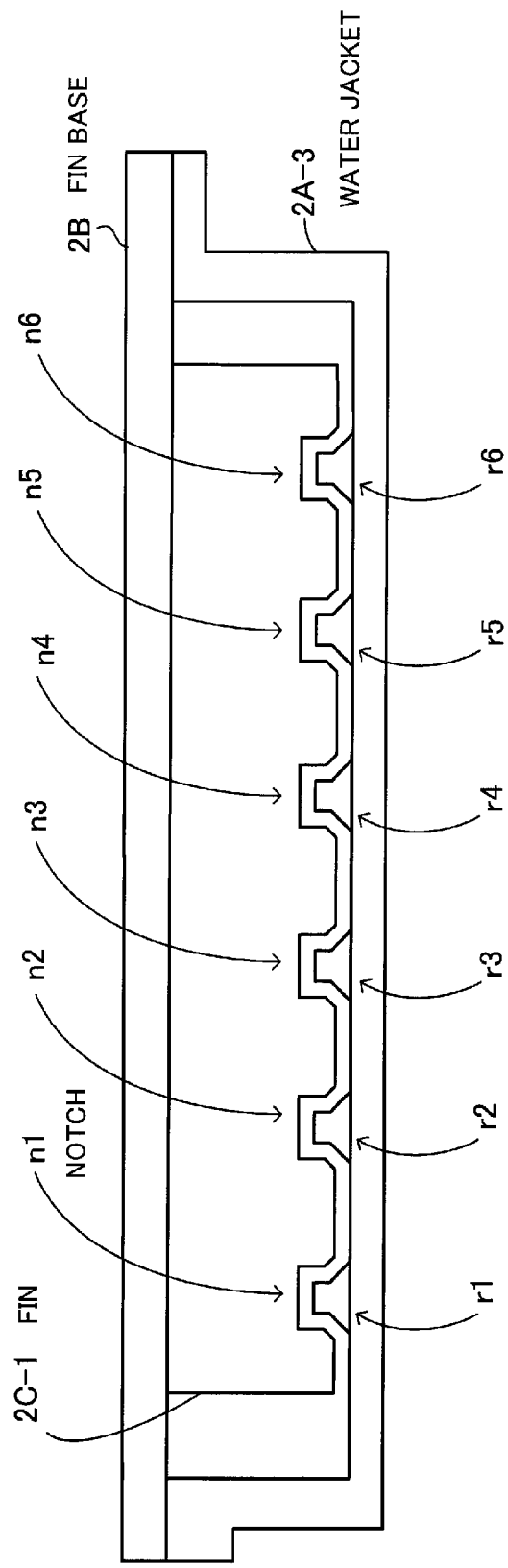
FIG. 7 illustrates a section of the cooler in which a fin base and the water jacket are combined.

A state in which ribs fit into notches will now be described. FIG. 7 illustrates a section of the cooler in which the fin base and the water jacket are combined. FIG. 7 illustrates a state in which the ribs r1 through r6 fit into a fin 2C-1 at the time of combining the fin base 2B and the water jacket 2A-3 for forming the semiconductor module cooler.

The fin 2C-1 has notches n1 through n6 and the ribs r1 through r6 are arranged on the bottom of the water jacket 2A-3. When the fin base 2B and the water jacket 2A-3 are combined, the ribs r1 through r6 fit into the notches n1 through n6 respectively.

That is to say, the rib r1 fits into the notch n1 and the rib r2 fits into the notch n2. Similarly, the rib r3 fits into the notch n3 and the rib r4 fits into the notch n4. Furthermore, the rib r5 fits into the notch n5 and the rib r6 fits into the notch n6.

Figure 8:
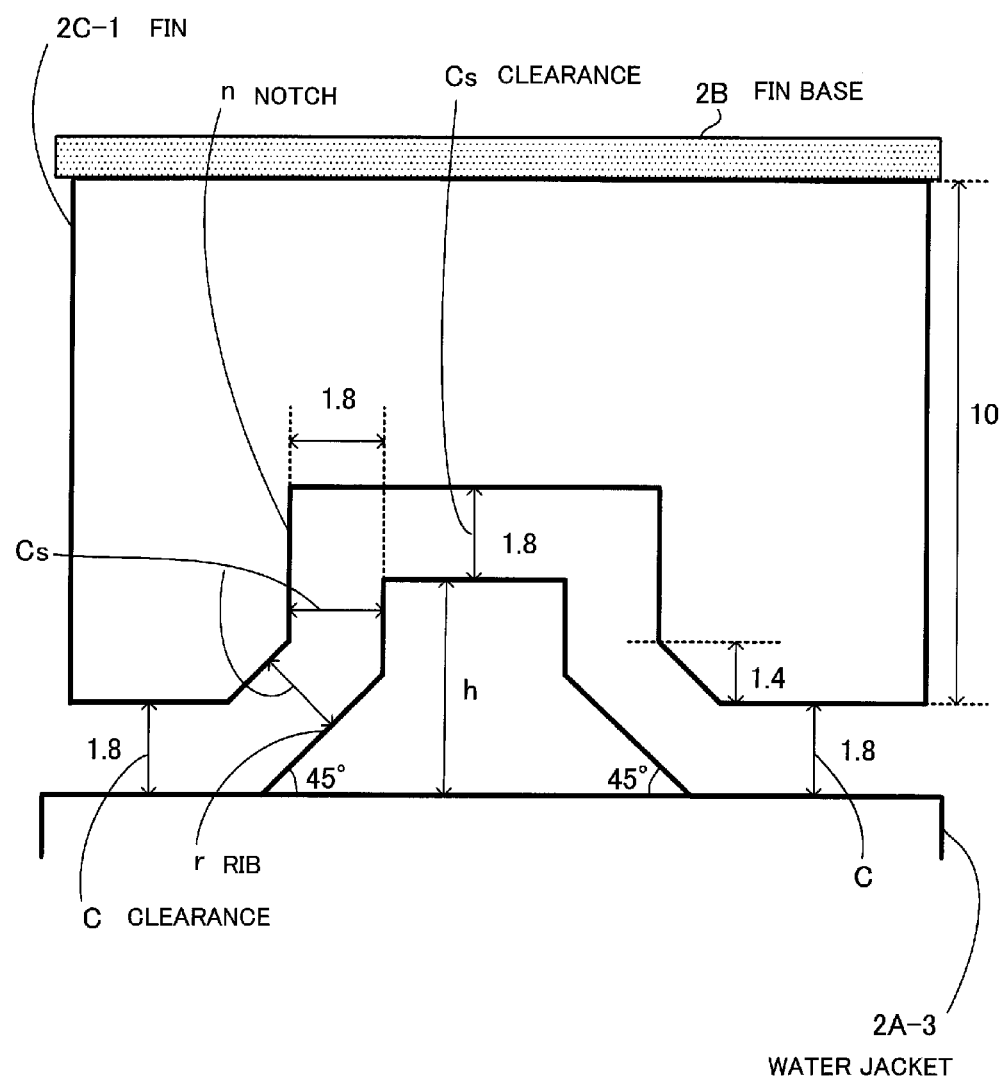
FIG. 8 illustrates a state in which a rib fits into a notch in a fin.

FIG. 8 illustrates a state in which a rib fits into a notch in the fin. In FIG. 8, the unit of numeric values indicative of measurements is millimeters (mm). When the fin base 2B and the water jacket 2A-3 are combined and a rib r positionally fits into a notch n in the fin 2C-1, the rib r does not touch the notch n and there is a clearance Cs, which is a space, between the rib r and the notch n.

In order to make discrimination between a clearance C, which is a space, between the end of a fin and the bottom of a water jacket and a clearance Cs, which is a space, between a rib r and a notch n intelligible, hereinafter the former clearance C will be referred to as a bottom clearance C.

The length of the clearance Cs between the rib r and the notch n is almost the same as that of the bottom clearance C. For example, if the length of the bottom clearance C is 1.8 mm, then the rib r and the notch n are formed so that the clearance Cs will be about 1.8 mm. In addition, it is desirable to determine the height h (mm) of the rib r from the bottom of the water jacket 2A-3 by $$h = 2t \pm \alpha$$

where t (mm) is the length of the bottom clearance C and α is a margin.

In FIG. 8, the length from the end of the fin 2C-1 to a portion where it is joined to the fin base 2B is 10 mm and a sidewall of the rib r forms an angle of 45° with the bottom of the water jacket 2A-3. However, these numeric values are examples and other numeric values may be adopted.

Furthermore, the shape of the notch n and the rib r is illustrated in FIG. 8. However, the notch n and the rib r may take various shapes. For example, the notch n and the rib r may have a rectangular shape or a triangular shape. In addition, sidewall faces of the notch n and the rib r may not have the shape of a straight line. The sidewall faces of the notch n and the rib r may have the shape of stairs or a smooth curve.

The relationship between the length in the longitudinal direction of a fin and the number of ribs arranged will now be described. For example, a rib r is arranged per a length of 10 to 30 mm in the longitudinal direction of the fin 2C-1 for the relationship between the length in the longitudinal direction of the fin 2C-1 in which notches n are put and the number of ribs r arranged.

Figure 9:
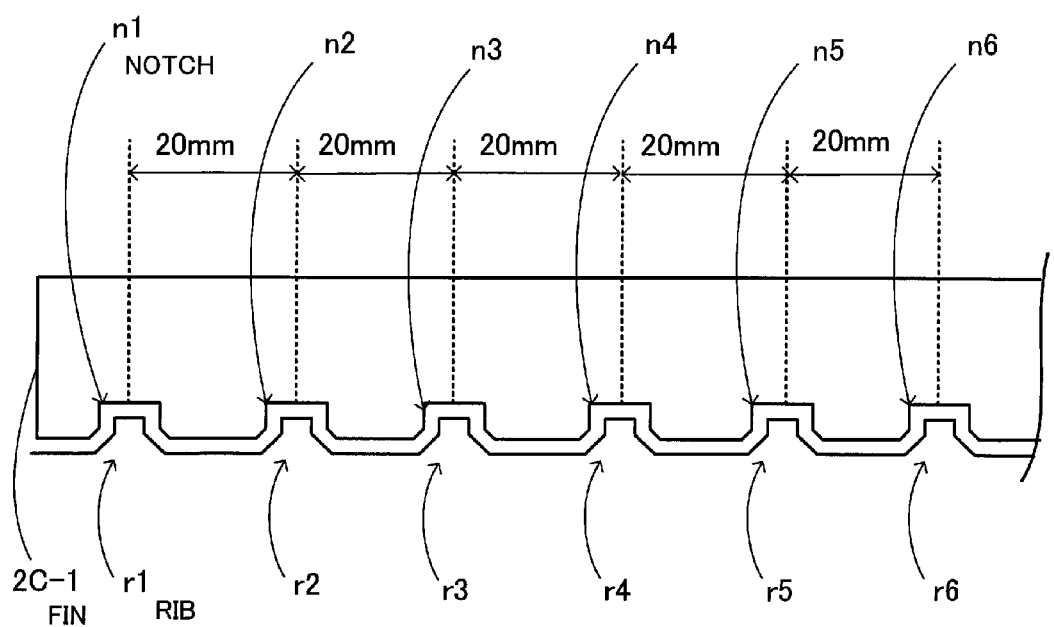
FIG. 9 is an example of the relationship between the length in the longitudinal direction of a fin and the number of ribs arranged.

FIG. 9 is an example of the relationship between the length in the longitudinal direction of the fin and the number of ribs arranged. In FIG. 9, notches n1 through n6 and ribs r1 through r6 are arranged at pitches of a length of 20 mm in the longitudinal direction of the fin 2C-1 so that the ribs r1 through r6 will fit into the notches n1 through n6 respectively.

Figure 10:
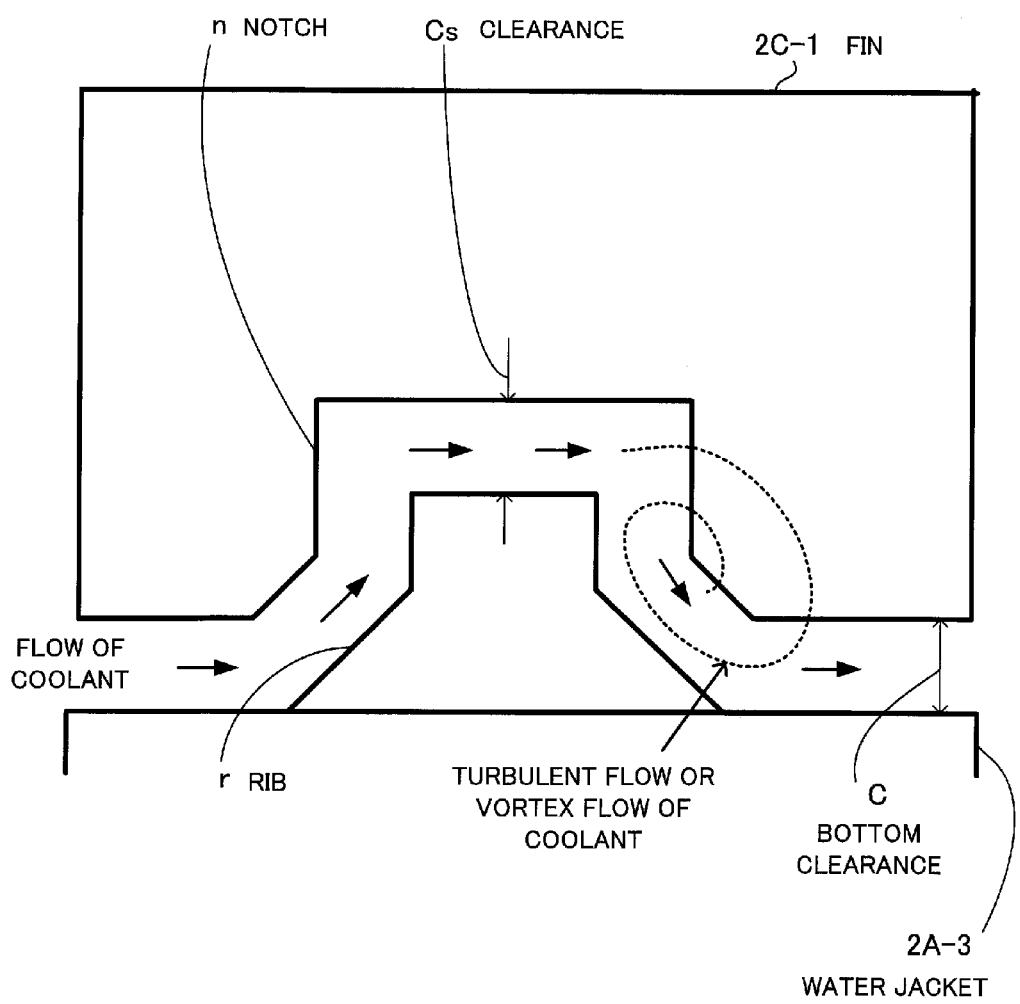
FIG. 10 is a view for describing a cooling function.

A cooling function in this embodiment will now be described. FIG. 10 is a view for describing a cooling function. A rib r which has a convex shape and which is formed on the bottom of the water jacket 2A-3 fits into a notch n in the fin 2C-1. As a result, the rib r functions as a barrier to prevent a coolant from escaping to the bottom clearance C.

Accordingly, the coolant which flows along a cooling flow path 23 hits against a side of the rib r, is lifted to a fin 2C-1 side, and flows through the clearance Cs (indicated by arrows in FIG. 10). As a result, the coolant efficiently hits against the fin 2C-1. In addition, the coolant which flows to the bottom clearance C is controlled by the rib r. If there is much bottom clearance C, the effect of the rib r is limited. By arranging a plurality of ribs r, however, the effect of the ribs r is maintained.

Traditionally, a coolant has escaped to a bottom clearance C. In this embodiment, however, it is possible to prevent the coolant from escaping to the bottom clearance C. As a result, the coolant which otherwise escapes to the bottom clearance C is effectively utilized for cooling semiconductor elements, and cooling efficiency is improved.

A first modification of this embodiment will now be described. In the above description, the notches n put in the longitudinal direction of the fin 2C-1 and the ribs r which fit into the notches n are arranged at equal intervals (see FIG. 9). In a first modification, however, intervals at which notches n and ribs r which fit into the notches n are arranged on an upstream side of a flow of the coolant differ from intervals at which notches n and ribs r which fit into the notches n are arranged on a downstream side of the flow of the coolant.

Figure 11:
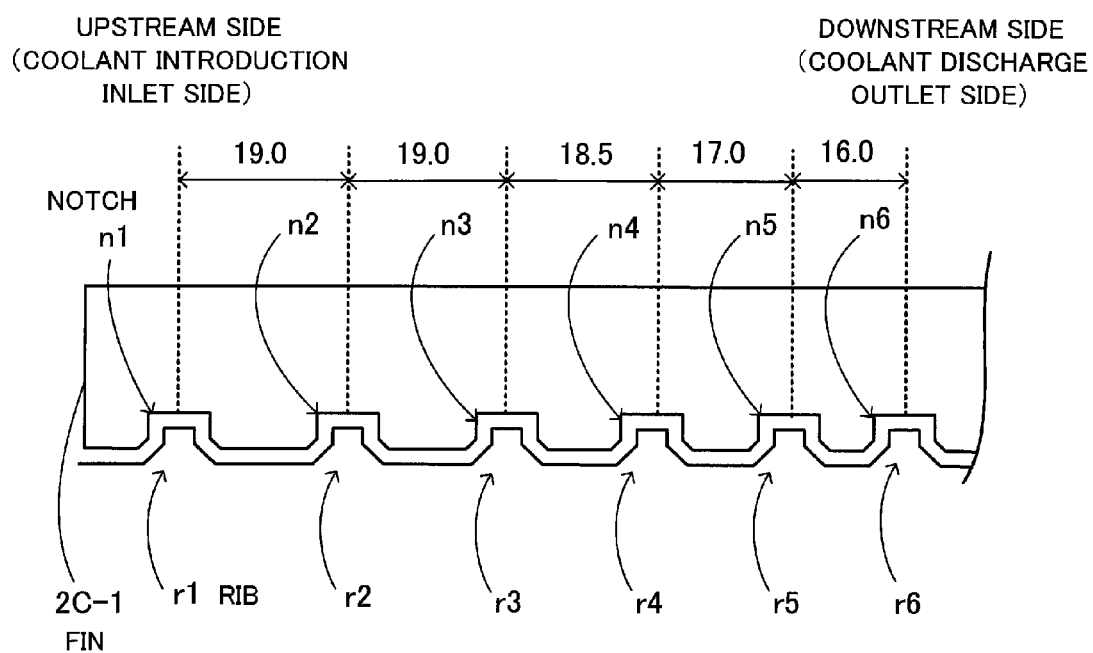
FIG. 11 illustrates a state in which notches in a fin and ribs are arranged.

FIG. 11 illustrates a state in which notches in a fin and ribs are arranged. Pitches at which notches n and ribs r which fit into the notches n are arranged are wide on an upstream side from which the coolant is introduced. Pitches at which notches n and ribs r which fit into the notches n are arranged are narrow on a downstream side from which the coolant is discharged.

In the case of FIG. 11, for example, a pitch between a combination of the notch n1 and the rib r1 and a combination of the notch n2 and the rib r2 is 19.0 mm. A pitch between the combination of the notch n2 and the rib r2 and a combination of the notch n3 and the rib r3 is 19.0 mm.

Furthermore, a pitch between the combination of the notch n3 and the rib r3 and a combination of the notch n4 and the rib r4 is 18.5 mm and a pitch between the combination of the notch n4 and the rib r4 and a combination of the notch n5 and the rib r5 is 17.0 mm. In addition, a pitch between the combination of the notch n5 and the rib r5 and a combination of the notch n6 and the rib r6 is 16.0 mm. If an interval is narrowed in this way, the effect of the ribs r can be enhanced.

If a bottom clearance C is wider than an interval between fins 2C-1 in a semiconductor module cooler, usually an amount of a coolant which escapes to the bottom clearance C on an upstream side near a coolant introduction inlet is smaller than an amount of the coolant which escapes to the bottom clearance C on a downstream side.

On the other hand, an amount of the coolant which escapes to the bottom clearance C on the downstream side near a coolant discharge outlet is larger than an amount of the coolant which escapes to the bottom clearance C on the upstream side. In addition, while the coolant is flowing from the upstream side to the downstream side, it absorbs heat generated by a semiconductor element. Accordingly, the temperature of the coolant on the downstream side is higher than the temperature of the coolant on the upstream side.

That is to say, while the coolant is flowing from the upstream side to the downstream side, cooling efficiency tends to gradually fall. Therefore, in the first modification pitches at which the notches n and the ribs r which fit into the notches n are arranged on the upstream side are wider than pitches at which the notches n and the ribs r which fit into the notches n are arranged on the downstream side. In other words, the pitches at which the notches n and the ribs r which fit into the notches n are arranged on the downstream side are narrower than the pitches at which the notches n and the ribs r which fit into the notches n are arranged on the upstream side.

The pitches at which the notches n and the ribs r are arranged become narrower in this way from the upstream side toward the downstream side. As a result, the coolant which otherwise escapes to the bottom clearance C contributes effectively to cooling even on the downstream side where cooling efficiency tends to fall. Accordingly, cooling efficiency improves.

A second modification of this embodiment will now be described. In a second modification the following method is adopted in order to improve efficiency in cooling a semiconductor element. Intervals at which notches n and ribs r which fit into the notches n are arranged are adjusted so that a rib r arranged will be almost right under the semiconductor element.

Figure 12:
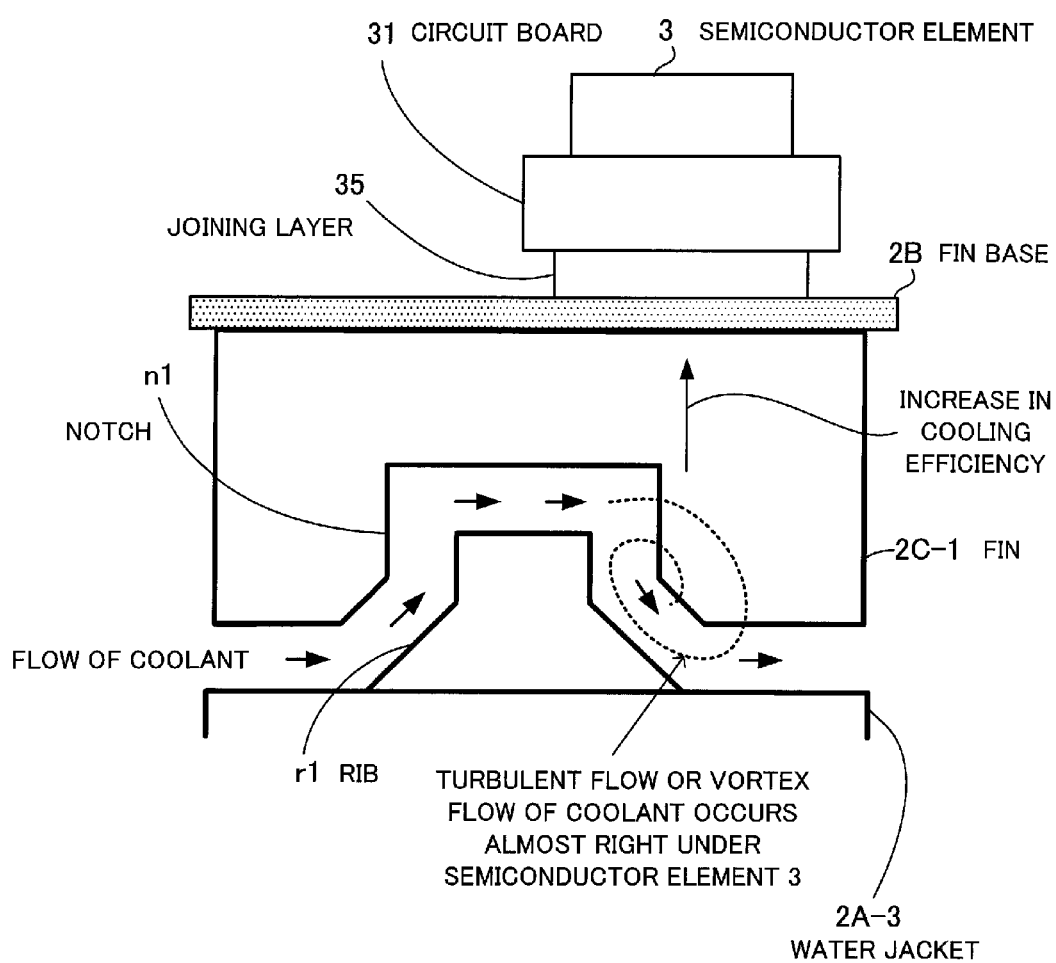
FIG. 12 illustrates a state in which a coolant efficiently flows between fins almost right under a semiconductor element.

FIG. 12 illustrates a state in which a coolant efficiently flows between fins almost right under a semiconductor element. A semiconductor element 3 is mounted over a fin base 2B with a joining layer 35 and a circuit board 31 between.

In addition, a notch n1 and a rib r1 are arranged on an upstream side of a flow of the coolant with respect to the semiconductor element 3 so that they will be almost right under the semiconductor element 3 (arranged on this side of the semiconductor element 3).

The notch n1 and the rib r1 which fits into the notch n1 are arranged in this way on the upstream side of a flow of the coolant with respect to the semiconductor element 3. By doing so, the coolant efficiently flows between fins almost right under the semiconductor element 3. As a result, efficiency in cooling the semiconductor element 3 improves further. The above arrangement is effective for a semiconductor element which generates specially much heat, a semiconductor element arranged on a downstream side, or the like.

Figure 13:
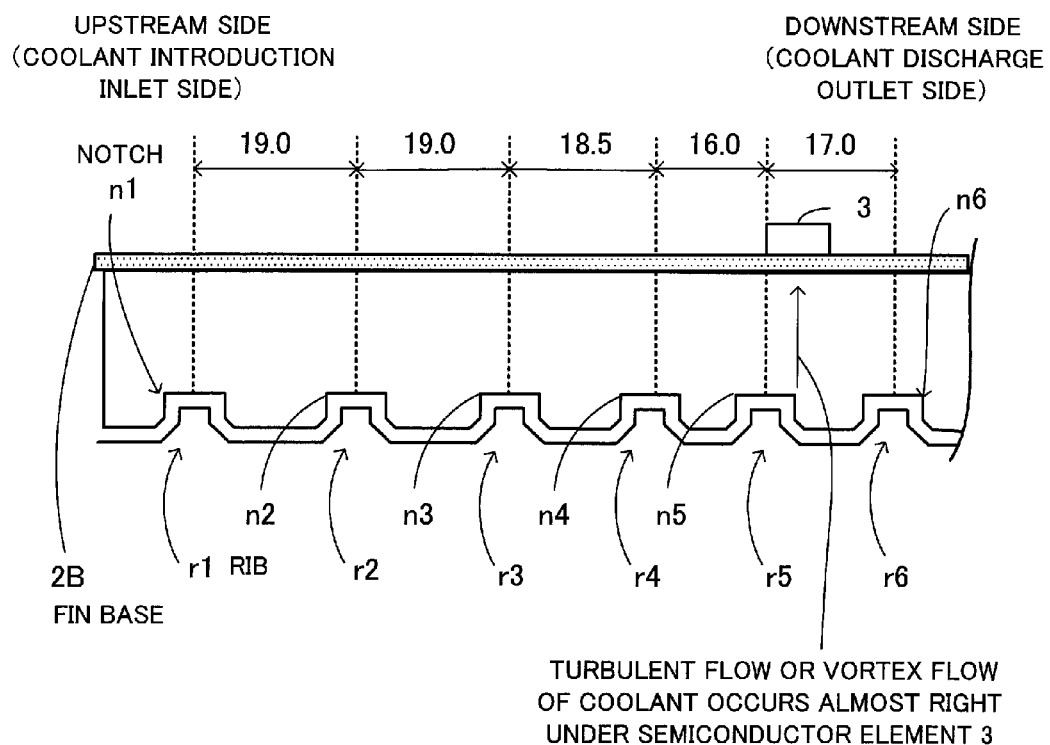
FIG. 13 illustrates a state in which ribs fit into notches in a fin.

FIG. 13 illustrates a state in which ribs fit into notches in a fin. Basically, as illustrated in FIG. 11, pitches at which notches n and ribs r are arranged are wide on the upstream side from which the coolant is introduced, and pitches at which notches n and ribs r are arranged are narrow on the downstream side from which the coolant is discharged.

However, in order to further increase efficiency in cooling, for example, a semiconductor element placed on the downstream side, the arrangement of a notch n and a rib r which fits into the notch n is adjusted. By doing so, coolant flow speed almost right under the semiconductor element is increased.

In the case of FIG. 13, the notch n5 and the rib r5 which fits into the notch n5 are arranged on this side of the semiconductor element 3 so that the rib r5 will be almost right under the semiconductor element 3 (joining layer and the circuit board are not illustrated).

As a result, the entire arrangement is as follows. A pitch between a combination of the notch n1 and the rib r1 and a combination of the notch n2 and the rib r2 is 19.0 mm. A pitch between the combination of the notch n2 and the rib r2 and a combination of the notch n3 and the rib r3 is 19.0 mm.

Furthermore, a pitch between the combination of the notch n3 and the rib r3 and a combination of the notch n4 and the rib r4 is 18.5 mm and a pitch between the combination of the notch n4 and the rib r4 and a combination of the notch n5 and the rib r5 is 16.0 mm. In addition, a pitch between the combination of the notch n5 and the rib r5 and a combination of the notch n6 and the rib r6 is 17.0 mm.

In the second modification a notch n and a rib r which fits into the notch n are arranged in this way on the upstream side of a flow of the coolant with respect to a semiconductor element in order to further increase efficiency in cooling the semiconductor element. At this time a turbulent flow or vortex flow of the coolant occurs almost right under the semiconductor element. As a result, a semiconductor element which generates much heat or a semiconductor element arranged on the downstream side can be cooled more effectively.

Figure 14:
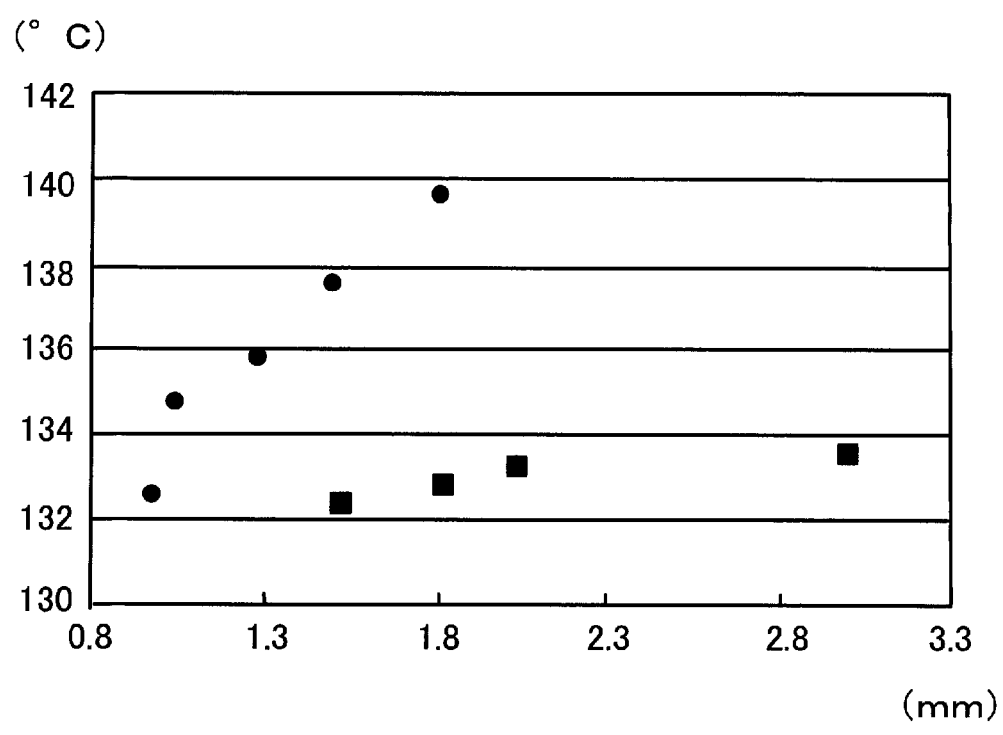
FIG. 14 illustrates simulation results indicative of an effect obtained in this embodiment.

An effect obtained in this embodiment will now be described. FIG. 14 illustrates simulation results indicative of an effect obtained in this embodiment. In FIG. 14, a vertical axis indicates the temperature (° C.) of a semiconductor element and a horizontal axis indicates the length (mm) of a bottom clearance C. In addition, a black circle indicates a case where a notch or a rib according to this embodiment is not arranged. A black square indicates a case where a notch and a rib according to this embodiment are arranged.

In the case where a notch or a rib according to this embodiment is not arranged, as illustrated in FIG. 14, as the length of a bottom clearance C increases, performance on cooling a mounted semiconductor element falls.

In the case where a notch and a rib according to this embodiment are arranged, on the other hand, a fall in performance on cooling a mounted semiconductor element is checked even if the length of a bottom clearance C increases. In addition, it is assumed that a design center value of a bottom clearance C is, for example, 1.8 mm. In this case, a fall in performance on cooling a semiconductor element is checked even if the length of a bottom clearance C varies about 1.8 mm due to production variations.

In this embodiment, as has been described, notches n are put at one or more arbitrary positions in an edge in the longitudinal direction of a fin, and ribs r having a convex shape are arranged at one or more arbitrary positions on a bottom of a water jacket having a cooling flow path so that the ribs r will fit into the notches n in the fin.

As a result, a coolant which otherwise escapes to a bottom clearance C is lifted to a fin side and contributes to cooling. In addition, variations in heat radiation by the bottom clearance C which occur due to the flatness of a fin base, the accuracy of fin height, the flatness of a bottom of a water jacket, and the like are reduced and stable cooling is realized.

There is a more desirable shape of a rib r. The rib r illustrated in FIG. 10 is C-chamfered from the bottom of the water jacket symmetrically with respect to a flow of the coolant. It matters on the upstream side how to let the coolant flow between fins. Ideally, the coolant does not flow easily to the bottom clearance on the downstream side. Accordingly, the notch in the fin is kept parallel to the bottom clearance on the downstream side.

If the occurrence of the turbulent flow or vortex flow illustrated in FIG. 10 is prevented, cooling performance may be improved further. The reason for this is that the turbulent flow or vortex flow causes a rise in pressure. As a result, for example, a load on a pump increases.

Figure 15:
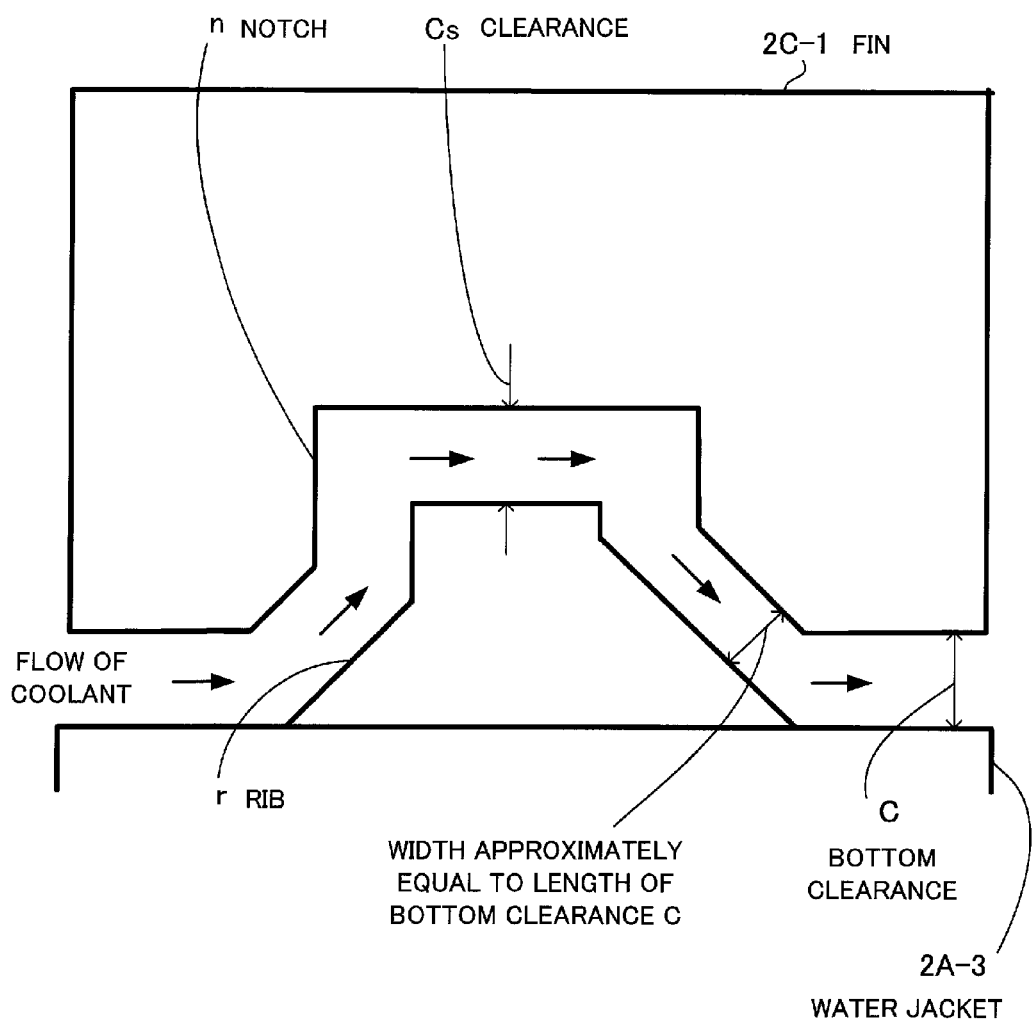
FIG. 15 is an example of an improved rib.

In order to solve this problem, the shape on, the downstream side is made gentle. In FIG. 10, the rib r is C-chamfered (at an incline of 45 degrees) and has a taper shape. However, it is desirable to increase this angle and connect the C-chamfered side to the top of the rib r. On the other hand, it is desirable to shave the fin for preventing it from touching the rib. The shape of the rib r is determined with heat conduction by the fin taken into consideration. An example of a shape improved in this way is illustrated in FIG. 15. FIG. 15 is an example of an improved rib. As illustrated in FIG. 15, if the height h of a rib r is, for example, 3 mm, it is desirable to C-chamfer a side of the rib r by 1.4 to 3 mm on the downstream side of a flow of the coolant. In particular, C-chamfering a side of the rib r by about 2.5 mm is effective. That is to say, if a side of the rib r is C-chamfered by 1.4 to 3 mm, the coolant smoothly flows. In addition, an incline of a fin (parallel to the incline formed by C-chamfering the side of the rib by 1.4 to 3 mm) is opposite to the incline formed by C-chamfering the side of the rib by 1.4 to 3 mm. Therefore, shaving a fin does not significantly weaken a cooling effect. That is to say, it is desirable to C-chamfer the side of the rib r by an amount between the length of a bottom clearance C and the height h of the rib r on the downstream side of a flow of the coolant. By forming the rib having the above structure, the occurrence of a turbulent flow or vortex flow which causes a rise in pressure is prevented. A turbulent flow or vortex flow is a factor which causes a fall in cooling performance.

The shape of an incline of a rib on the upstream side of a flow of the coolant (side from which the coolant is introduced) is more flexible than that of an incline of the rib on the downstream side of a flow of the coolant. That is to say, a rib may have a wall surface which rises perpendicularly from a bottom of a water jacket and not an incline on the upstream side of a flow of the coolant. However, if a rib has a wall surface which rises perpendicularly from a bottom of a water jacket on the upstream side of a flow of the coolant, a flow of the coolant tends to move round. As a result, bubbles tend to form. Therefore, an incline is desirable. With the above rib, the incline on the upstream side of a flow of the coolant and the incline on the downstream side of a flow of the coolant are nonsymmetric and the latter is long. This structure can be applied to a rib described in any embodiment.

Each component will now be described further with reference to FIGS. 1 through 3. Guide portions 21Si and 22So each having an incline of 60 degrees or less are formed at a trailing end portion of the coolant introduction flow path 21 into which the coolant is introduced from the introduction inlet 24 and a leading end portion of the coolant discharge flow path 22 which discharges the coolant to the discharge outlet 25 respectively.

The cooling flow path 23 is arranged between the coolant introduction flow path 21 and the coolant discharge flow path 22 as a third flow path and are formed so as to connect the coolant introduction flow path 21 and the coolant discharge flow path 22. That is to say, the cooling flow path 23 extends in a direction perpendicular to a direction in which the coolant introduction flow path 21 extends and a direction in which the coolant discharge flow path 22 extends. Inside faces of the left-side wall 2Ab and the right-side wall 2Ad which demarcate the cooling flow path 23 are perpendicular to a bottom of the cooling flow path 23 and an inside face of the rear-side wall 2Ac.

A heat sink made up of a plurality of fins 2C implanted in a base member 26 is arranged in the cooling flow path 23 and the coolant flows along flow paths defined by these fins 2C. The coolant introduced from the introduction inlet 24 flows along the coolant introduction flow path 21, the cooling flow path 23, and the coolant discharge flow path 22 in the water jacket 2A and is discharged from the discharge outlet 25. The heat sink is approximately rectangular parallelepipedic in external shape. The heat sink is arranged in the cooling flow path 23 so that its left-side side, rear-side side, and the right-side side will be parallel to the inside faces of the left-side wall 2Ab, the rear-side wall 2Ac, and the right-side wall 2Ad respectively.

The water jacket 2A having the above structure is formed by the use of a metal material such as aluminum, an aluminum alloy, copper, or a copper alloy. If the water jacket 2A is formed by the use of such a metal material, the above coolant introduction flow path 21, coolant discharge flow path 22, cooling flow path 23, introduction inlet 24, and discharge outlet 25 may be formed by die casting or the like. Furthermore, the water jacket 2A may be formed by the use of a material which contains carbon filler. In addition, the water jacket 2A may be formed by the use of a ceramic material, a resin material, or the like, depending on the type of the coolant, the temperature of the coolant which flows through the water jacket 2A, or the like.

As illustrated in FIGS. 1 and 2, a side of the water jacket 2A having the above structure on which the coolant introduction flow path 21, the coolant discharge flow path 22, and the cooling flow path 23 are formed is sealed by the fin base 2B except the introduction inlet 24 and the discharge outlet 25. In addition, the base member 26 in which the plurality of fins 2C are implanted is joined on a water jacket 2A side of the fin base 2B.

A case where the notch or the rib described in FIGS. 4 through 15 is not used will now be described in detail and then an effect obtained in a case where the above notch and rib are used will be described. First the shape of fins 2C included in the cooler 2 will be described.

Figure 16A:
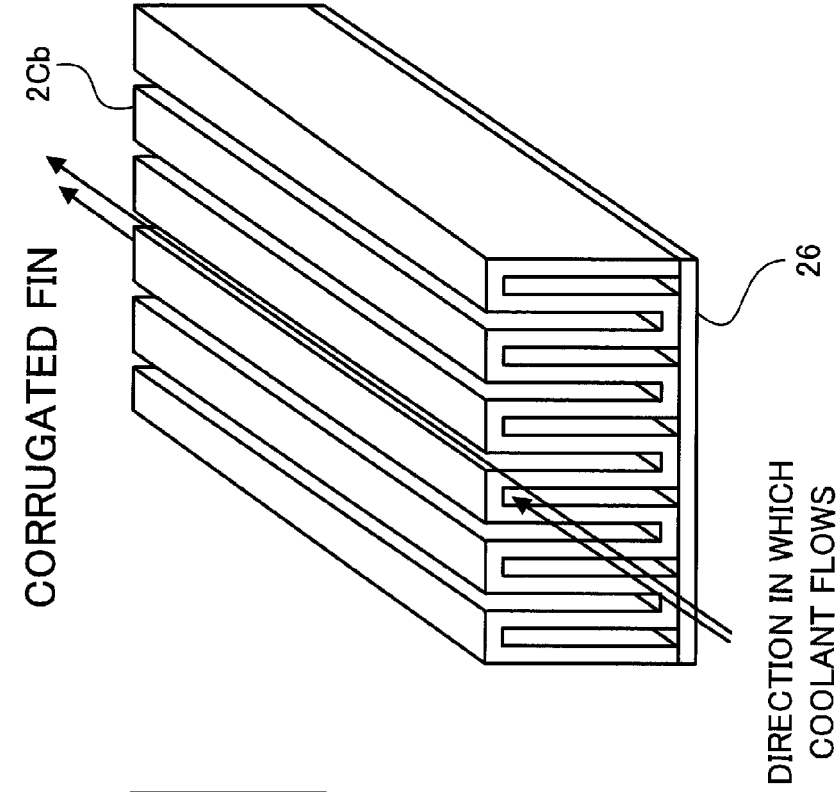
FIGS. 16A and 16B are views for describing two kinds of fin shapes, FIG. 16A being a perspective view of blade fins, FIG. 16B being a perspective view of a corrugated fin.
Figure 16B:
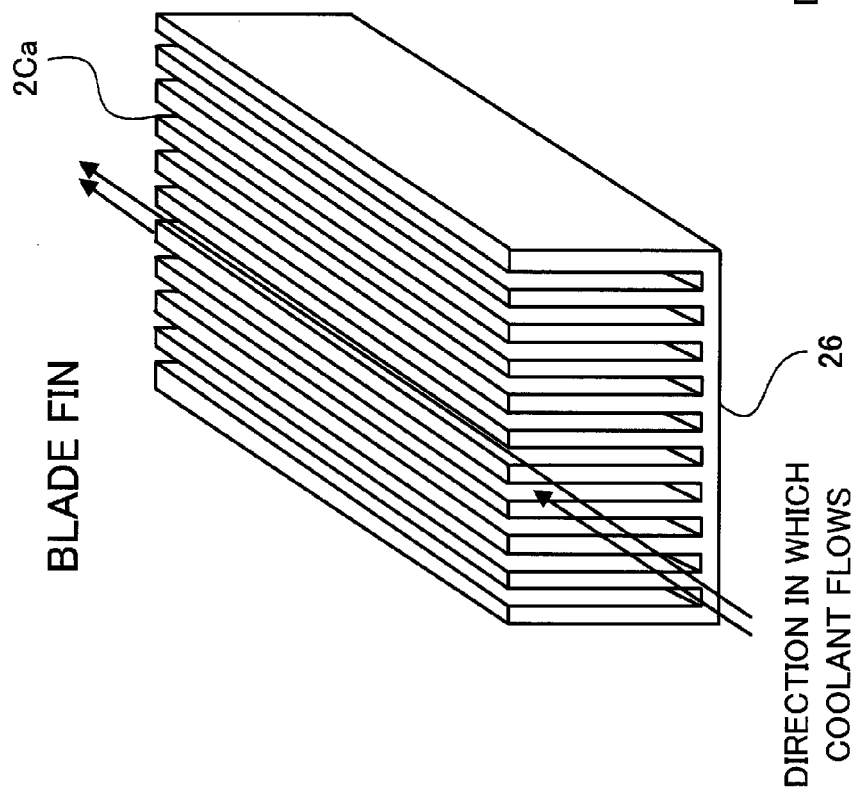

FIGS. 16A and 16B are views for describing two kinds of fin shapes. FIG. 16A is a perspective view of blade fins. FIG. 16B is a perspective view of a corrugated fin.

As illustrated in FIG. 16A, for example, the fins 2C included in the cooler 2 may be formed as a plurality of blade fins 2Ca. In this case, plate-like fins are formed side by side. The plurality of blade fins 2Ca are arranged in the cooling flow path 23 and a coolant flows in a direction indicated in FIG. 16A by an arrow. The plurality of blade fins 2Ca are held by the base member 26 and the fin base 2B in the cooling flow path 23.

FIG. 16A illustrates the plurality of blade fins 2Ca. However, a corrugated fin 2Cb illustrated in FIG. 16B may be used.

As illustrated in FIG. 2, for example, the fins 2C each having the shape of the blade fin 2Ca or having the shape of the corrugated fin 2Cb integrate with the fin base 2B and are arranged opposite the water jacket 2A on a fin 2C side of the fin base 2B. The measurement (height) of each fin 2C formed is set so that there will be a certain clearance C between its end and a bottom wall 2Ae of the water jacket 2A.

In FIG. 2, the base member 26 integrates with the fin base 2B. When the fin 2C side of the fin base 2B is placed opposite the water jacket 2A, the fins 2C are arranged in the cooling flow path 23 of the water jacket 2A. The fins 2C may be formed by die casting, brazing, one of various welding methods, or the like so that they will integrate with the fin base 2B. Alternatively, each fin 2C having a convex shape may be formed on the fin base 2B by die casting or pressing and be machined into a desired fin shape by cutting or a wire cut method.

Various shapes which have traditionally been known may be used as the shape of the fins 2C. The fins 2C give resistance to a coolant which flows along the cooling flow path 23, so a fin shape which makes a loss in the pressure of the coolant small is desirable. In addition, it is desirable to properly set the shape and measurements of the fins 2C with conditions under which the coolant is introduced into the cooler 2 (that is to say, pump performance and the like), the type of the coolant (viscosity and the like), a target heat removal amount, and the like taken into consideration.

Furthermore, a heat sink made up of the fins 2C is approximately rectangular parallelepipedic, preferably rectangular parallelepipedic, in external shape. However, a heat sink may be chamfered or deformed unless an effect obtained in this embodiment is marred.

The fins 2C and the fin base 2B are formed by the use of a metal material such as aluminum, an aluminum alloy, copper, or a copper alloy. This is the same with the water jacket 2A. The above blade fins 2Ca or the corrugated fin 2Cb may be used as the fins 2C. In addition, the fins 2C may be formed by joining determined pins or plates formed by the use of, for example, a metal material to the metal base member 26.

The base member 26 in which the fins 2C are implanted in this way is joined to a determined area of the fin base 2B which is a metal plate or the like, that is to say, an area corresponding to the cooling flow path 23 illustrated in FIG. 2. The base member 26 in which the fins 2C are implanted in advance is joined in this way to the fin base 2B. However, a plurality of fins 2C may be joined directly to the fin base 2B to form a heat sink.

When the cooler 2 is used, a pump placed on an upstream side and the introduction inlet 24, for example, are connected and the discharge outlet 25 is connected to a heat exchanger placed on a downstream side. As a result, a closed-loop coolant flow path including the cooler 2, the pump, and the heat exchanger is formed. The coolant is forcedly circulated through this closed loop by the pump.

As illustrated in FIG. 2, for example, each of the circuit element sections 3A through 3C is mounted over a circuit board 31 and includes two kinds of semiconductor elements 32 and 33. Each of the circuit element sections 3A through 3C includes two semiconductor elements 32 and two semiconductor elements 33, that is to say, a total of four semiconductor elements. As illustrated in FIG. 2, for example, the circuit board 31 includes an insulating board 31a and conductor patterns 31b and 31c and the conductor patterns 31b and 31c are formed on both sides of the insulating board 31a.

A ceramic board of aluminum nitride, aluminum oxide, or the like is used as the insulating board 31a of the circuit board 31. The conductor patterns 31b and 31c over the insulating board 31a are formed by the use of metal (copper foil, for example) such as copper or aluminum.

The semiconductor elements 32 and 33 included in each circuit element section are joined on a conductor pattern 31b side of the circuit board 31 by the use of a joining layer 34 of solder or the like and are electrically connected to the conductor pattern 31b directly or via wires (not illustrated). The circuit board 31 over which the semiconductor elements 32 and 33 are mounted is joined to the fin base 2B of the cooler 2 on a conductor pattern 31c side with the joining layer 35 between.

The circuit board 31 and the semiconductor elements 32 and 33 mounted thereover are thermally connected in this way to the cooler 2. A protective layer may be formed by nickel plating or the like on exposed surfaces of the conductor patterns 31b and 31c and the surfaces of the wires which electrically connect the semiconductor elements 32 and 33 and the conductor pattern 31b in order to protect them against dirt, corrosion, external force, and the like.

Figure 17B:
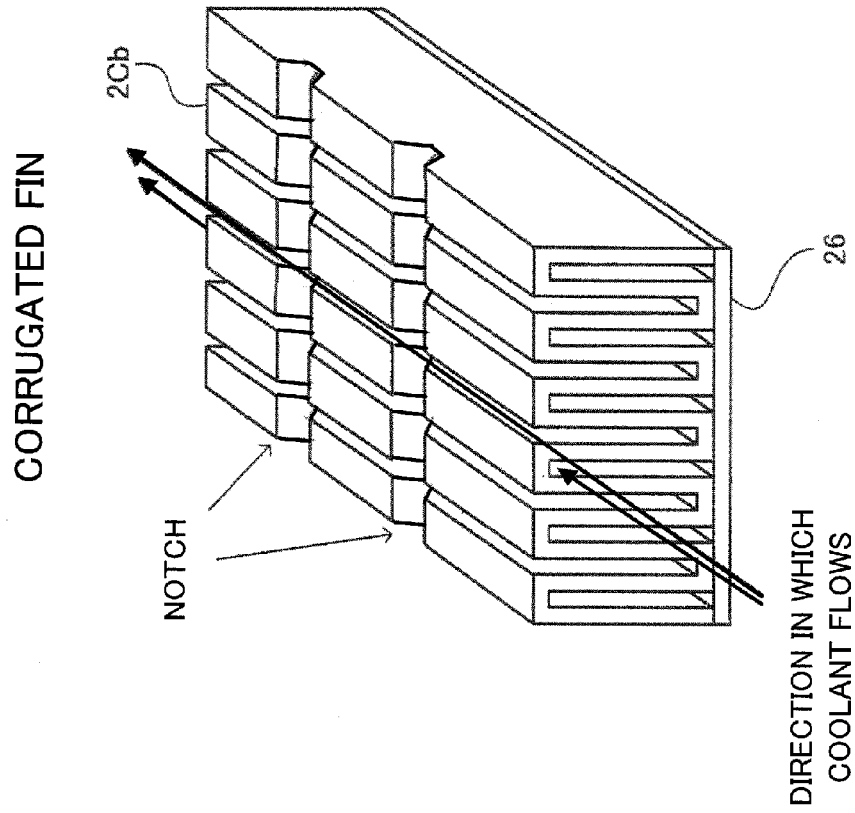
FIGS. 17A and 17B are examples of the shapes of a blade fin and a corrugated fin, respectively, in which notches are put.
Figure 17A:
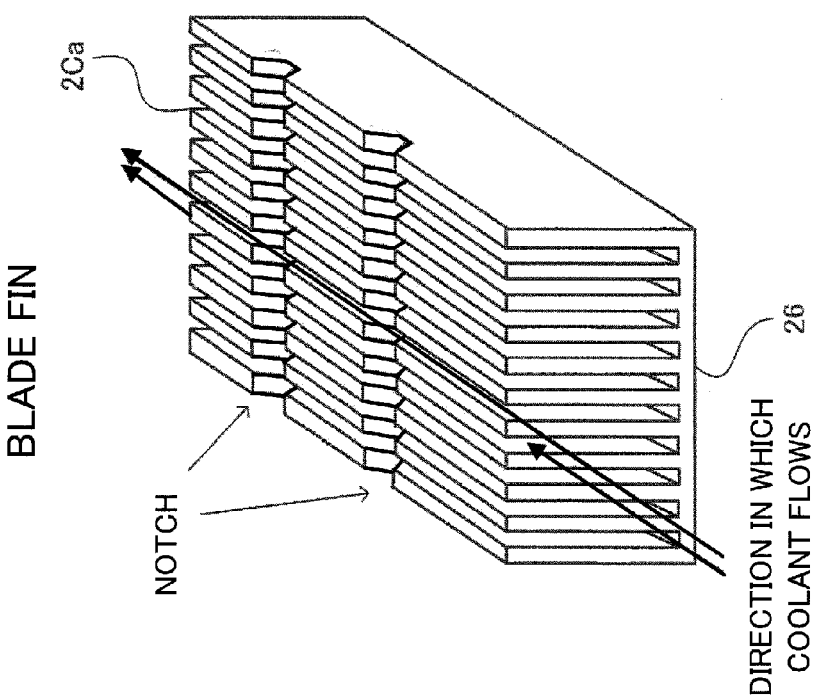

FIGS. 17A and 17B are examples of the shapes of a blade fin and a corrugated fin, respectively, in which notches are put. Notches are put in this way in a fin. Furthermore, ribs which fit into the notches are formed on a bottom of a water jacket. This prevents a coolant from escaping to a bottom clearance C. The coolant which otherwise escapes to the bottom clearance C is effectively utilized for cooling semiconductor elements, and cooling efficiency is improved. FIG. 17 illustrates only two rows of notches. However, FIG. 17 does not illustrate other rows of notches. A plurality of notches described above may be put.

Figure 18:
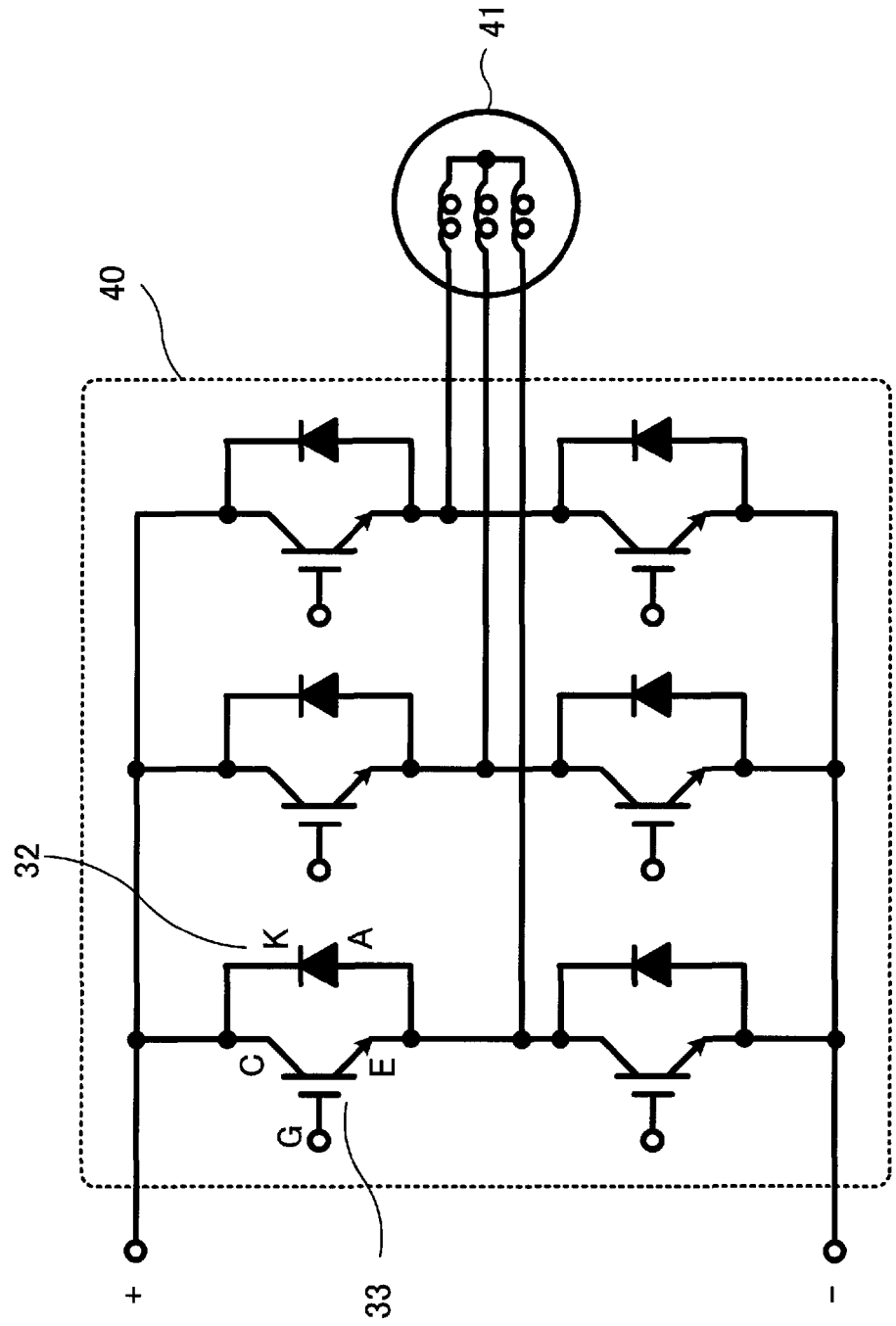
FIG. 18 is an example of a power conversion circuit included in a semiconductor module.

FIG. 18 is an example of a power conversion circuit included in a semiconductor module. In this case, power semiconductor elements are used as semiconductor elements 32 and 33 mounted over a circuit board 31. As illustrated in FIG. 18, for example, a free wheeling diode (FWD) is used as one semiconductor element 32 and an insulated gate bipolar transistor (IGBT) is used as the other semiconductor element 33.

A semiconductor module 10 includes an inverter circuit 40 made up of, for example, three circuit element sections 3A through 3C.

FIG. 18 illustrates the inverter circuit 40 which converts direct current to alternating current and which supplies it to a three-phase alternating current motor 41. The inverter circuit 40 includes a bridge circuit of the semiconductor elements 33, which are IGBTs, and the semiconductor elements 32, which are FWDs, for each of the three phases, or the U phase, the V phase, and the W phase. By controlling switching of the semiconductor elements 33, direct current is converted to alternating current and the three-phase alternating current motor 41 is driven.

In this case, the circuit element sections 3A through 3C each having the above structure are arranged over a fin base 2B of a cooler 2. The circuit element sections 3A through 3C are connected over the cooler 2 so that they will make up, for example, an inverter circuit.

When the power conversion circuit operates, heat generated by each of the circuit element sections 3A through 3C is conducted to the fin base 2B to which it is joined, and is conducted further to fins 2C under the fin base 2B. As stated above, the fins 2C are arranged in the cooling flow path 23. Accordingly, by letting a coolant flow along the cooling flow path 23, the fins 2C are cooled. The circuit element sections 3A through 3C which generate heat are cooled in this way by the cooler 2.

In the above description the semiconductor module 10 includes the three circuit element sections 3A through 3C. However, the number of circuit element sections is not limited to three as with a semiconductor module illustrated as an example for comparison in, for example, FIG. 19.

(Example for Comparison)

Figure 19A:
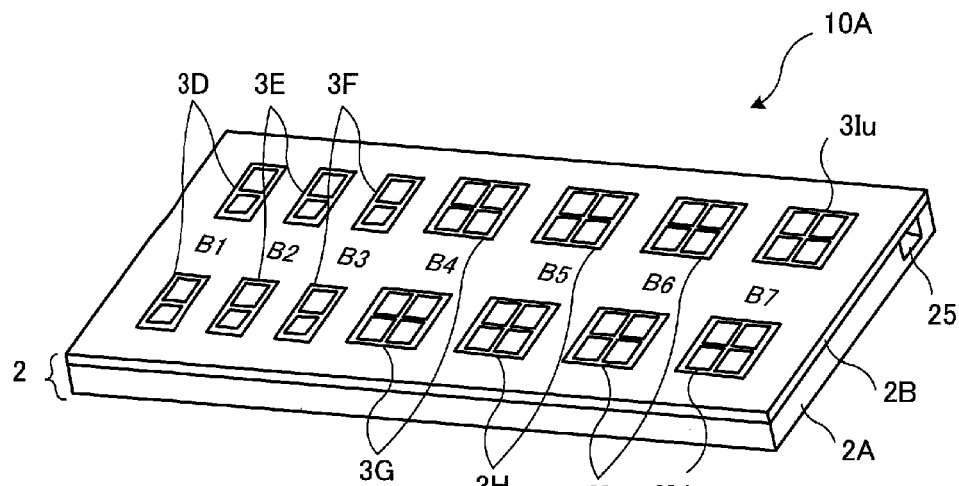
FIGS. 19A and 19B are views for describing a conventional semiconductor module as a first example for comparison, FIG. 19A being a perspective view which illustrates an example of the arrangement of circuit elements, FIG. 19B being a fragmentary perspective view which illustrates the structure of a water jacket included in a cooler.
Figure 19B:
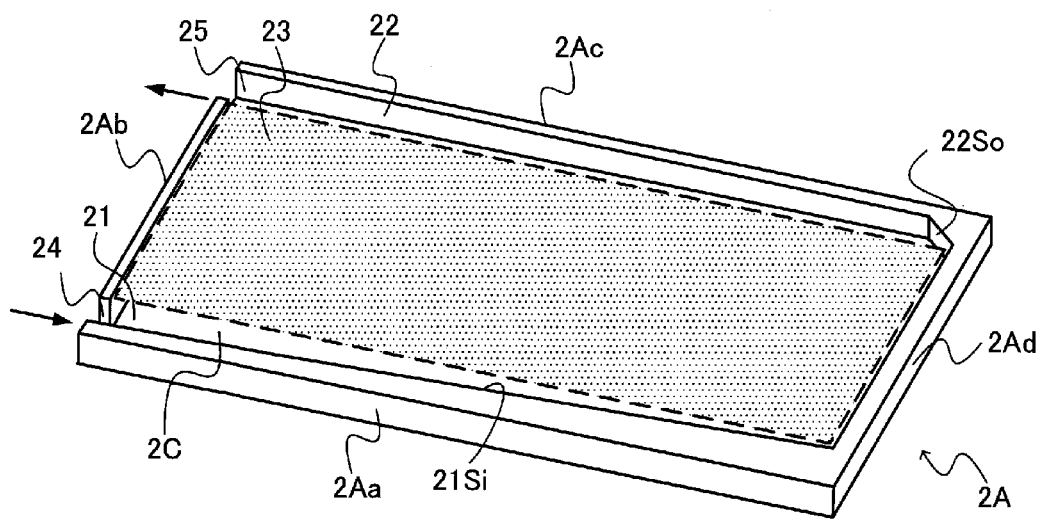

FIGS. 19A and 19B are views for describing a conventional semiconductor module as a first example for comparison. FIG. 19A is a perspective view which illustrates an example of the arrangement of circuit elements. FIG. 19B is a fragmentary perspective view which illustrates the structure of a water jacket (type A) included in a cooler.

With a semiconductor module 10A illustrated in FIG. 19A, a total of 14 circuit element sections 3D through 3I and 3Iu and 3Id are arranged in seven columns (B1 through B7) in the longitudinal direction of a cooler 2 and two rows in the lateral direction of the cooler 2. In order to form, for example, the inverter circuit 40 illustrated in FIG. 18 in plurality, these circuit element sections 3D through 3I and 3Iu and 3Id are properly combined and connections are made.

A coolant introduction flow path 21 and a coolant discharge flow path 22 are formed on one principal plane side of a type A water jacket 2A illustrated in FIG. 19B. In addition, a cooling flow path 23 is formed in a rectangular area indicated by a dashed line on the one principal plane side of the type A water jacket 2A. The size of the cooling flow path 23 formed corresponds to that of fins 2C. As illustrated in FIG. 2, for example, the fins 2C integrate with a fin base 2B and the fin base 2B is placed with its fin 2C side opposite the water jacket 2A. As illustrated in FIGS. 1 and 2, the fin base 2B with which the fins 2C integrate is finally placed in the water jacket 2A.

The fin base 2B is joined to the water jacket 2A by the use of, for example, a proper sealing material (not illustrated). As a result, a cooler 2 including the water jacket 2A, the fin base 2B, and the fins 2C is formed. Guide portions 21Si and 22So each having an incline of 60 degrees or less are formed at a trailing end portion of the coolant introduction flow path 21 into which a coolant is introduced from an introduction inlet 24 and a leading end portion of the coolant discharge flow path 22 which discharges the coolant to a discharge outlet 25 respectively. An entire area of the guide portion 21Si opposite the cooling flow path 23 has a uniform incline.

Figure 20A:
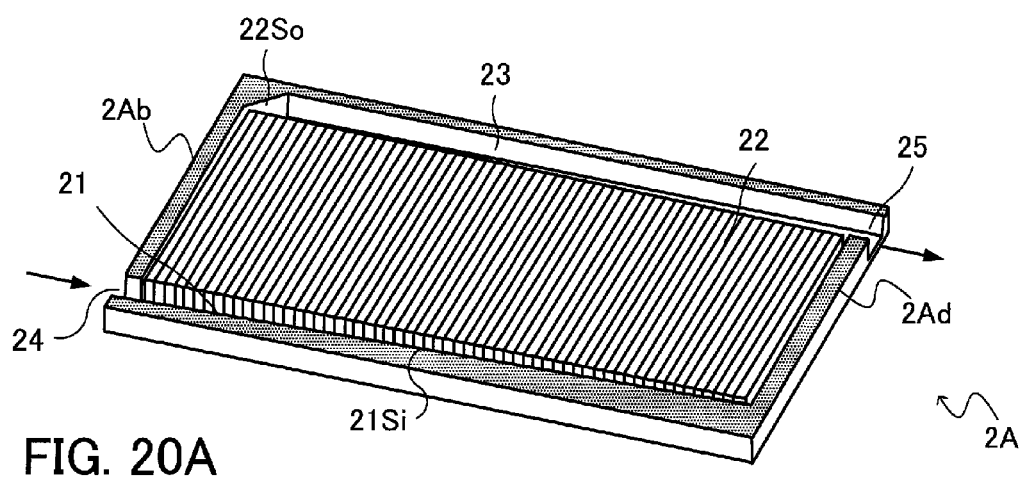
FIGS. 20A and 20B are perspective views which illustrate as second and third examples, respectively, for comparison the shapes of water jackets which differ in type from the water jacket illustrated in FIG. 19B.
Figure 20B:
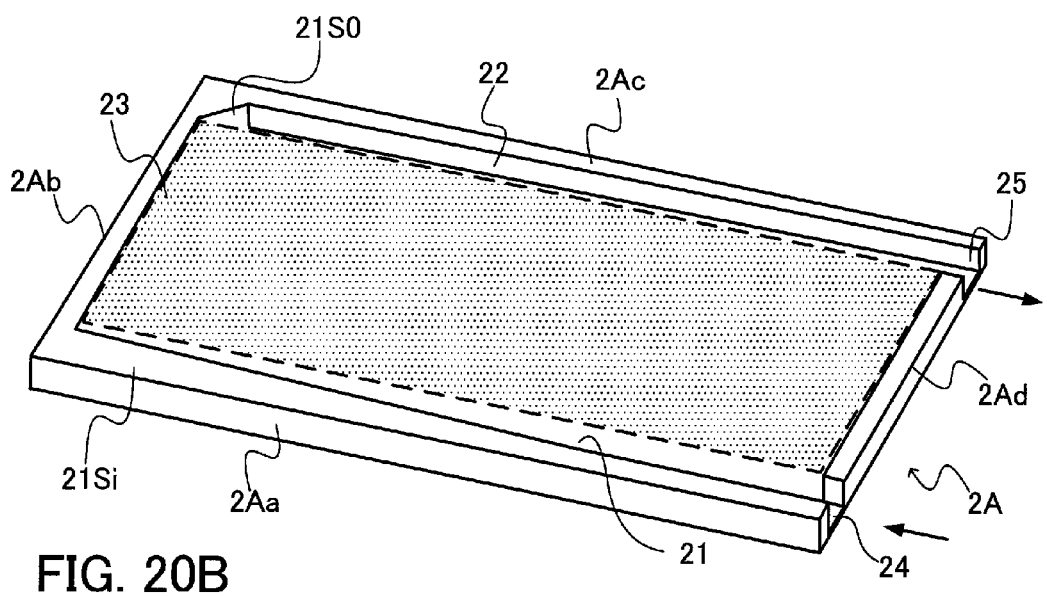

FIGS. 20A and 20B are perspective views which illustrate as second and third examples, respectively, for comparison the shapes of water jackets which differ in type from the water jacket illustrated in FIG. 19B.

FIG. 19B illustrates the type A water jacket in which the introduction inlet 24 and the discharge outlet 25 are arranged in the same left-side wall 2Ab. With a type B water jacket illustrated in FIG. 20A, however, an introduction inlet 24 and a discharge outlet 25 are arranged in a left-side wall 2Ab and a right-side wall 2Ad, respectively, opposite to each other so that they will be diagonally opposite to each other. Furthermore, with a type C water jacket illustrated in FIG. 20B, an introduction inlet 24 and a discharge outlet 25 are arranged only in a right-side wall 2Ad. That is to say, methods for connecting pipes for introducing and discharging a coolant differ, so water jackets having plural shapes are used. Accordingly, it is desirable to optimize the shape of a coolant flow path according to the shape of an actually used water jacket 2A.

FIGS. 21A and 21B are views for describing a conventional semiconductor module as a fourth example for comparison. FIG. 21A is a plan view which illustrates the shape of a water jacket. FIG. 21B is a fragmentary perspective view of the water jacket of FIG. 21A.

FIGS. 21A and 21B illustrate an improved (type D) water jacket. In this case, the width of the introduction inlet 24 of the type A water jacket illustrated in FIG. 19B is changed and a separation wall 27 is formed in the coolant introduction flow path 21 of the type A water jacket illustrated in FIG. 19B.

That is to say, with a type D water jacket 2A, an introduction inlet portion 21a which introduces a coolant into a coolant introduction flow path 21 has a taper shape. Flow path width changes in the introduction inlet portion 21a so that flow path width w2 at a leading end portion of the coolant introduction flow path 21 will be narrower than flow path width w1 at an introduction inlet 24. Furthermore, with the type D water jacket 2A a guide portion 21Si having an inclined portion with a length of 13 mm and a flat portion with a length of 5 mm is formed at a trailing end portion of the coolant introduction flow path 21. In addition, the separation wall 27 is formed in the coolant introduction flow path 21 so that it will separate a flow path into two parts from the leading end portion. The separation wall 27 is placed in parallel with sides of fins 2C in a cooling flow path 23 from which the coolant flows in.

The whole length of the separation wall 27 placed in the coolant introduction flow path 21 is 215 mm in the coolant introduction flow path 21. The separation wall 27 is placed in the coolant introduction flow path 21 so that it will separate a flow path with a width of 10 mm into two flow paths. That is to say, a flow path with a width of 3.5 mm is formed on a fin 2C side and a flow path with a width of 5 mm is formed on a front-side wall 2Aa side. An end portion 27a on an upstream side of the separation wall 27 is placed at a boundary portion between the coolant introduction flow path 21 and the introduction inlet portion 21a.

By forming the separation wall 27 in this way, the flow speed of the coolant which flows in from the introduction inlet 24 is increased and the flow rate of the coolant which flows between the fins 2C is increased. Accordingly, the flow speed of the coolant which flows toward the trailing end portion of the coolant introduction flow path 21 is increased and the effect of cooling a circuit element section 3D (see FIG. 19A) arranged over the end portion 27a of the separation wall 27 is enhanced.

That is to say, the flow speed of the coolant which flows toward the trailing end portion of the coolant introduction flow path 21 is increased. By doing so, the cooling performance of a cooler 2 can properly be improved according to the amount of heat generated by the circuit element sections 3D through 3I and 3Iu and 3Id arranged in the semiconductor module 10A illustrated in FIG. 19A.

Figure 22:
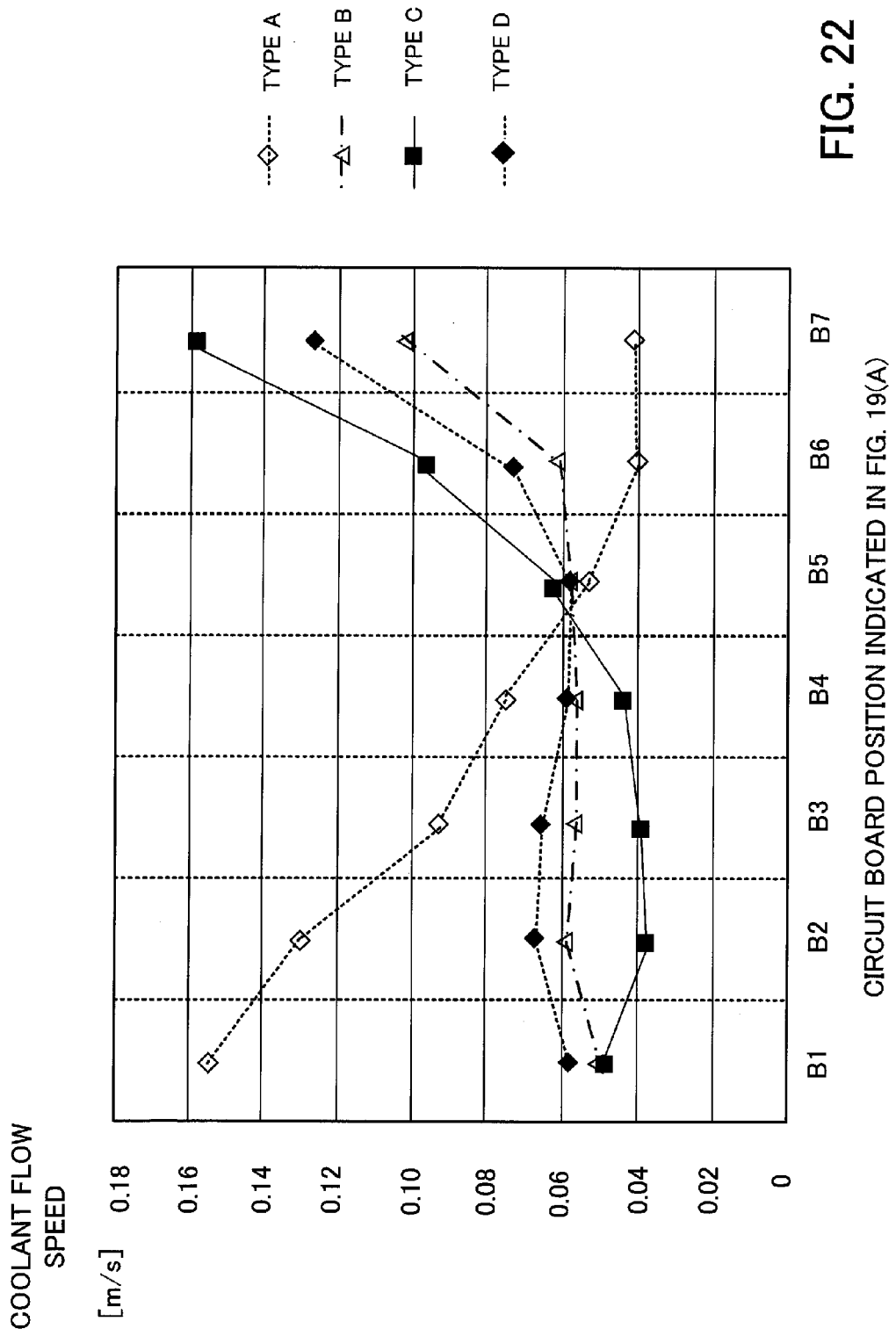
FIG. 22 illustrates the cooling characteristics of the water jackets illustrated in FIGS. 19B through 21A and 21B and illustrates the distribution of coolant flow speed according to circuit board positions and types.
Figure 23:
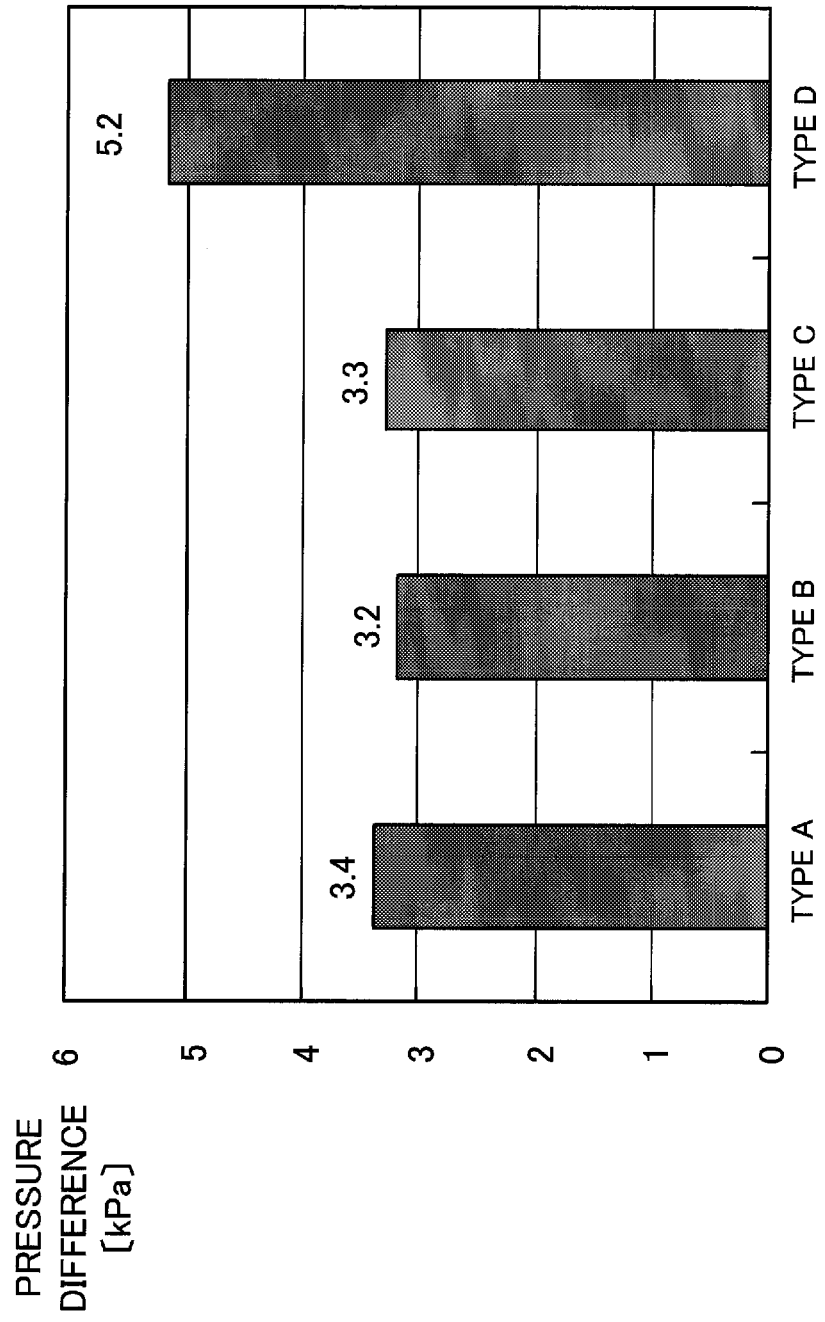
FIG. 23 illustrates the difference between pressure loss at an introduction inlet and pressure loss at a discharge outlet according to types at the time of letting a coolant flow through the semiconductor modules of FIGS. 19B through 21A and 21B.

FIG. 22 illustrates the cooling characteristics of the water jackets illustrated in FIGS. 19B through 21A and 21B and illustrates the distribution of coolant flow speed according to circuit board positions and types. FIG. 23 illustrates the difference between pressure loss at an introduction inlet and pressure loss at a discharge outlet according to types at the time of letting a coolant flow through the semiconductor modules of FIGS. 19B through 21A and 21B.

Graphs in FIG. 22 indicate the flow speed of a coolant which flows between, for example, the blade fins 2Ca that are illustrated in FIG. 16A and that are arranged in a cooling flow path 23 according to circuit board positions (B1 through B7). In this case, the flow rate of the coolant introduced from an introduction inlet 24 is 10 L/min.

With the water jackets 2A of these types (A through D) which differ in flow path shape, as can be seen from these graphs, the coolant which flows under the circuit board positions B1 through B7 has a non-uniform flow speed distribution. For example, with the type A or type C water jacket 2A in which the introduction inlet 24 and the discharge outlet 25 are arranged on the same side, coolant flow speed is high on a B1 or B7 side on which a pipe is connected, and is 0.15 m/sec or more. With the type B water jacket 2A in which the introduction inlet 24 and the discharge outlet 25 are arranged at symmetrical positions, on the other hand, coolant flow speed is highest (0.10 m/sec) at the circuit board position B7 on a discharge outlet 25 side.

A coolant which flows along a cooling flow path 23 has a non-uniform flow speed distribution and the flow speed of the coolant is significantly high on a discharge outlet 25 side of parallel paths formed between a coolant introduction flow path 21 and a coolant discharge flow path 22 by the blade fins 2Ca. Furthermore, with the type D water jacket 2A which is an improvement on the type A water jacket 2A, coolant flow speed is improved on an introduction inlet 24 side and a flow speed distribution (non-uniform flow speed distribution) which is similar to that obtained by the type B water jacket 2A in which the introduction inlet 24 and the discharge outlet 25 are arranged at symmetrical positions is realized.

Furthermore, as can be seen from graphs in FIG. 23 which indicate a pressure loss difference, almost the same pressure loss difference (3.2 to 3.4 kPa) occurs in the type A through C water jackets 2A before improvement. With the type D water jacket 2A in which the width of the coolant introduction flow path 21 is narrowed to two thirds and in which the separation wall 27 is placed in the coolant introduction flow path 21, on the other hand, a pressure loss difference is 5.2 pKa and increases by more than 30 percent.

The arrangement of the circuit element sections 3D through 3I and 3Iu and 3Id cooled by a cooler 2 will now be described.

With the conventional semiconductor module 10A, as illustrated in FIG. 19A, the circuit element sections 3D through 3I, that is to say, a total of 12 circuit element sections are arranged in two rows and six columns over the cooler 2 and the two circuit element sections 3Iu and 3Id having different structure are arranged in the seventh column in addition to the circuit element sections 3D through 3I. In this case, in order to form, for example, the inverter circuit 40 illustrated in FIG. 18 in plurality, the twelve circuit element sections 3D through 3I are properly combined and connections are made. Furthermore, the circuit element sections 3Iu and 3Id are used for forming a step-up converter circuit including, for example, a determined number of IGBTs and FWDs.

In such a case, for example, the circuit element sections 3Iu and 3Id used for forming a step-up converter circuit are connected to a battery and the above inverter circuit 40 and battery voltage is raised by the circuit element sections 3Iu and 3Id. Voltage-raised direct current is converted to alternating current by the inverter circuit 40 and is supplied to the three-phase alternating current motor 41. If the circuit element sections 3Iu and 3Id which differ from the circuit element sections 3D through 3I in type are newly added, it is comparatively easy to arrange them over an end portion of the semiconductor module 10A, as illustrated in FIG. 19A, with circuit design, a wiring layout for production, and the like taken into consideration.

In addition, there are two heat generation portions over fins 2C in a direction in which the coolant flows along the cooling flow path 23 in the cooler 2 of the semiconductor module 10A. That is to say, the two heat generation portions are on upstream and downstream sides in the direction in which the coolant flows. The coolant absorbs heat generated by the heat generation portion on the upstream side, so the temperature of the coolant rises. The coolant reaches the heat generation portion on the downstream side in this state. As a result, the efficiency of cooling a circuit element section arranged on the upstream side is higher than the efficiency of cooling the circuit element section arranged on the downstream side. If this difference in cooling efficiency is taken into consideration, the circuit element sections 3D through 3I are arranged on a coolant introduction flow path 21 side in descending order of amount of heat generated at driving time. By doing so, cooling can be performed more easily.

Furthermore, the flow speed on a discharge outlet 25 side of the coolant which flows along the cooling flow path 23 in the cooler 2 is higher than the flow speed on an introduction inlet 24 side of the coolant which flows along the cooling flow path 23 in the cooler 2. That is to say, the coolant which flows along the cooling flow path 23 in the cooler 2 has the above non-uniform flow speed distribution. In addition, the efficiency of cooling by fins 2C is high at a high flow speed portion of the cooling flow path 23 along which the coolant flows at high speed. Accordingly, it is desirable to let the coolant flow at certain speed or more along the cooling flow path 23 in the semiconductor module 10A according to the amount of heat generated by the circuit element sections 3D through 3I and 3Iu and 3Id. However, if the flow rate of the coolant introduced from the introduction inlet 24 is simply increased in order to increase flow speed at a low flow speed portion, excess coolant flows along the high flow speed portion of the cooling flow path 23. As a result, a high performance pump may be prepared for increasing the flow rate of the coolant to be supplied to the cooler 2.

Usually a thermal fluid analysis including physical phenomena, such as a flow of a coolant, heat conduction, and heat transfer, may be performed to simulate the characteristics of the cooling flow path 23 in the semiconductor module 10A. Furthermore, in order to find a rise in the temperature of the coolant caused by heat generated by the circuit element sections 3D through 3I and 3Iu and 3Id, pressure loss which occurs in a steady operation state is given. By doing so, an analysis result is obtained.

The distribution of coolant flow speed is simulated by the use of the conventional type A through C water jackets 2A illustrated in FIGS. 19B, 20A and 20B respectively. The coolant introduced from the introduction inlet 24 into the water jacket 2A flows as if it were drawn toward the discharge outlet 25. Accordingly, as indicated by the distribution of coolant flow speed illustrated in FIG. 22, the speed of the coolant which flows into the cooling flow path 23 is comparatively high especially on a side near the discharge outlet 25.

In addition, usually it is desirable to maintain coolant flow speed required for cooling according to the amount of heat generated by the circuit element sections 3D through 3I and 3Iu and 3Id arranged. However, if coolant flow speed significantly changes due to the above non-uniform flow speed distribution, cooling performance also has non-uniform distribution. In particular, a change in cooling performance is slight for a change in flow speed in the cooling flow path 23 on a discharge outlet 25 side along which the coolant flows at high speed, and a change in cooling performance is significant for a change in flow speed in the cooling flow path 23 on an introduction inlet 24 side along which the coolant tends to flow at low speed. This means that there is a flow speed component which hardly contributes to improvement in cooling performance in the cooling flow path 23 on the discharge outlet 25 side.

Accordingly, coolant flow speed is made as uniform as possible by improving non-uniform flow speed distribution in the cooling flow path 23. By doing so, more stable cooling performance is obtained and the entire cooling performance of the cooler 2 which cools the circuit element sections 3D through 3I and 3Iu and 3Id is improved.

In addition, non-uniform flow speed distribution which the coolant has is a phenomenon which occurs in parallel flow paths in the cooling flow path 23 between the coolant introduction flow path 21 and the coolant discharge flow path 22. In particular, if intervals between the fins 2C for cooling arranged in the cooling flow path 23 are widened, resistance to the coolant which flows from the coolant introduction flow path 21 to the fins 2C decreases and the coolant easily flows into the cooling flow path 23. Therefore, if intervals between the fins 2C arranged in the cooling flow path 23 are widened, the degree of non-uniformity in flow speed distribution becomes higher.

As stated above, the type A through C water jackets 2A illustrated in FIGS. 19B, 20A and 20B, respectively, differ in non-uniform flow speed distribution, so they differ in uniform and stable cooling method according to the distribution of pressure loss in the cooling flow path 23 which changes according to the positions of the circuit element sections 3D through 3I and 3Iu and 3Id arranged over the fin base 2B.

With semiconductor module coolers according to the following embodiments, an introduction inlet 24 and a discharge outlet 25, as in the conventional type A water jacket 2A illustrated in FIG. 19B, are arranged on the same side and an improvement is introduced for adjusting flow speed distribution in a semiconductor module. A cooling effect obtained by these semiconductor module coolers is based on flow speed distribution verified by the above simulation with the properties of a coolant itself (coolant characteristics) and cooling performance as premises.

First Embodiment

A cooler 2 in which a flow speed adjusting plate 28 is placed at a boundary between a coolant discharge flow path 22 and a cooling flow path 23 for adjusting non-uniform flow speed distribution, in a semiconductor module will now be described.

Figure 24:
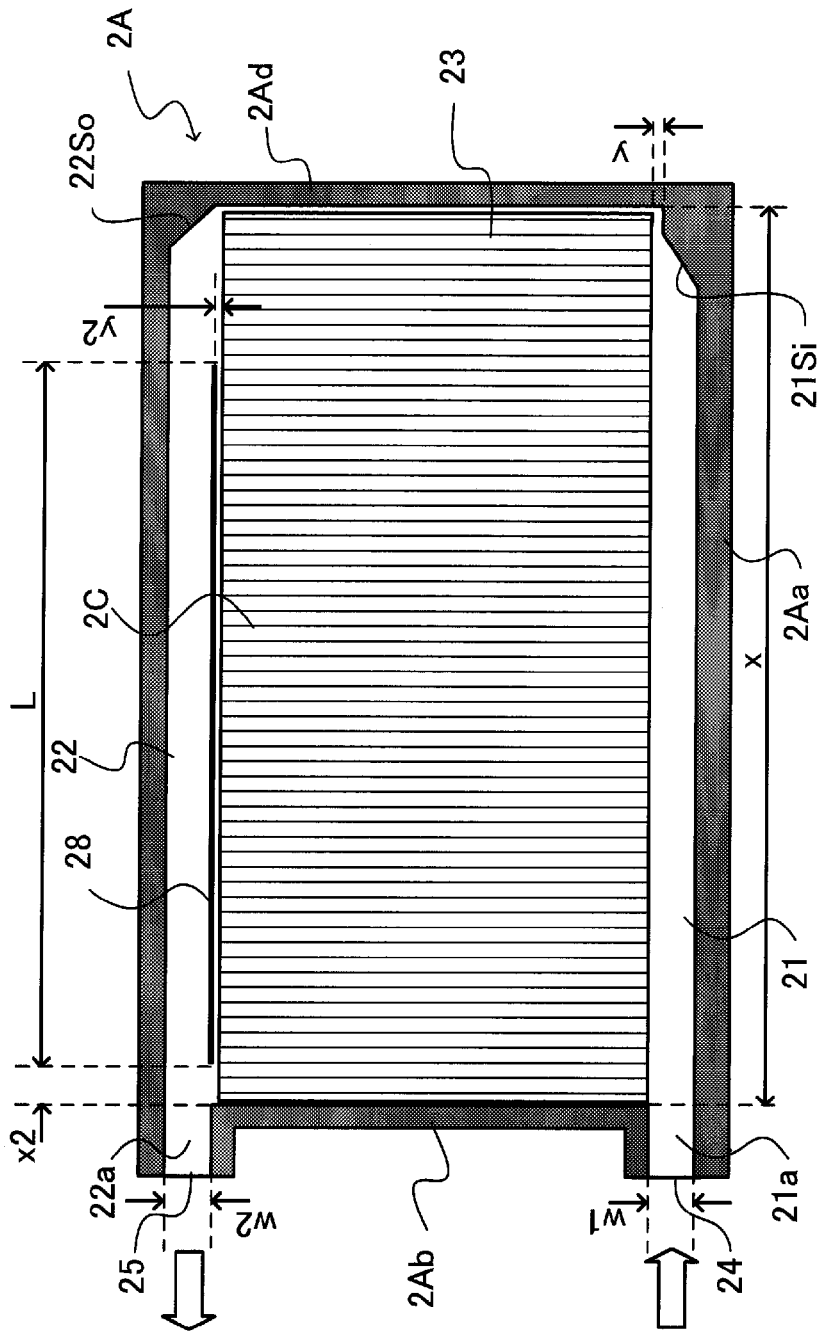
FIG. 24 is a plan view which illustrates the shape of a water jacket used in a semiconductor module cooler according to a first embodiment.

FIG. 24 is a plan view which illustrates the shape of a water jacket used in a semiconductor module cooler according to a first embodiment.

A type Fc water jacket 2A illustrated in FIG. 24 is used as the cooler 2 of the semiconductor module 10A illustrated in FIG. 19A. Accordingly, with the type Fc water jacket 2A an introduction inlet 24 and a discharge outlet 25 are arranged in a left-side wall 2Ab. This is the same with the conventional type A water jacket 2A illustrated in FIG. 19B. However, a introduction inlet portion 21a which introduces a coolant from the introduction inlet 24 to a coolant introduction flow path 21 and a discharge outlet portion 22a which discharges the coolant from a coolant discharge flow path 22 to the discharge outlet 25 are longer than the introduction inlet portion 21a and the discharge outlet portion 22a, respectively, of the water jacket 2A illustrated in FIG. 3. That is to say, the introduction inlet portion 21a and the discharge outlet portion 22a are formed so that they will protrude from the same left-side wall 2Ab.

Furthermore, with the type Fc water jacket 2A the width (w1) of the introduction inlet portion 21a is the same as that of the introduction inlet 24 and the width (w2) of the discharge outlet portion 22a is the same as that of the discharge outlet 25. In addition, w1 and w2 are equal and are, for example, 15 mm. The length x of the coolant introduction flow path 21 is 255.2 mm. A guide portion 21Si having an incline of about 45 degrees is formed at a trailing end portion of the coolant introduction flow path 21 on an inside face side of a front-side wall 2Aa opposite the front-side sides (from which the coolant flows in) of fins 2C arranged in a cooling flow path 23. Clearance y between the guide portion 21Si and fins 2C at the trailing end portion of the coolant introduction flow path 21 is 2 mm. This is the same with the type D water jacket 2A (see FIGS. 21A and 21B).

With the type Fc water jacket 2A a flow speed adjusting plate 28 is placed at a boundary between the coolant discharge flow path 22 and the cooling flow path 23. The shape of the flow speed adjusting plate 28 is as follows. The whole length L is 215 mm, the height h from a bottom of the water jacket 2A is 9.5 mm, and the width (thickness) is 3 mm. Furthermore, the flow speed adjusting plate 28 is placed so that its sidewall will be parallel to the rear-side sides (from which the coolant flows out) of the fins 2C with clearance y2 (=2 mm) and so that there will be clearance x2 (=5 mm) between its one end and the left-side wall 2Ab of the water jacket 2A.

In addition, a guide portion 22So having an incline of about 45 degrees is formed at a leading end portion of the coolant discharge flow path 22 on a right-side wall 2Ad side. This is the same with the guide portion 21Si in the coolant introduction flow path 21. In this case, the flow speed adjusting plate 28 is placed so that its sidewall will be parallel to the rear-side sides of the fins 2C. As a result, the degree of an increase in pressure loss caused by a decrease in the cross-sectional area of a flow path becomes smaller. Furthermore, by widening the width of the coolant discharge flow path 22, a desirable result is obtained.

FIG. 25 is a view for describing the measurements of the flow speed adjusting plate in the semiconductor module cooler of FIG. 24 according to types.

In FIG. 25, type E, type Ea, type Eb, type F, type Fa, and type Fb water jackets 2A other than the type Fc water jacket 2A illustrated in FIG. 24 will be described. With water jackets 2A of these types, the width (w1) of a coolant introduction flow path 21 and the width (w2) of a coolant discharge flow path 22 are equal and are 15 mm, the width of a cooling flow path 23 is 255 mm, the length of the cooling flow path 23 is 117 mm, clearance y between a guide portion 21Si and fins 2C is 2 mm, and clearance y2 between a flow speed adjusting plate 28 and fins 2C is 2 mm.

Furthermore, the type E, type Ea, and type Eb water jackets 2A are equal in L (=175 mm) and x2 (=0 mm). However, the type E, type Ea, and type Eb water jackets 2A are not equal in the height h of the flow speed adjusting plate 28. The height h of the flow speed adjusting plate 28 changes in the range of 5.5 to 9.5 mm. In addition, with the type F, type Fa, and type Fb water jackets 2A, x2 is 0 mm and the height h of the flow speed adjusting plate 28 changes in the range of 5.5 to 9.5 mm. However, the length L of the flow speed adjusting plate 28 is 215 mm and is longer than that of the flow speed adjusting plates 28 included in the type E, type Ea, and type Eb water jackets 2A. Only a type Fc water jacket 2A indicated in FIG. 25 differs from the other water jackets 2A in that x2 is not 0 mm but 5 mm.

The length L of the flow speed adjusting plate 28, the clearance y2 between the sidewall of the flow speed adjusting plate 28 and the rear-side sides of the fins 2C, and the clearance x2 between one end of the flow speed adjusting plate 28 and the left-side wall 2Ab are changed in this way on the basis of flow path shape of each type indicated in FIG. 25. By doing so, the flow speed of a coolant which flows toward the trailing end portion of the coolant introduction flow path 21 is controlled to a proper degree. This will be described with reference to FIGS. 26 and 27A through 27C.

Even if the area of the introduction inlet 24 is the same, the distribution of coolant flow speed in the cooling flow path 23 is improved by forming an introduction inlet portion 21a (see FIG. 21A) the cross-sectional area of which continuously decreases in a direction in which the coolant is introduced.

The results of simulations of coolant flow speed and a cooling effect performed on a water jacket 2A having flow path shape of each type indicated in FIG. 25 will now be described. In this case, it is assumed that blade fins 2Ca which are 1.2 mm in thickness and 10 mm in height are arranged at pitches of 2.1 mm in a cooling flow path 23 formed in an area 117 mm in length and 255 mm in width and that a coolant is introduced from an introduction inlet 24 into a coolant introduction flow path 21 at a flow rate of 10 L/min. In addition, simulations are performed on water jackets 2A of different types. By doing so, the influence of a difference in the length or position of a flow speed adjusting plate 28 on the distribution of coolant flow speed or the like is checked.

FIG. 26 illustrates the cooling characteristics of the water jacket illustrated in FIG. 24 and illustrates the distribution of coolant flow speed according to circuit board positions and types.

The distribution of coolant flow speed indicated in FIG. 26 is obtained by simulating coolant flow speed between fins 2C arranged right under a central portion of a board of each of circuit element sections 3D through 3I and 3Iu and 3Id arranged in seven columns (positions B1 through B7). FIG.

26 indicates flow speed at B1 through B7 in order from an introduction inlet 24 side toward a trailing end portion of a coolant introduction flow path 21. Furthermore, the whole length and height of coolant introduction flow paths 21 used in these simulations on the distribution of coolant flow speed are 255 mm and 10.5 mm respectively.

According to the simulation results indicated in FIG. 26, the distribution of coolant flow speed significantly changes in the type E, type F, and type Fc water jackets 2A in which the flow speed adjusting plate 28 is high and 9.5 mm in height. Furthermore, with the type E and type F water jackets 2A in which the flow speed adjusting plate 28 is 9.5 mm in height, the distribution of coolant flow speed depends on the length L of the flow speed adjusting plate 28. That is to say, coolant flow speed in the type E water jacket 2A is high at the circuit board positions B6 and B7 compared with the type Fb water jacket 2A. Furthermore, with the type F water jacket 2A coolant flow speed increases especially at the circuit board position B7.

That is to say, the flow speed of the coolant discharged from fins 2C decreases due to pressure created at the time of the coolant striking against a flow speed adjusting plate 28, so the distribution of coolant flow speed can be adjusted. Furthermore, with the type Fc water jacket 2A there is clearance x2 (=5 mm) between the left-side wall 2Ab of the water jacket 2A and the end on the discharge outlet 25 side of the flow speed adjusting plate 28. In this case, coolant flow speed increases at the circuit board position B1. As a result, the distribution of coolant flow speed in the cooling flow path 23 has a shape like the letter "U". This means that any distribution of coolant flow speed can be obtained by the use of a flow speed adjusting plate 28 in a coolant discharge flow path 22 and that a clearance of only about 5 mm near a discharge outlet 25 in a coolant discharge flow path 22 exerts a great influence on flow speed adjustment.

A state of heat generation by power semiconductor elements corresponding to coolant flow speed at circuit element sections 3D through 3I and 3Iu and 3Id, that is to say, cooling characteristics can be checked for a water jacket 2A of each type indicated in FIG. 25 from the above simulation results.

Figure 27A:
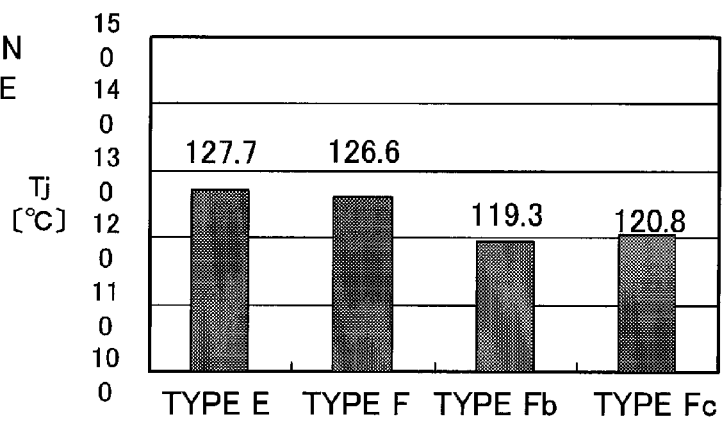
FIGS. 27A, 27B, and 27C illustrate the cooling characteristics of the water jacket illustrated in FIG. 24 and illustrate the temperature of circuit element sections at steady operation time according to types.
Figure 27B:
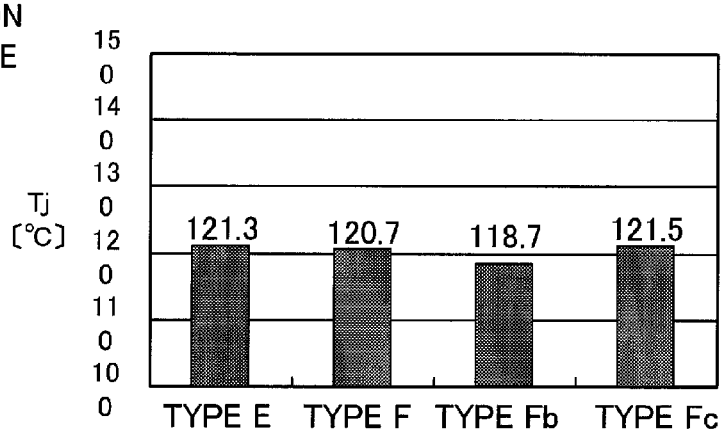
Figure 27C:
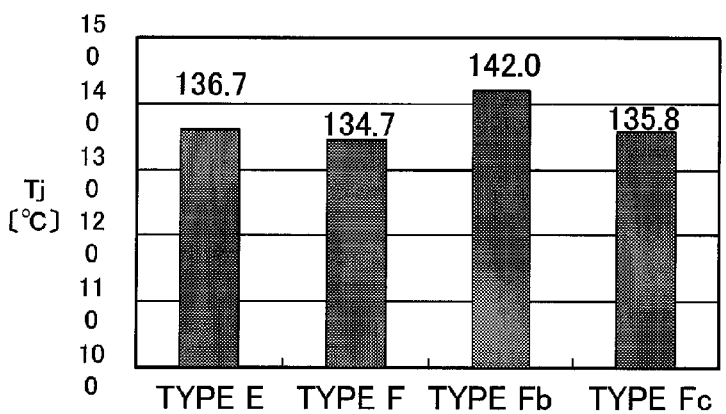

FIGS. 27A, 27B, and 27C illustrate the cooling characteristics of the water jacket illustrated in FIG. 24 and illustrate the temperature of circuit element sections at steady operation time according to types. FIGS. 27A, 27B, and 27C are examples of the results of simulations performed by the above technique.

Pressure loss which occurs to a coolant in a water jacket 2A at the time of cooling a circuit element section 3D and the like differs among the different types indicated in FIG. 25. As illustrated in FIG. 19A, however, the positions B1 through B6 are classified into two groups: a group of the positions B1 through B3 of the circuit element sections 3D through 3F, respectively, arranged in the three columns on the introduction inlet 24 side and a group of the positions B4 through B6 of the circuit element sections 3G through 3I, respectively, arranged in the three columns. It is assumed that pressure loss in a water jacket 2A may be set to the same value in the same group. In addition, with the circuit element sections 3Iu and 3Id arranged in the seventh column, different heat loss values are set for the circuit element section 3Id arranged on the upstream side and the circuit element section 3Iu arranged on the downstream side.

In FIG. 27A, the temperature of an IGBT arranged on the downstream side in the circuit element section 3D arranged in the first column (position B1) is measured. In FIG. 27B, the temperature of an IGBT arranged on the downstream side in the circuit element section 3G arranged in the fourth column (position B4) is measured. Furthermore, of the circuit element sections 3Iu and 3Id arranged in the seventh column (position B7), the temperature of the circuit element section 3Id on the upstream side at which greater pressure loss occurs is measured. In addition, on the basis of the relationships among coolant flow speed, coolant temperature, and cooling performance, the relationships $$3D < 3G < 3Iu < 3Id$$

are set among pressure loss values set according to amounts of heat generated by the circuit element sections 3D through 3I and 3Iu and 3Id.

As indicated in FIG. 27C, junction temperature (Tj) in the circuit element section 3Id is 136.7° C. for the type E water jacket 2A, is 134.7° C. for the type F water jacket 2A, and is 142.0° C. for the type Fb water jacket 2A in which the distribution of coolant flow speed is non-uniform on the discharge outlet 25 side. In this case, a change in the length of the flow speed adjusting plate 28 has the effect of lowering the temperature by more than 5° C. In addition, as indicated in FIG. 27A or 27B, junction temperature in the IGBT in the circuit element section 3D or 3G changes with a change in the distribution of coolant flow speed on the downstream side in the first or fourth column. However, if the length of the flow speed adjusting plate 28 is adjusted so that coolant flow speed corresponding to pressure loss which occurs under the circuit element sections 3D through 3I and 3Iu and 3Id will be obtained, stable cooling performance is realized in the columns (positions B1 through B7) in the longitudinal direction of the cooler 2.

As has been described, with the water jacket 2A used in the semiconductor module according to the embodiment, the flow speed adjusting plate 28 is placed at a boundary between the coolant discharge flow path 22 and the cooling flow path 23. By doing so, junction temperature in a power semiconductor element can be lowered. In particular, the effect of increasing flow speed right under a central portion of a board of the circuit element section 3Id (position B7) where great pressure loss occurs is important.

Figure 28:
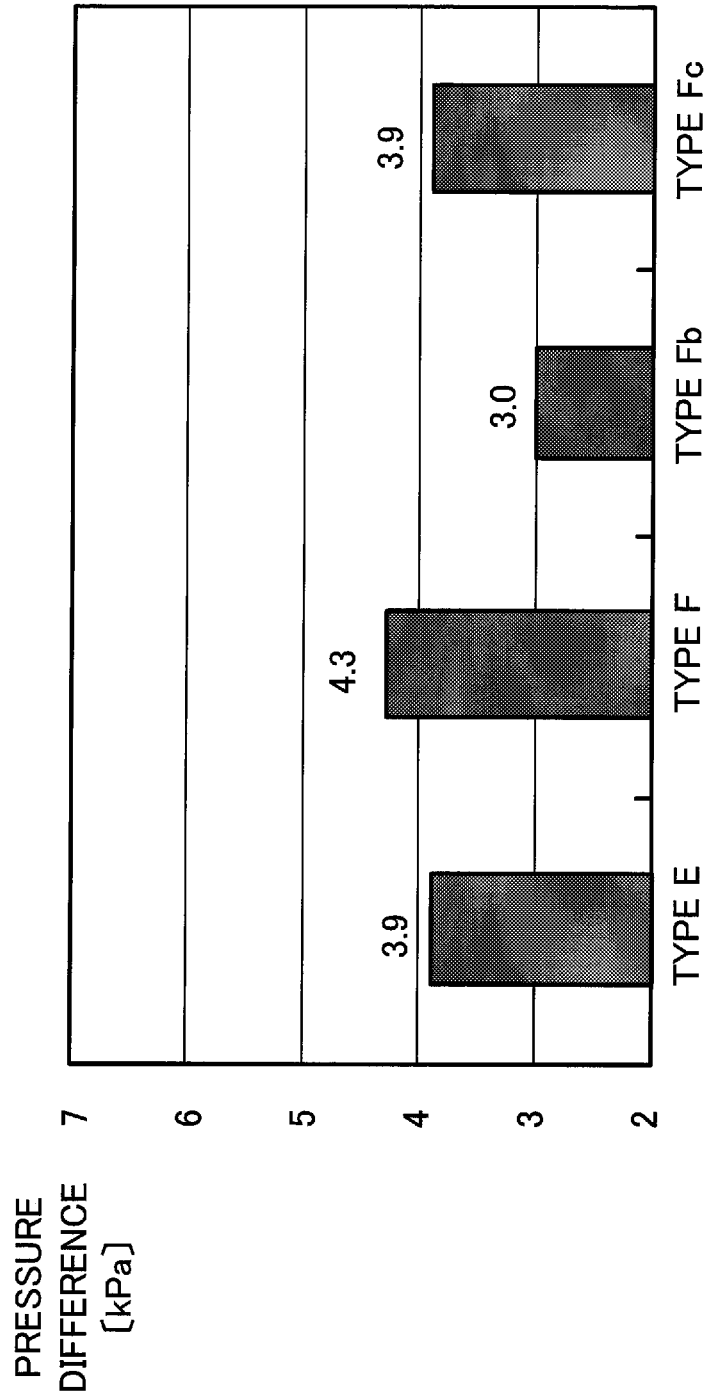
FIG. 28 illustrates the difference between pressure loss at an introduction inlet and pressure loss at a discharge outlet according to types at the time of letting a coolant flow through the semiconductor module illustrated in FIG. 24.

FIG. 28 illustrates the difference between pressure loss at the introduction inlet and pressure loss at the discharge outlet according to types at the time of letting a coolant flow through the semiconductor module illustrated in FIG. 24. According to simulation results indicated in FIG. 28, all values are below 4.5 kPa. In this case, pressure loss is small compared with the water jacket 2A (type D) which is illustrated in FIGS. 21A and 21B as the fourth example for comparison and in which an improvement is introduced on the coolant introduction flow path 21 side. In addition, the distribution of coolant flow speed is almost uniform. By placing the flow speed adjusting plate 28 in this way for adjusting flow speed on the coolant discharge flow path 22 side, pressure loss is reduced and the load on a pump is lessened.

With the water jacket 2A according to the first embodiment, the coolant introduction flow path 21 is demarcated by an inside face of the bottom wall 2Ae and the front-side sides of the fins 2C which make up a heat sink, and the coolant discharge flow path 22 is demarcated by the inside face of the bottom wall 2Ae and the rear-side sides of the fins 2C. The flow speed adjusting plate 28 is placed in the coolant discharge flow path 22. The flow speed of the coolant which flows from the coolant introduction flow path 21 to the fins 2C is properly adjusted by pressure created at the time of the coolant which flows from the fins 2C striking against the flow speed adjusting plate 28. By doing so, non-uniform flow speed distribution which the coolant has between the fins 2C disappears. As a result, semiconductor elements arranged over the cooler 2 are cooled uniformly and stably and a malfunction in or destruction of a semiconductor element caused by heat is prevented reliably.

Furthermore, with the water jacket 2A according to the first embodiment, the introduction inlet 24 and the discharge outlet 25 are arranged on the same side and flow path shape is formed to obtain cooling performance which accommodates pressure loss under the different circuit element sections 3D through 3I and 3Iu and 3Id. In particular, the water jacket 2A in which length between the introduction inlet 24 and the discharge outlet 25 is shorter can be fabricated inexpensively and easily.

Moreover, in addition to placing the flow speed adjusting plate 28 in the coolant discharge flow path 22, the width of a conventional coolant introduction flow path 21 is adjusted or the separation wall 27 illustrated in FIGS. 21A and 21B is used. By doing so, a more flow speed adjustment effect is obtained.

The fins 2C which make up a heat sink are arranged so that their front-side sides will be approximately parallel to a direction in which the coolant flows in from the introduction inlet 24 and so that their front-side sides and an inner wall of the introduction inlet portion 21a will form a straight line to avoid blocking a flow of the coolant in the coolant introduction flow path 21. Furthermore, the distance between the bottom wall 2Ae of the water jacket 2A and the fin base 2B which specifies the height of the coolant introduction flow path 21 is constant.

Second Embodiment

Figure 29:
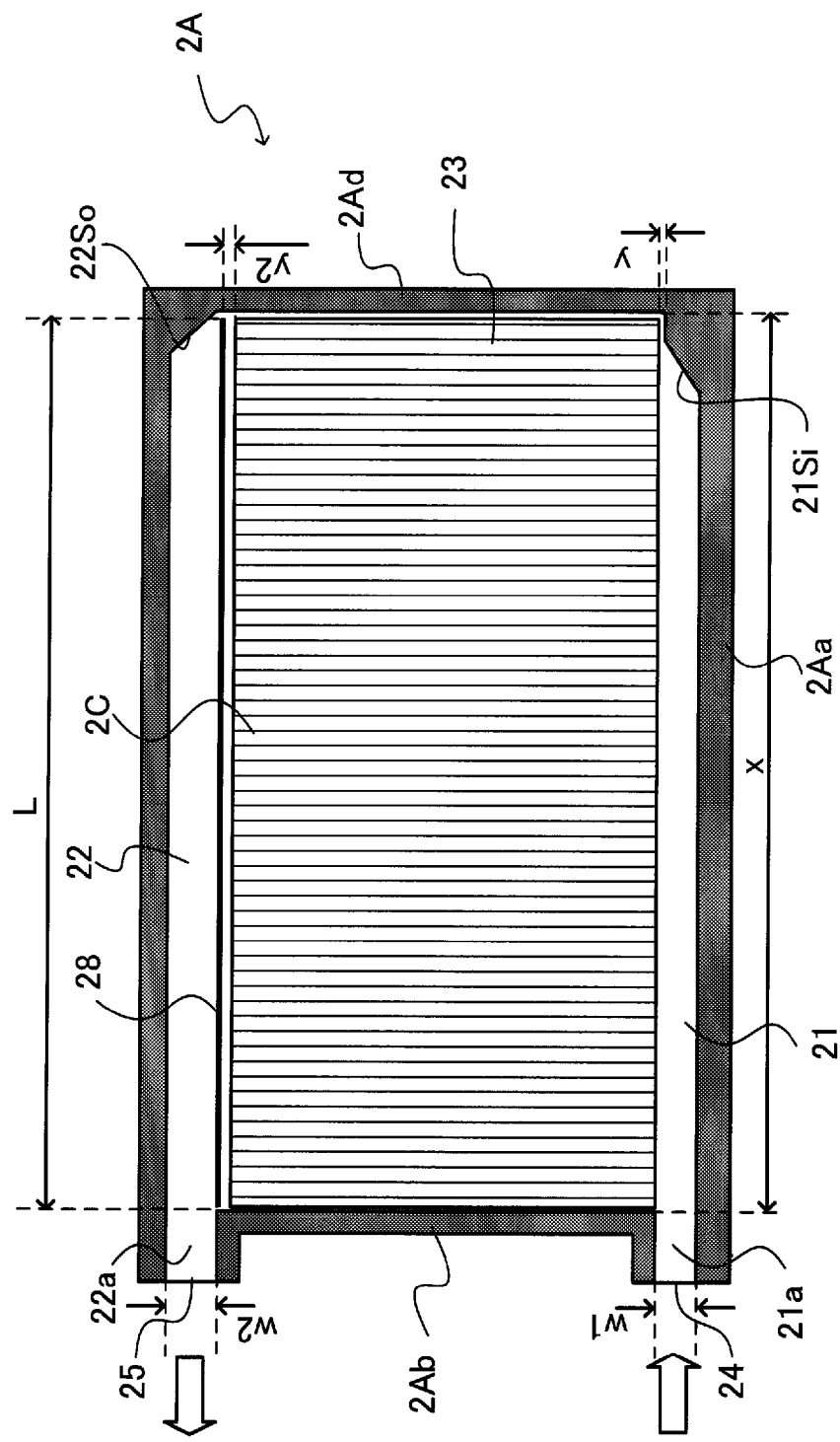
FIG. 29 is a plan view which illustrates the shape of a water jacket used in a semiconductor module cooler according to a second embodiment.

FIG. 29 is a plan view which illustrates the shape of a water jacket used in a semiconductor module cooler according to a second embodiment.

With a semiconductor module cooler according to a second embodiment, a flow speed adjusting plate 28 is placed in a coolant discharge flow path 22 and the length of the flow speed adjusting plate 28 is the same as that of the coolant discharge flow path 22. By doing so, non-uniform flow speed distribution which a coolant otherwise has in the semiconductor module cooler is adjusted and semiconductor elements are cooled uniformly and stably.

With a type G water jacket 2A illustrated in FIG. 29, a introduction inlet portion 21a which introduces the coolant from an introduction inlet 24 to a coolant introduction flow path 21 and a discharge outlet portion 22a which discharges the coolant from the coolant discharge flow path 22 to a discharge outlet 25 are formed so that they will protrude from the same left-side wall 2Ab of the water jacket 2A. This is the same with the type D water jacket 2A illustrated in FIGS. 21A and 21B, the type Fc water jacket 2A illustrated in FIG. 24, or the like. In addition, with the type G water jacket 2A, the introduction inlet 24 and the discharge outlet 25 of the cooler are formed on the same side and the flow speed adjusting plate 28 the length of which is equal to the length x of the coolant discharge flow path 22 is placed at a boundary between the coolant discharge flow path 22 and a cooling flow path 23.

FIG. 30 is a view for describing the measurements of the flow speed adjusting plate and flow path width at the introduction inlet and the discharge outlet in the semiconductor module cooler of FIG. 29 according to types. With the type G water jacket 2A, as indicated in FIG. 30, the flow speed adjusting plate 28 of any height not exceeding 8 mm from a bottom wall 2Ae of the water jacket 2A is perpendicularly formed in the coolant discharge flow path 22. Furthermore, the cooling flow path 23 is formed between the coolant introduction flow path 21 with a width of 10 mm and the coolant discharge flow path 22 with a width of 15 mm. FIG. 30 indicates the measurements of type Ga, type Gb, type Gc, type H, and type I water jackets 2A in addition to the measurements of the type G water jacket 2A.

As stated above, the distribution of the flow speed of the coolant which flows along the cooling flow path 23 depends on the position of the discharge outlet 25 of the water jacket 2A. Furthermore, in this embodiment the flow speed adjusting plate 28 with a length (L) of 255 mm and a width (thickness) of 3 mm is formed in the coolant discharge flow path 22 (that is to say, clearance x2 between the left-side wall 2Ab of the water jacket 2A and one end of the flow speed adjusting plate 28 is 0 mm). By doing so, adjustment is made in order to make the flow speed of the coolant which flows out from fins 2C uniform and realize uniform distribution of coolant flow speed.

As has been described, with the type G water jacket 2A, the length of the flow speed adjusting plate 28 is equal to the length x of the coolant discharge flow path 22 (or the width of the cooling flow path 23) and the flow speed adjusting plate 28 is connected to the left-side wall 2Ab of the water jacket 2A (sidewall on the discharge outlet 25 side of the cooling flow path 23). The type G water jacket 2A differs from water jackets 2A of all the types indicated in FIG. 25 in these respects.

Figure 31A:
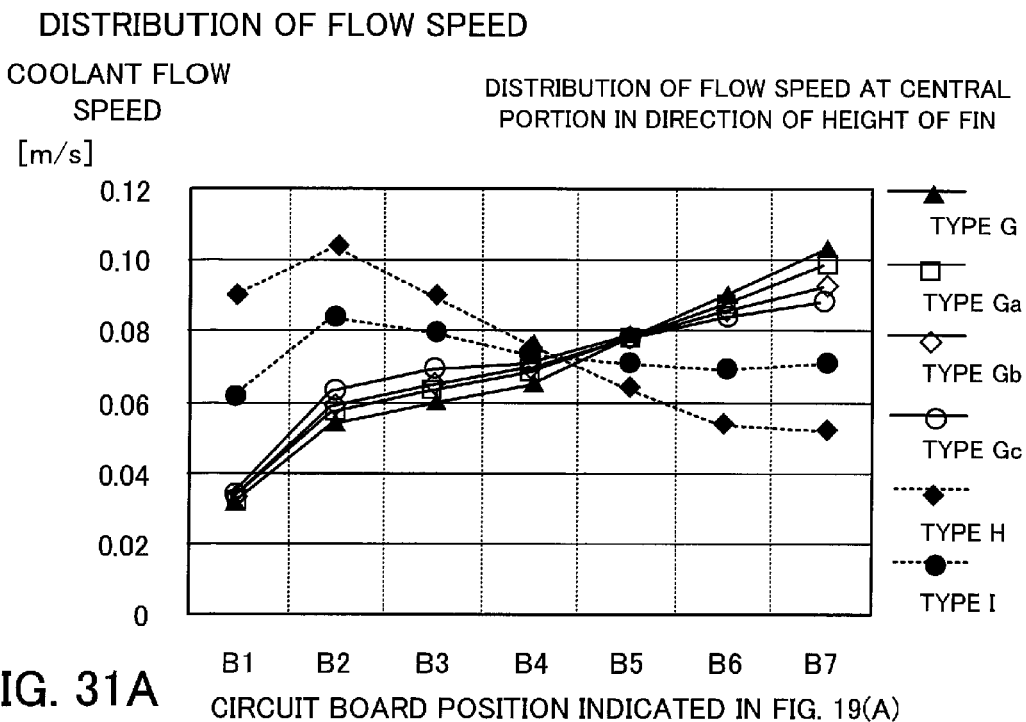
FIGS. 31A and 31B illustrate the cooling characteristics of the water jacket of FIG. 29, FIG. 31A illustrating the distribution of coolant flow speed according to circuit board positions and types, FIG. 31B illustrating the difference between pressure loss at an introduction inlet and pressure loss at a discharge outlet according to types.
Figure 31B:
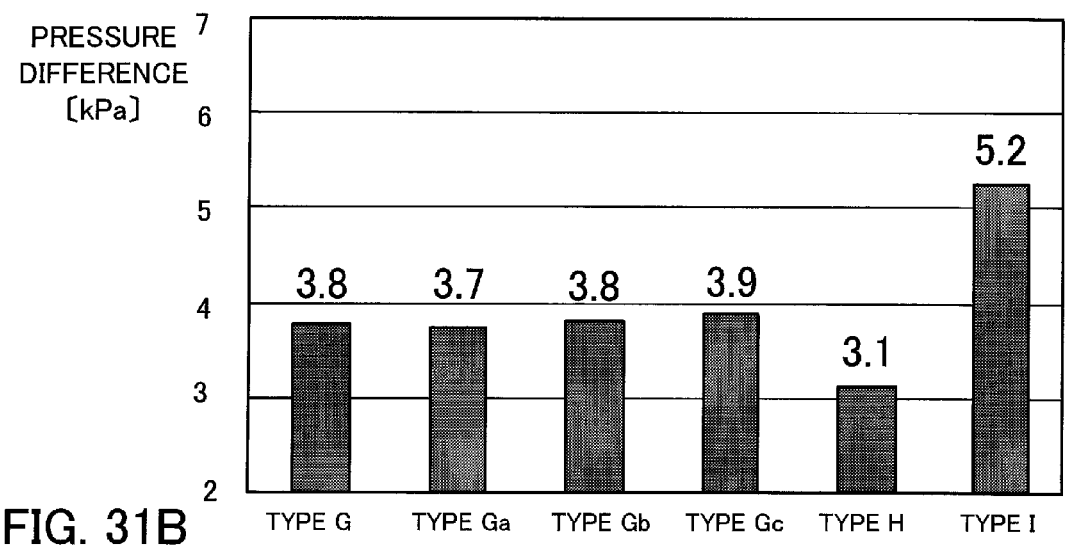

FIGS. 31A and 31B illustrate the cooling characteristics of the water jacket of FIG. 29. FIG. 31A illustrates the distribution of coolant flow speed according to circuit board positions and types. FIG. 31B illustrates the difference between pressure loss at the introduction inlet and pressure loss at the discharge outlet according to types.

In FIG. 31A, a comparison of the distribution of coolant flow speed obtained by simulating coolant flow speed right under central portions of boards of the circuit element sections 3D through 3I and 3Iu and 3Id arranged at the circuit board positions B1 through B7, respectively, indicated in FIG. 19A is made according to circuit board positions and types. Furthermore, pressure loss difference is the difference between pressure at the introduction inlet 24 and pressure at the discharge outlet 25.

FIGS. 31A and 31B indicate simulation results on the type G, type Ga, type Gb, type Gc, type H, and type I water jackets 2A. With the type G, type Ga, type Gb, and type Gc water jackets 2A, the width w1 of the coolant introduction flow path 21 is 10 mm and the height h of the flow speed adjusting plate 28 differs, that is to say, the height h of the flow speed adjusting plate 28 is 2, 4, 6, and 8 mm respectively. In this case, the distribution of coolant flow speed can be made uniform by decreasing coolant flow speed especially at the circuit board position B7. Furthermore, according to the simulation results on the type G, type Ga, type Gb, and type Gc water jackets 2A in which the width w1 of the coolant introduction flow path 21 is 10 mm, the type H water jacket 2A in which the width w1 of the coolant introduction flow path 21 is 15 mm, and the type I water jacket 2A in which the width w1 of the coolant introduction flow path 21 is 12.5 mm, the difference between maximum flow speed and minimum flow speed is the smallest if the difference between the width w1 of the coolant introduction flow path 21 and the width w2 of the coolant discharge flow path 22 is 2.5 mm (type I water jacket 2A). Furthermore, with the type H water jacket 2A in which the width w1 is equal to the width w2 (=15 mm), coolant flow speed at the circuit board position B1 is higher than coolant flow speed at the circuit board position B7. That is to say, the distribution of coolant flow speed in the type I water jacket 2A in which the width w1 of the coolant introduction flow path 21 is 12.5 mm is the closest to uniform distribution.

However, if the height h of the flow speed adjusting plate 28 is set to 8 mm in the type H water jacket 2A in which the width w1 of the introduction inlet 24 and the width w2 of the discharge outlet 25 are 15 mm, the minimum value of coolant flow speed is 0.05 m/sec. This value is greater than the minimum value of coolant flow speed (=0.04 m/sec) in the conventional type A water jacket 2A in which a flow speed adjusting plate 28 is not placed. Accordingly, the distribution of coolant flow speed in the cooling flow path 23 is uniform and flow speed adjustment can be made according to pressure loss under each circuit element section. According to FIG. 31B, on the other hand, a pressure loss difference in the type I water jacket 2A is 5.2 kPa and a change in pressure loss difference relates to the width w1 of the coolant introduction flow path 21. This means that there is a trade-off relationship between uniform distribution of coolant flow speed and pressure loss difference.

Furthermore, narrowing clearance y2 between the fins 2C and the flow speed adjusting plate 28 (which is 2 mm in the water jacket 2A of each type) is highly effective for making the distribution of coolant flow speed uniform. However, as the clearance y2 between the fins 2C and the flow speed adjusting plate 28 becomes narrower, pressure loss in the water jacket 2A increases. However, pressure loss differences in the type G, type Ga, type Gb, type Gc, type H, and type I water jackets 2A are below 6 kPa. A pressure loss difference which is expected to arise in a water jacket 2A is 10 kPa. The above pressure loss differences are below 10 kPa, so it is possible to let a coolant flow at a sufficient flow rate without hindrance even by conventional pump performance.

As has been described, with the water jacket 2A according to the second embodiment the introduction inlet 24 and the discharge outlet 25 of the cooler are formed on the same side. In addition, the flow speed adjusting plate 28 is placed at a boundary between the coolant discharge flow path 22 and the cooling flow path 23. The length of the flow speed adjusting plate 28 is equal to that of the coolant discharge flow path 22 and the width w1 of the coolant introduction flow path 21 is narrowed to some extent. By doing so, the distribution of coolant flow speed is made uniform. Accordingly, in the second embodiment the distribution of coolant flow speed which is efficient in cooling is obtained by making non-uniform coolant flow speed distribution in the water jacket 2A uniform even if pressure loss under a circuit element section on the upstream side is almost the same as pressure loss under a circuit element section on the downstream side.

An embodiment in which the distribution of coolant flow speed in a cooling flow path made up of a plurality of parallel flow paths is adjusted more effectively by forming a plurality of guide portions in a coolant introduction flow path will now be described.

Figure 32:
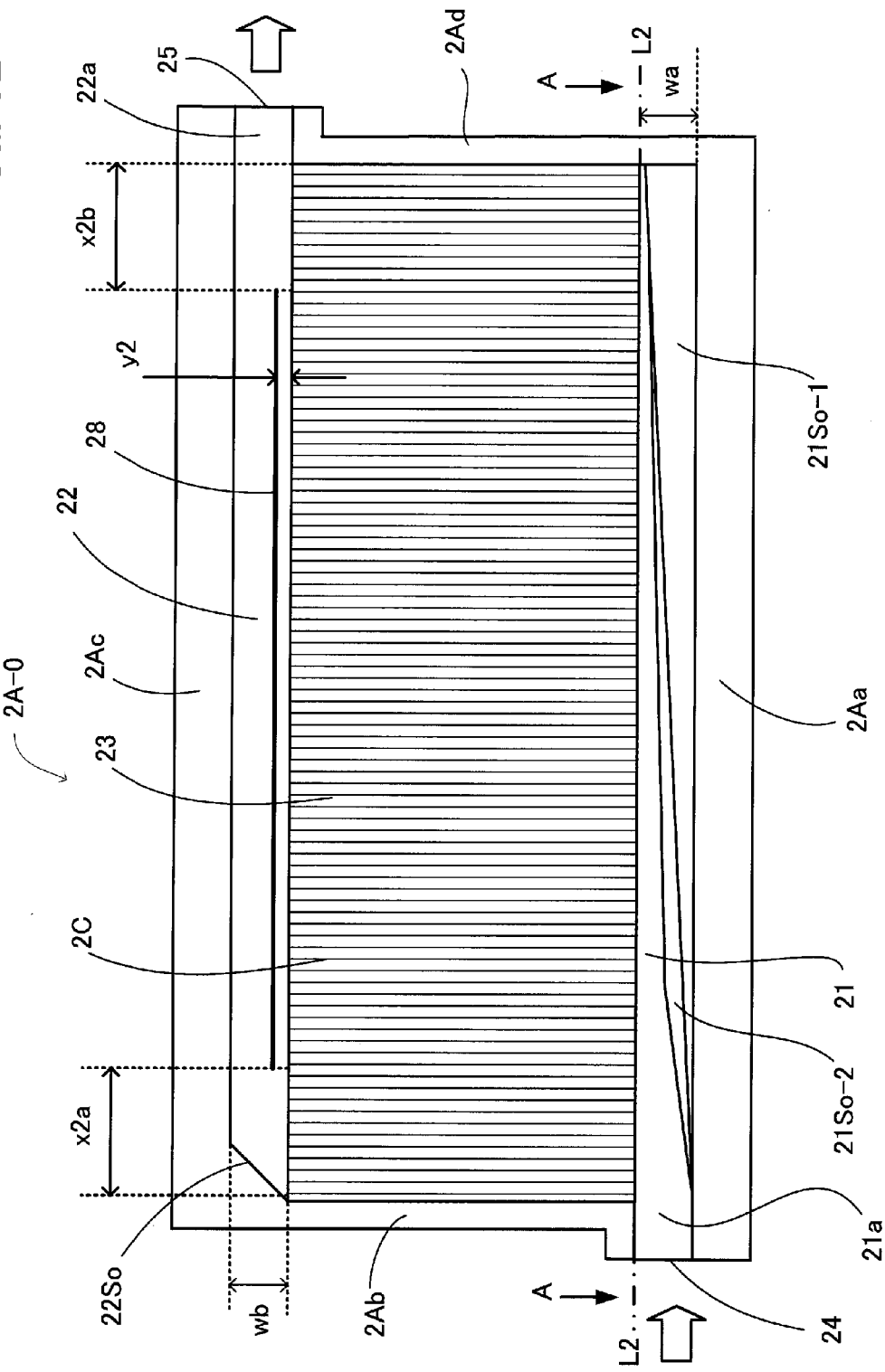
FIG. 32 is an example of the structure of a water jacket used in a semiconductor module cooler.

FIG. 32 is an example of the structure of a water jacket used in a semiconductor module cooler. A water jacket 2A-0 in a semiconductor module cooler is approximately rectangular parallelepipedic in external shape.

A coolant introduction flow path 21, a introduction inlet portion 21a, a coolant discharge flow path 22, a discharge outlet portion 22a, and a cooling flow path 23 in which fins 2C are arranged are formed in the water jacket 2A-0. Furthermore, the coolant introduction flow path 21 and the like are demarcated by a front-side wall 2Aa, a left-side wall 2Ab, a rear-side wall 2Ac, a right-side wall 2Ad, and a bottom of the water jacket 2A-0. For convenience of explanation FIG. 32 illustrates the fins 2C.

An introduction inlet 24 for introducing a coolant into the inside and a discharge outlet 25 for discharging the coolant to the outside are formed at positions diagonally opposite to each other. In the case of FIG. 32, for example, the introduction inlet 24 is formed in a lower portion of the left-side wall 2Ab of the water jacket 2A-0 and the discharge outlet 25 is formed in an upper portion of the right-side wall 2Ad of the water jacket 2A-0 (alternatively, the introduction inlet 24 may be formed in an upper portion of the left-side wall 2Ab and the discharge outlet 25 may be formed in a lower portion of the right-side wall 2Ad). A direction in which the coolant is introduced from the introduction inlet 24 and a direction in which the coolant is discharged from the discharge outlet 25 are the same.

Furthermore, a flow speed adjusting plate 28 is placed in an approximately central portion of the coolant discharge flow path 22 at a boundary between the coolant discharge flow path 22 and the cooling flow path 23. A sidewall of the flow speed adjusting plate 28 is parallel to sides of the fins 2C from which the coolant flows out, and there is clearance y2 between the sidewall of the flow speed adjusting plate 28 and the sides of the fins 2C. In addition, there is clearance x2a between one end of the flow speed adjusting plate 28 and the left-side wall 2Ab of the water jacket 2A-0 and there is clearance x2b between the other end of the flow speed adjusting plate 28 and the right-side wall 2Ad of the water jacket 2A-0.

Moreover, a leading end portion of the coolant discharge flow path 22 along which the coolant is discharged to the discharge outlet 25 is chamfered to form a guide portion 22So having an incline of about 45 degrees. Furthermore, guide portions 21So-1 and 21So-2 are formed in the coolant introduction flow path 21.

Figure 33:
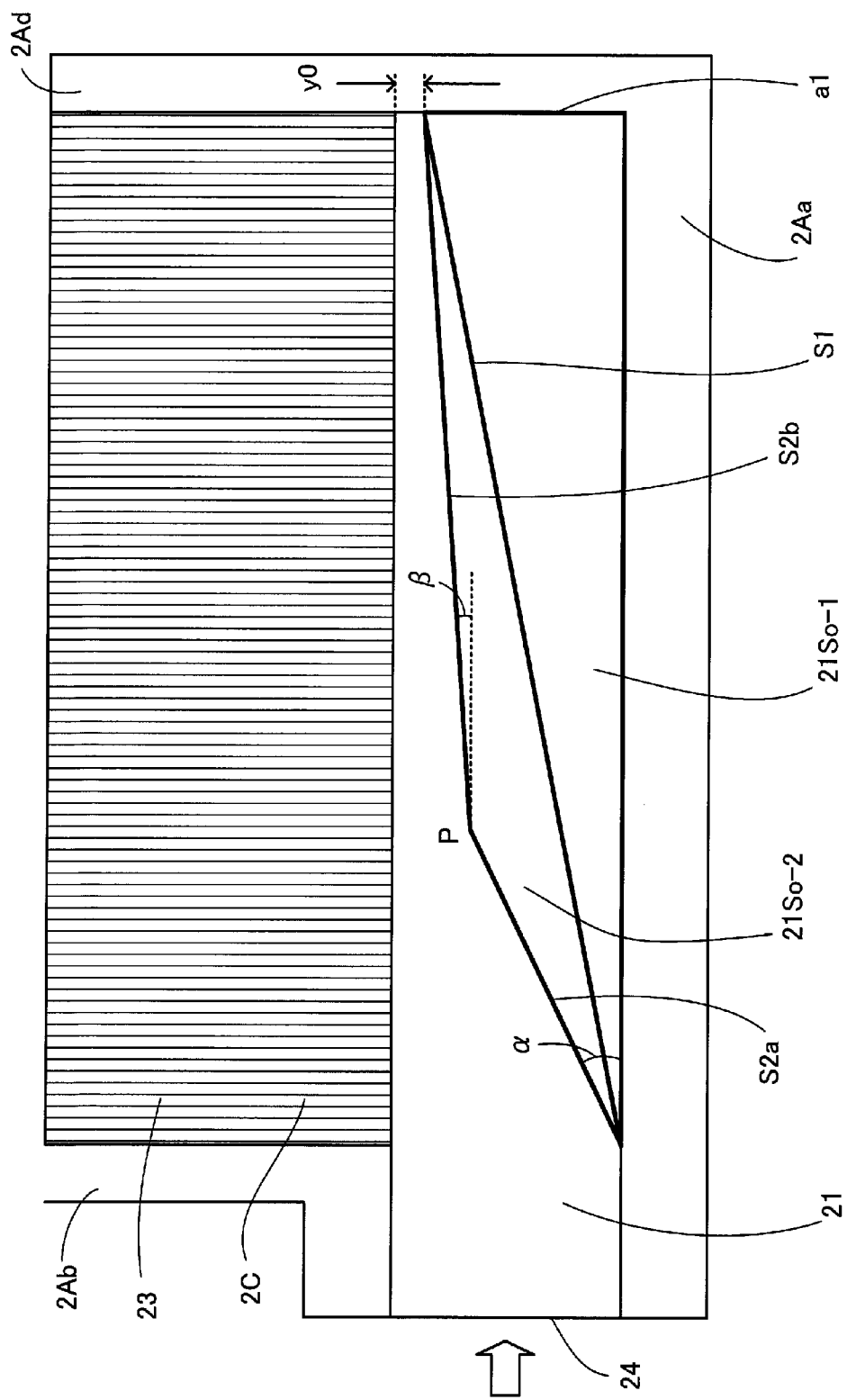
FIG. 33 is an example of the structure of guide portions.

FIG. 33 is an example of the structure of the guide portions. FIG. 33 is an enlarged view which illustrates the guide portions 21So-1 and 21So-2 and their vicinities illustrated in FIG. 32. The guide portion 21So-1 has a guide wall S1 on a cooling flow path 23 side and a wall of the guide portion 21So-1 on the opposite side of the guide wall S1 is touching the front-side wall 2Aa.

The guide wall S1 of the guide portion 21So-1 inclines from the introduction inlet 24 toward an end wall a1 in the coolant introduction flow path 21 so that the cross-sectional area of the coolant introduction flow path 21 will become smaller.

On the other hand, the guide portion 21So-2 has guide walls S2a and S2b on a cooling flow path 23 side and a wall of the guide portion 21So-2 on the opposite side of the guide walls S2a and S2b is touching the guide wall S1 of the guide portion 21So-1. Furthermore, the guide walls S2a and S2b of the guide portion 21So-2 are formed with a change point of slope P as a boundary.

The guide wall S2a inclines from the introduction inlet 24 toward the change point of slope P so that the cross-sectional area of the coolant introduction flow path 21 will become smaller. In addition, the guide wall S2b inclines from the change point of slope P toward the end wall a1 in the coolant introduction flow path 21 so that the cross-sectional area of the coolant introduction flow path 21 will become smaller.

It is assumed that an angle between a straight line in the longitudinal direction of the coolant introduction flow path 21 and the guide wall S2a is an inclination α and that an angle between a straight line in the longitudinal direction of the coolant introduction flow path 21 and the guide wall S2b is an inclination β.

In this case, β<α and the inclination α of the guide wall S2a is greater than the inclination β of the guide wall S2b. There is clearance (minimum value) y0 at the end wall a1 between a fin 2C and the guide wall S2b.

Figure 34:
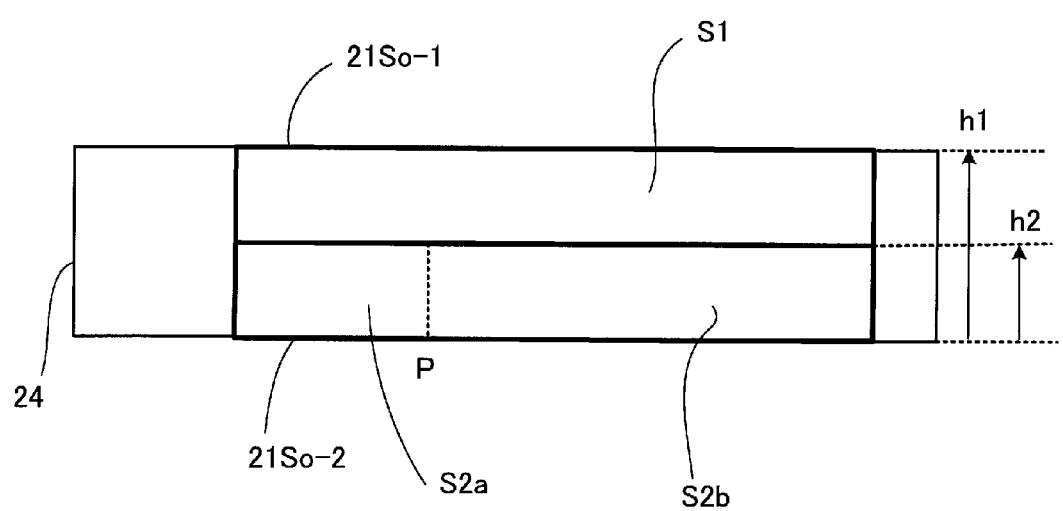
FIG. 34 is a sectional view taken along lines L2-L2 of FIG. 32.

FIG. 34 is a sectional view taken along lines L2-L2 of FIG. 32. FIG. 34 illustrates a section of the water jacket 2A-0 from the direction of arrows A. It is assumed that the height of the guide portion 21So-1 from a bottom of the coolant introduction flow path 21, that is to say, the height of the guide wall S1 is h1.

Furthermore, it is assumed that the height of the guide portion 21So-2, which is on this side of the guide portion 21So-1, from the bottom of the coolant introduction flow path 21, that is to say, the height of the guide walls S2a and S2b is h2. In this case, h2<h1.

For example, the height h2 of the guide walls S2a and S2b is approximately half of the distance between the bottom of the coolant introduction flow path 21 and the ends of the fins 2C. The height h1 of the guide wall S1 is approximately the same as the distance between the bottom of the coolant introduction flow path 21 and a surface of the base member 26 (FIG. 2) in which the fins 2C are implanted.

With the above water jacket 2A-0, the two guide portions 21So-1 and 21So-2 are formed in the coolant introduction flow path 21 and the guide portion 21So-1 is higher than the guide portion 21So-2.

This is applied to a case where three or more guide portions are formed in the coolant introduction flow path 21. A side (corresponding to the guide wall S1) of a guide portion (corresponding to the guide portion 21So-1) which is touching the front-side wall 2Aa of the water jacket 2A-0 is made the highest of all sides of the plurality of guide portions. Furthermore, the height of a side of a guide portion is decreased from the guide portion which is touching the front-side wall 2Aa toward a guide portion nearer the cooling flow path 23.

In the coolant introduction flow path 21 of the water jacket 2A-0, as stated above, the guide wall of the guide portion which is touching the front-side wall 2Aa is made the highest and a guide wall of a guide portion is made lower from the front-side wall 2Aa toward the cooling flow path 23. That is to say, the heights of the plurality of guide portions are set like fliers in the coolant introduction flow path 21.

By decreasing the heights the guide walls of the plurality of guide portions like fliers in this way from the front-side wall 2Aa toward the cooling flow path 23, the distribution of coolant flow speed in the cooling flow path 23 can be adjusted easily and effectively.

The water jacket 2A-0 in which an introduction inlet 24 for introducing a coolant into the inside and a discharge outlet 25 for discharging the coolant to the outside are formed at symmetrical positions and in which the guide portion 21So-1 or 21So-2 is not formed will be discussed.

With this water jacket 2A-0 the coolant flows more easily on a discharge outlet 25 side. Accordingly, coolant flow speed in a cooling flow path 23 is low on an introduction inlet 24 side and is significantly high on the discharge outlet 25 side.

By forming the guide portion 21So-1, on the other hand, coolant flow speed on the introduction inlet 24 side increases. This prevents coolant flow speed in the cooling flow path 23 from significantly increasing on the discharge outlet 25 side. By forming the guide portion 21So-2 further, coolant flow speed on the introduction inlet 24 side increases further.

As a result, if circuit element sections under which pressure loss density is high and which generate much heat are mounted around the introduction inlet 24 and the discharge outlet 25 over the base member 26 and circuit element sections under which pressure loss density is low and which generate little heat are mounted over a central portion of the base member 26, the water jacket 2A-0 in which the guide portions 21So-1 and 21So-2 are formed can effectively cool these circuit element sections.

Figure 35:
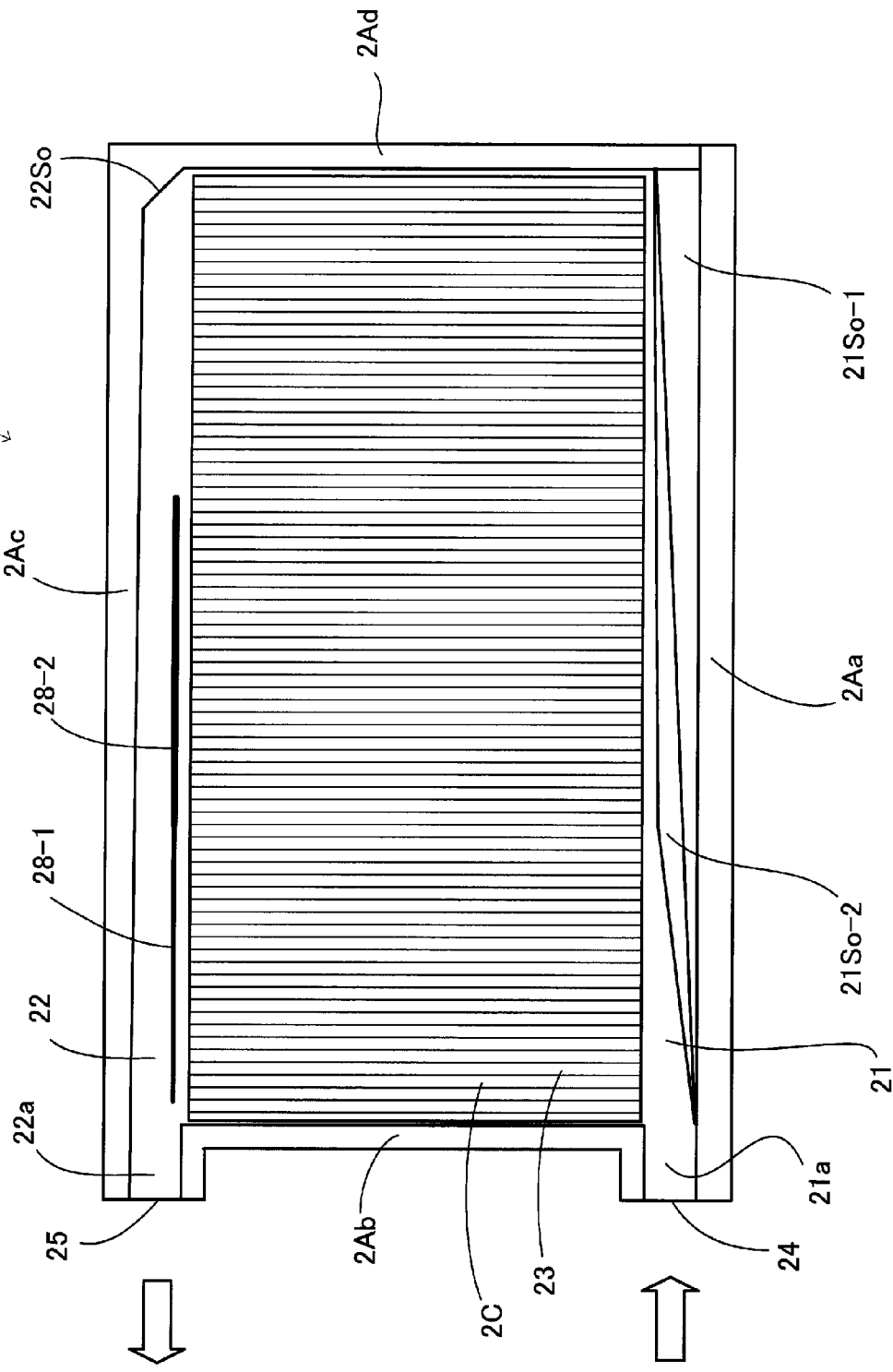
FIG. 35 illustrates a modification of the water jacket.

A modification of the water jacket 2A-0 will now be described. FIG. 35 illustrates a modification of the water jacket. Portions different from those illustrated in FIG. 32 will mainly be described.

With a water jacket 2A-1 according to a first modification an introduction inlet 24 and a discharge outlet 25 are formed on the same side. In the case of FIG. 35, the introduction inlet 24 is formed in a lower portion of a left-side wall 2Ab of the water jacket 2A-1 and the discharge outlet 25 is formed in an upper portion of the left-side wall 2Ab of the water jacket 2A-1. A direction in which a coolant is introduced from the introduction inlet 24 and a direction in which the coolant is discharged from the discharge outlet 25 are opposite to each other.

Furthermore, a flow speed adjusting plate 28-1 is placed in a coolant discharge flow path 22 near the discharge outlet 25 at a boundary between the coolant discharge flow path 22 and a cooling flow path 23 and a flow speed adjusting plate 28-2 is placed in an approximately central portion of the coolant discharge flow path 22 next to the flow speed adjusting plate 28-1.

It is assumed that the height of the flow speed adjusting plate 28-1 from a bottom of the coolant discharge flow path 22 is ha and that the height of the flow speed adjusting plate 28-2 from the bottom of the coolant discharge flow path 22 is hb. Then ha<hb.

For example, the height ha of the flow speed adjusting plate 28-1 is approximately half of the distance between the bottom of the coolant discharge flow path 22 and the ends of fins 2C and the height hb of the flow speed adjusting plate 28-2 is approximately the same as the distance between the bottom of the coolant discharge flow path 22 and a surface of the base member 26 in which the fins 2C are implanted. The other portions, such as guide portions, are basically the same as those illustrated in FIG. 32.

With the water jacket 2A-1, coolant flow speed increases at a position near the left-side wall 2Ab in which the introduction inlet 24 and the discharge outlet 25 are formed. In addition, coolant flow speed increases at a position near a right-side wall 2Ad. On the other hand, an increase in coolant flow speed is checked in an approximately central portion of the cooling flow path 23.

With the water jacket 2A-1 according to the first modification, as has been described, the introduction inlet 24 and the discharge outlet 25 are formed on the same side, guide portions 21So-1 and 21So-2 are formed in a coolant introduction flow path 21, and the flow speed adjusting plates 28-1 and 28-2 of different heights are placed at a boundary between the coolant discharge flow path 22 and the cooling flow path 23.

By doing so, coolant flow speed at a position in the cooling flow path 23 near the wall in which the introduction inlet 24 and the discharge outlet 25 are formed is made high. In addition, coolant flow speed at a position in the cooling flow path 23 near the opposite wall in which the introduction inlet 24 or the discharge outlet 25 is not formed is made high. On the other hand, an increase in coolant flow speed is checked in an approximately central portion of the cooling flow path 23.

The coolant has the above non-uniform flow speed distribution. As a result, if circuit element sections under which pressure loss density is high and which generate much heat are mounted on a side over the base member 26 on which the introduction inlet 24 and the discharge outlet 25 are formed and on the opposite side over the base member 26 on which the introduction inlet 24 or the discharge outlet 25 is not formed and circuit element sections under which pressure loss density is low and which generate little heat are mounted over a central portion of the base member 26, these circuit element sections are effectively cooled.

Figure 36:
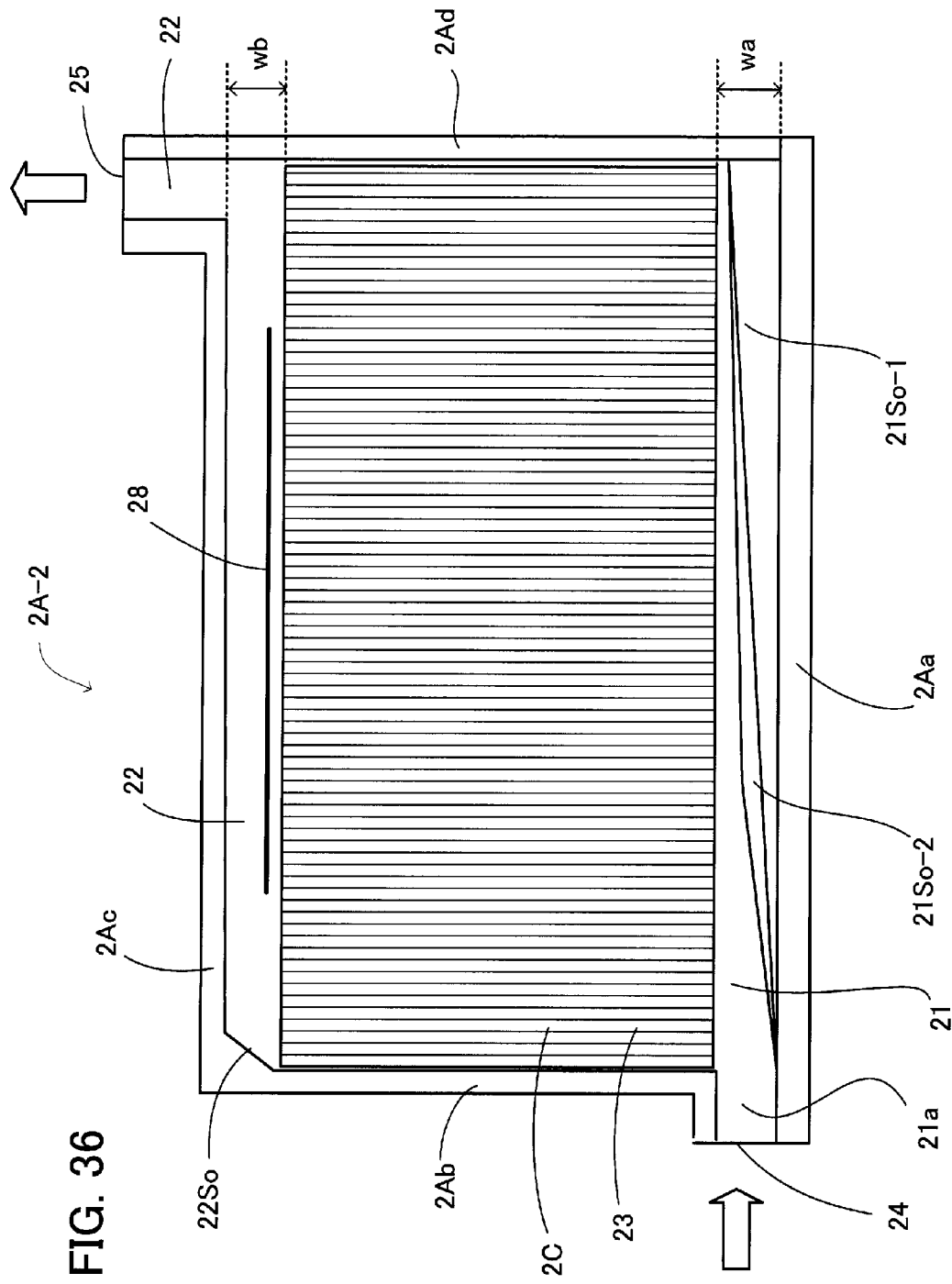
FIG. 36 illustrates a modification of the water jacket.

FIG. 36 illustrates a modification of the water jacket. Portions different from those illustrated in FIG. 32 will mainly be described. With a water jacket 2A-2 according to a second modification, an introduction inlet 24 and a discharge outlet 25 are formed at positions diagonally opposite to each other. In the case of FIG. 36, for example, the introduction inlet 24 is formed in a lower portion of a left-side wall 2Ab of the water jacket 2A-2 and the discharge outlet 25 is formed in an upper portion of a right-side wall 2Ad of the water jacket 2A-2. A direction in which a coolant is introduced from the introduction inlet 24 is perpendicular to a direction in which the coolant is discharged from the discharge outlet 25. The other portions, such as a flow speed adjusting plate and guide portions, are basically the same as those illustrated in FIG. 32.

With the water jacket 2A-2 according to the second modification, as has been described, the introduction inlet 24 and the discharge outlet 25 are formed at symmetrical positions and a direction in which the coolant is introduced from the introduction inlet 24 is perpendicular to a direction in which the coolant is discharged from the discharge outlet 25. In addition, guide portions 21So-1 and 21So-2 are formed in a coolant introduction flow path 21 and a flow speed adjusting plate 28 is placed at a boundary between a coolant discharge flow path 22 and a cooling flow path 23.

By doing so, coolant flow speed at a position in the cooling flow path 23 near the wall in which the introduction inlet 24 is formed is made high, and coolant flow speed at a position in the cooling flow path 23 near the wall in which the discharge outlet 25 is formed is made high. On the other hand, an increase in coolant flow speed is checked in an approximately central portion of the cooling flow path 23.

The coolant has the above non-uniform flow speed distribution. As a result, if circuit element sections under which pressure loss density is high and which generate much heat are mounted around the introduction inlet 24 and the discharge outlet 25 over the base member 26 and circuit element sections under which pressure loss density is low and which generate little heat are mounted over a central portion of the base member 26, these circuit element sections are effectively cooled.

In FIGS. 32 and 36, it is assumed that the width of the coolant introduction flow path 21 is wa and that the width of the coolant discharge flow path 22 is wb. If wa≤wb, then it is desirable to use the water jacket 2A-0 illustrated in FIG. 32. On the other hand, if wa≥wb, then it is desirable to use the water jacket 2A-2 illustrated in FIG. 36.

As has been described in the foregoing, the distribution of coolant pressure in the coolant introduction flow path 21 can be adjusted by forming a plurality of guide portions in the coolant introduction flow path 21. As a result, the distribution of coolant flow speed in the cooling flow path 23 can be adjusted easily and effectively and circuit element sections mounted over the base member 26 can be cooled efficiently.

As stated above, a semiconductor module cooler including a heat sink thermally connected to semiconductor elements, a first flow path which is placed in a water jacket, which extends from a coolant introduction inlet, and in which a guide portion having an incline for leading a coolant toward one side of the heat sink is placed, a second flow path which is placed in the water jacket parallel with and apart from the first flow path, which extends toward a coolant discharge outlet, and which has a sidewall parallel to another side of the heat sink, a flow speed adjusting plate which is placed in the second flow path and which is formed apart from and parallel with the other side of the heat sink, and a third flow path which is formed in a position in the water jacket in which the first flow path connects with the second flow path and in which the heat sink is placed is mainly described in FIGS. 1 through 3, 16, and 18 through 36.

By applying the embodiment described in FIGS. 4 through 15 and 17A and 17B to the above semiconductor module cooler, cooling performance is improved further. That is to say, a notch and a rib are formed in the following way in the semiconductor module cooler illustrated in FIGS. 1 through 3, 16A and 16B, and 18 through 36. Notches n are put at one or more arbitrary positions in an edge in the longitudinal direction of a fin, and ribs r having a convex shape are arranged at one or more arbitrary positions on the bottom of the water jacket having the cooling flow path so that the ribs r will fit into the notches n in the fin.

As a result, a coolant which otherwise escapes to a bottom clearance C is lifted to the fin side and contributes to cooling. In addition, variations in heat radiation by the bottom clearance C which occur due to the flatness of the fin base, the accuracy of fin height, the flatness of the bottom of the water jacket, and the like are reduced and stable cooling is realized.

According to the disclosed semiconductor module cooler and semiconductor module the flow speed adjusting plate is placed apart from and parallel with the other side of the heat sink in the second flow path which extends toward the coolant discharge outlet. By doing so, the flow speed of the coolant which flows into one side of the heat sink from the first flow path is adjusted. In addition, by forming the guide portion having an incline in the first flow path, the distribution of the flow speed of the coolant which flows into the heat sink is adjusted. Accordingly, semiconductor elements arranged over the outer surface of the cooler are effectively cooled and perform stable operation.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor module cooler for supplying a coolant from an outside to a water jacket and cooling a semiconductor element arranged over an outer surface of the cooler, the cooler comprising:
   a heat sink which is thermally connected to the semiconductor element;
   a first flow path which is placed in the water jacket, which extends from a coolant introduction inlet, and in which a guide portion having an incline for leading the coolant toward one side of the heat sink is placed;
   a second flow path which is placed in the water jacket parallel with and apart from the first flow path, which extends toward a coolant discharge outlet, and which has a sidewall parallel to another side of the heat sink;
   a flow speed adjusting plate which is placed in the second flow path and which is formed apart from and parallel with said another side of the heat sink;
   a third flow path formed in a position in the water jacket in which the first flow path connects with the second flow path; and one or more convex ribs which are formed on a bottom of the water jacket having the third flow path and which fit into one or more notches at one or more positions, wherein:

the heat sink is placed in the third flow path; and the one or more notches are put in an edge in a longitudinal direction of the heat sink at one or more positions.

2. The semiconductor module cooler according to claim 1, wherein a position at which each notch is put in the heat sink and a position at which each notch is put in an adjacent heat sink are the same.

3. The semiconductor module cooler according to claim 1, wherein the one or more ribs are formed so that the one or more ribs are approximately perpendicular to the third flow path.

4. The semiconductor module cooler according to claim 1, wherein when the one or more ribs fit into the one or more notches, there is clearance, which is a space, between each rib and each notch.

5. The semiconductor module cooler according to claim 4, wherein the clearance is approximately equal in length to bottom clearance, which is a space, between an end of the heat sink and the bottom of the water jacket.

6. The semiconductor module cooler according to claim 1, wherein a notch and a rib which fits into the notch are arranged per a length of 10 to 30 mm in the longitudinal direction of the heat sink.

7. The semiconductor module cooler according to claim 1, wherein the one or more notches and the one or more ribs which fit into the one or more notches are arranged at regular intervals in the longitudinal direction of the heat sink.

8. The semiconductor module cooler according to claim 1, wherein the one or more notches and the one or more ribs which fit into the one or more notches are arranged at different intervals in the longitudinal direction of the heat sink.

9. The semiconductor module cooler according to claim 8, wherein:

pitches at which notches and ribs which fit into the notches are arranged on an upstream side from which the coolant is introduced are wider than pitches at which notches and ribs which fit into the notches are arranged on a downstream side from which the coolant is discharged; and the pitches at which the notches and the ribs which fit into the notches are arranged on the downstream side are narrower than the pitches at which the notches and the ribs which fit into the notches are arranged on the upstream side.

10. The semiconductor module cooler according to claim 1, wherein a notch and a rib which fits into the notch are arranged so that a turbulent flow or vortex flow of the coolant which occurs on a downstream side of the rib is approximately right under the semiconductor element.

11. The semiconductor module cooler according to claim 1, wherein:

the first flow path is placed in the water jacket;

the first flow path extends from the coolant introduction inlet; and a plurality of guide portions having different inclines for leading the coolant toward one side of the heat sink are placed in the first flow path.

12. The semiconductor module cooler according to claim 11, wherein the plurality of guide portions:

differ in height from a bottom of the first flow path; and have the different inclines.

13. The semiconductor module cooler according to claim 11, wherein:

of the plurality of guide portions, a guide portion which is touching a side of the water jacket is the highest;

the plurality of guide portions become lower toward the third flow path; and the plurality of guide portions are formed like fliers from a bottom of the first flow path.

14. The semiconductor module cooler according to claim 11, wherein the inclines of the plurality of guide portions are formed so that cross-sectional area of the first flow path becomes smaller in a direction in which the first flow path extends from the coolant introduction inlet.

15. The semiconductor module cooler according to claim 11, wherein:

the plurality of guide portions include:

a first guide portion which is touching a side of the water jacket; and a second guide portion which is touching the first guide portion across an area fronting the third flow path; and the first guide portion is higher than the second guide portion.

16. The semiconductor module cooler according to claim 15, wherein:

the incline of the first guide portion has a uniform slope in an area fronting the third flow path so that cross-sectional area of the first flow path becomes smaller in a direction in which the first flow path extends from the coolant introduction inlet; and the incline of the second guide portion has different slopes in an area fronting the third flow path so that the cross-sectional area of the first flow path becomes smaller in the direction in which the first flow path extends from the coolant introduction inlet.

17. The semiconductor module cooler according to claim 1, wherein:

one end of the flow speed adjusting plate is at a trailing end portion of the second flow path; and the flow speed adjusting plate is placed apart from said another side of the heat sink and parallel with the heat sink.

18. The semiconductor module cooler according to claim 1, wherein:

one end of the flow speed adjusting plate and a trailing end portion of the second flow path are determined distance apart on a coolant discharge outlet side of the second flow path; and the flow speed adjusting plate is placed apart from said another of the heat sink and parallel with the heat sink.

19. The semiconductor module cooler according to claim 17, wherein another end of the flow speed adjusting plate and a guide portion formed at a leading end portion of the second flow path are 0.05x or more apart where x is the length of the second flow path.

20. The semiconductor module cooler according to claim 17, wherein the flow speed adjusting plate is greater than or equal to 0.2 h and smaller than or equal to 0.9 h in height from a bottom of the water jacket where h is the height of the second flow path.

21. The semiconductor module cooler according to claim 1, wherein:

the flow speed adjusting plate is equal in length to the second flow path; and the flow speed adjusting plate is greater than or equal to 0.2 h and smaller than or equal to 0.9 h in height from the bottom of the water jacket where h is the height of the second flow path.

22. The semiconductor module cooler according to claim 1, wherein:

the first flow path is placed in the water jacket;

the first flow path extends from the coolant introduction inlet; and a plurality of guide portions having different inclines for leading the coolant toward one side of the heat sink are placed in the first flow path.

23. The semiconductor module cooler according to claim 22, wherein the plurality of guide portions:

differ in height from a bottom of the first flow path; and have the different inclines.

24. The semiconductor module cooler according to claim 23, wherein:

of the plurality of guide portions, a guide portion which is touching a side of the water jacket is the highest;

the plurality of guide portions become lower toward the third flow path; and the plurality of guide portions are formed like fliers from a bottom of the first flow path.

25. The semiconductor module cooler according to claim 22, wherein the inclines of the plurality of guide portions are formed so that cross-sectional area of the first flow path becomes smaller in a direction in which the first flow path extends from the coolant introduction inlet.

26. The semiconductor module cooler according to claim 22, wherein:

the plurality of guide portions include:
- a first guide portion which is touching a side of the water jacket; and
- a second guide portion which is touching the first guide portion across an area fronting the third flow path; and the first guide portion is higher than the second guide portion.

27. The semiconductor module cooler according to claim 26, wherein:

the incline of the first guide portion has a uniform slope in an area fronting the third flow path so that cross-sectional area of the first flow path becomes smaller in a direction in which the first flow path extends from the coolant introduction inlet; and the incline of the second guide portion has different slopes in an area fronting the third flow path so that the cross-sectional area of the first flow path becomes smaller in the direction in which the first flow path extends from the coolant introduction inlet.

28. A semiconductor module for supplying a coolant from an outside to a water jacket included in a cooler and cooling a semiconductor element arranged over an outer surface of the cooler, the semiconductor module comprising:

a heat sink which is thermally connected to the semiconductor element;

a first flow path which is placed in the water jacket, which extends from a coolant introduction inlet, and in which a guide portion having an incline for leading the coolant toward one side of the heat sink is placed;

a second flow path which is placed in the water jacket parallel with and apart from the first flow path, which extends toward a coolant discharge outlet, and which has a sidewall parallel to another side of the heat sink;

a flow speed adjusting plate which is placed in the second flow path and which is formed apart from and parallel with said another side of the heat sink;

a third flow path formed in a position in the water jacket in which the first flow path connects with the second flow path; and one or more convex ribs which are formed on a bottom of the water jacket having the third flow path and which fit into one or more notches at one or more positions, wherein:

the coolant introduction inlet and the coolant discharge outlet are formed in a same wall of the water jacket or at positions on the water jacket diagonally opposite to each other;

the heat sink is placed in the third flow path; and the one or more notches are put in an edge in a longitudinal direction of the heat sink at one or more positions.

29. The semiconductor module according to claim 28, wherein:

the first flow path is placed in the water jacket;

the first flow path extends from the coolant introduction inlet; and a plurality of guide portions having different inclines for leading the coolant toward one side of the heat sink are placed in the first flow path.

* * * * *